(12) United States Patent
Zeng et al.

(10) Patent No.: US 10,361,255 B2
(45) Date of Patent: Jul. 23, 2019

(54) DISPLAY PANEL AND DISPLAY DEVICE

(71) Applicant: SHANGHAI TIANMA MICRO-ELECTRONICS CO., LTD., Shanghai (CN)

(72) Inventors: Yang Zeng, Shanghai (CN); Qing Zhang, Shanghai (CN); Lihua Wang, Shanghai (CN); Liang Xie, Shanghai (CN); Lingxiao Du, Shanghai (CN); Hong Ding, Shanghai (CN); Huiping Chai, Shanghai (CN); Kang Yang, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 63 days.

(21) Appl. No.: 15/717,884

(22) Filed: Sep. 27, 2017

(65) Prior Publication Data

US 2018/0033835 A1 Feb. 1, 2018

(30) Foreign Application Priority Data

May 27, 2017 (CN) .......................... 2017 1 0388186

(51) Int. Cl.
*G06K 9/00* (2006.01)
*H01L 27/32* (2006.01)
*G06F 3/041* (2006.01)

(52) U.S. Cl.
CPC .......... *H01L 27/323* (2013.01); *G06F 3/0412* (2013.01); *G06K 9/001* (2013.01); *G06K 9/00013* (2013.01); *G06K 9/00114* (2013.01)

(58) Field of Classification Search
CPC .............. H01L 27/323; G06K 9/00114; G06K 9/00013; G06K 9/001; G06F 3/0412
(Continued)

(56) References Cited

U.S. PATENT DOCUMENTS

| 2006/0072796 A1* | 4/2006 | Sano ................... G06K 9/00033 |
| | | 382/124 |
| 2016/0132712 A1* | 5/2016 | Yang .................... G06K 9/0002 |
| | | 348/77 |

(Continued)

FOREIGN PATENT DOCUMENTS

| CN | 105550664 A | 5/2016 |
| CN | 106298859 A | 1/2017 |

*Primary Examiner* — Van D Huynh
(74) *Attorney, Agent, or Firm* — Kilpatrick Townsend & Stockton, LLP

(57) ABSTRACT

Disclosed are a display panel and a display device. The display panel includes an organic light-emitting display panel, a fingerprint identification module and an angle defining film; the fingerprint identification module includes at least one fingerprint identification unit, and performs fingerprint identification according to lights reflected to the fingerprint identification unit via a touch body; the angle defining film is located between the organic light-emitting display panel and the fingerprint identification module. A transmissivity of the light by the angle defining film is $A_1$ when the incident angle of said light with respect to the angle defining film is smaller than a transmission angle of the angle defining film, and a transmissivity of the light by the angle defining film is $A_2$ when the incident angle of said light with respect to the angle defining film is larger than the transmission angle of the angle defining film, wherein $A_1 > A_2 > 0$.

20 Claims, 68 Drawing Sheets

(58) Field of Classification Search
USPC .................................................. 382/124–125
See application file for complete search history.

(56) References Cited

U.S. PATENT DOCUMENTS

| | | | |
|---|---|---|---|
| 2017/0147855 A1* | 5/2017 | Wu | G06K 9/0004 |
| 2017/0161540 A1* | 6/2017 | Mienko | G06F 3/0421 |
| 2017/0270339 A1* | 9/2017 | Zou | G06K 9/0004 |
| 2018/0025205 A1* | 1/2018 | Wu | G06K 9/00046 |
| | | | 382/127 |
| 2018/0060642 A1* | 3/2018 | Kim | G02B 5/045 |
| 2019/0026522 A1* | 1/2019 | Wang | G06K 9/0004 |

\* cited by examiner

DISPLAY PANEL AND DISPLAY DEVICE

CROSS-REFERENCE TO RELATED APPLICATIONS

This application claims priority to Chinese Patent Application No. 201710388186.6, filed on May 27, 2017 and entitled "DISPLAY PANEL AND DISPLAY DEVICE", the disclosure of which is incorporated herein by reference in its entirety.

TECHNICAL FIELD

Embodiments of the present disclosure relates to the field of display technologies, and in particular, to a display panel and a display device.

BACKGROUND

Fingerprint is inherent and unique for everyone. With the development of sciences and technologies, there are various display devices with a fingerprint identification function on the market, for example, mobile phones, tablet computers and intelligent wearable devices, etc.

Thus, before operating a display device with a fingerprint identification function, a user may perform authority verification by only touching a fingerprint identification module of the display device using a finger, and hence the authority verification process may be simplified.

In the existing display devices with a fingerprint identification function, the fingerprint identification module generally performs detection by detecting light irradiated to fingerprint identification units via a touch body (for example, a finger), that is, the fingerprint identification module accomplishes an identification action by detecting the ridges and valleys of a fingerprint via the light. However, the light reflected by different locations of the touch body may irradiate on the same fingerprint identification unit, and a serious crosstalk phenomenon may be caused during the fingerprint identification process, thus affecting the accuracy and precision of fingerprint identification by a fingerprint identification sensor.

SUMMARY

The present disclosure provides a display panel and a display device, thereby avoiding the crosstalk phenomenon in a fingerprint identification process and improving the accuracy and precision of the fingerprint identification.

In a first aspect, embodiments of the disclosure provide a display panel, comprising:

a display module, a fingerprint identification module and an angle defining film; wherein:

the display module includes an array substrate and a plurality of organic light-emitting structures on the array substrate;

the fingerprint identification module is located in a display region on one side of the array substrate that is facing away from the organic light-emitting structure and includes a first substrate and at least one fingerprint identification unit on the first substrate, which is configured to perform fingerprint identification according to light reflected to the fingerprint identification unit via a touch body;

the angle defining film is located between the display module and the fingerprint identification module, wherein among lights reflected to the fingerprint identification unit via a touch body, a transmissivity of the light by the angle defining film is $A_1$ when an incident angle of said light with respect to the angle defining film is smaller than a transmission angle of the angle defining film, and among lights reflected to the fingerprint identification unit via a touch body, a transmissivity of the light by the angle defining film is $A_2$ when an incident angle of said light with respect to the angle defining film is larger than the transmission angle of the angle defining film, wherein $A_1 > A_2 > 0$;

a transmissivity of the light by the angle defining film is A when the incident angle of said light is vertical with respect to the angle defining film; and the transmission angle of the angle defining film refers to the incident angle of the light with respect to the angle defining film which has a transmissivity of kA, wherein $0 < k < 1$ In a second aspect, embodiments of the disclosure further provide a display device, which comprises the display panel of the first aspect.

In the display panel and the display device according to the embodiments of the disclosure, an angle defining film is provided between a display module and a fingerprint identification module, wherein among lights reflected to the fingerprint identification unit via a touch body, a transmissivity of the light by the angle defining film is $A_1$ when an incident angle of said light with respect to the angle defining film is smaller than a transmission angle of the angle defining film, and among lights reflected to the fingerprint identification unit via a touch body, a transmissivity of the light by the angle defining film is $A_2$ when an incident angle of said light with respect to the angle defining film is larger than the transmission angle of the angle defining film, wherein $A_1 > A_2 > 0$. Among the lights reflected to the fingerprint identification units via a touch body, the light of which the incident angle with respect to the angle defining film is smaller than the transmission angle of the angle defining film can be used for fingerprint identification detection, and as for the light of which the incident angle with respect to the angle defining film is larger than the transmission angle of the angle defining film, although it can pass through the angle defining film and irradiate onto the fingerprint identification unit, the light can only form a background pattern with a weak brightness in the final fingerprint identification image because $A_1 > A_2$, and thus light can still be clearly detected for fingerprint identification. That is, identification can be performed according to the fingerprint identification image formed by the light of which the incident angle with respect to the angle defining film is smaller than the transmission angle of the angle defining film. Compared to the crosstalk phenomenon caused by the lights reflected to the same fingerprint identification unit via different locations of the touch body in the prior art, the accuracy and precision of the fingerprint identification process can be improved. Also, with the display panel and the display device according to the embodiments of the disclosure, the manufacture difficulty of the angle defining film may be lowered, the transmissivity of light of which the incident angle with respect to the angle defining film is smaller than the transmission angle of the angle defining film 3 can be increased, thereby further improving the precision of fingerprint identification, without affecting the read of a fingerprint.

BRIEF DESCRIPTION OF THE DRAWINGS

Other characteristics, objects and advantages of the disclosure will become more apparent from the detailed description of nonrestrictive embodiments referring to the drawings below.

DETAILED DESCRIPTION

Figure 1A:
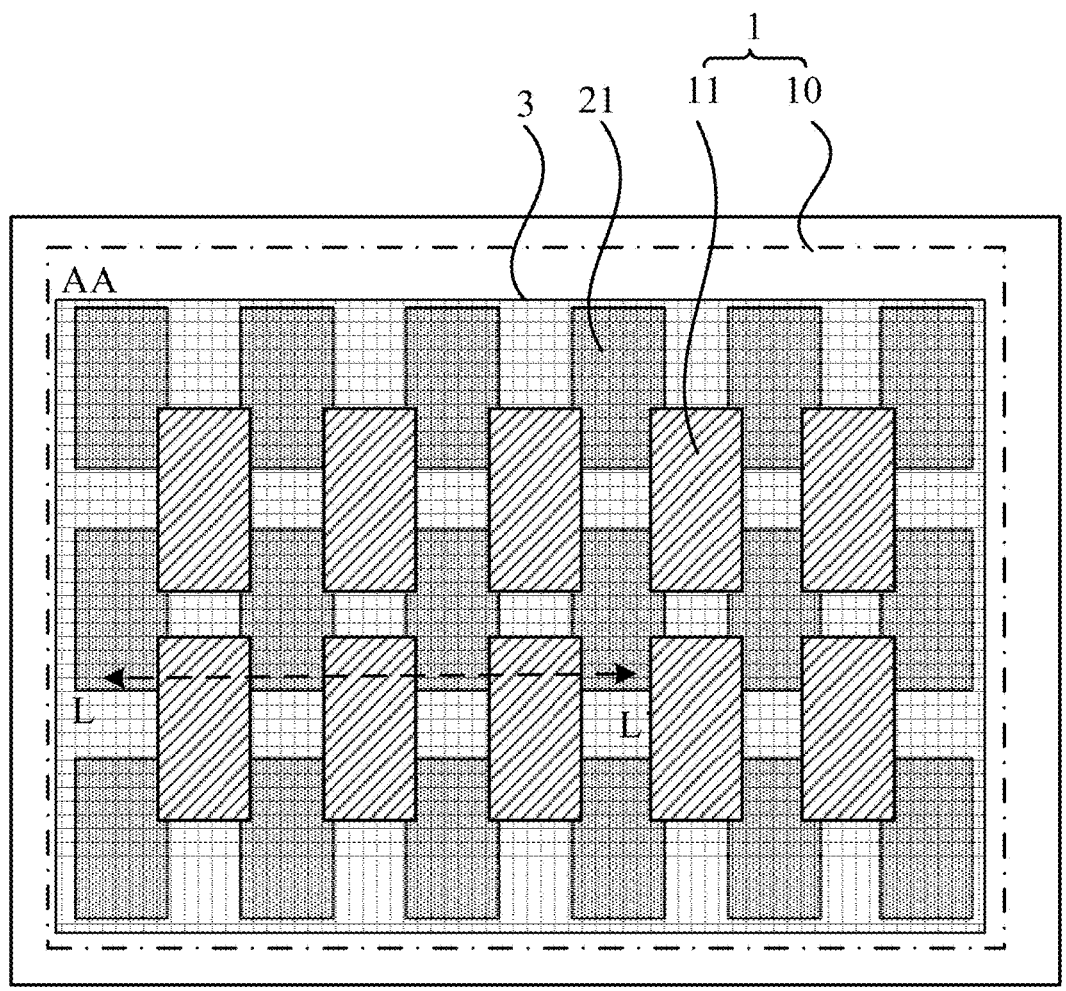
FIG. 1A is a top view showing the structure of a display panel according to an embodiment of the disclosure.

This application will be illustrated in detail below in conjunction with the drawings and embodiments. It may be understood that, the embodiments described here are only provided for explaining, rather than limiting, the application. Additionally, it further needs to be noted that, for convenient description, the drawings only show the parts related to the application, rather than the whole structure. The same or similar labels represent the same or similar structures, elements or flows throughout Description. It should be noted that, the embodiments in the disclosure and the features in the embodiments may be combined with each other without conflict.

One embodiment of the disclosure provides a display panel, which includes a display module, a fingerprint identification module and an angle defining film. The display module includes an array substrate and a plurality of organic light-emitting structures on the array substrate. The fingerprint identification module is located in a display region on one side of an array substrate that is facing away from an organic light-emitting structure and includes a first substrate and at least one fingerprint identification unit on the first substrate, which is configured to perform fingerprint identification according to light reflected to the fingerprint identification unit via a touch body. An angle defining film is located between the display module and the fingerprint identification module. Among the lights reflected to the fingerprint identification units via a touch body, a transmissivity of the light by the angle defining film is $A_1$ when the incident angle of said light with respect to the angle defining film is smaller than a transmission angle of the angle defining film, and among the lights reflected to the fingerprint identification units via a touch body, a transmissivity of the light by the angle defining film is $A_2$ when the incident angle of said light with respect to the angle defining film is larger than the transmission angle of the angle defining film, wherein $A_1>A_2>0$. A transmissivity of the light by the angle defining film is A when the incident angle of said light is vertical with respect to the angle defining film. The transmission angle of the angle defining film refers to the incident angle of the light having a transmissivity of kA with respect to the angle defining film, wherein 0<k<1, and here "k*A" represents k*A, namely, k multiplied by A.

The skin texture, including a fingerprint, is different in terms of patterns, breakpoints and cross-points for each individual, and hence it is unique and keeps constant during the lifetime. Therefore, one can build a correspondence to his/her fingerprint, so that the identity thereof can be verified by comparing his/her fingerprint with prestored fingerprint data, which is referred as fingerprint identification technologies. Benefit from the research on electronic integration manufacturing technologies and fast and reliable algorithms, the optical fingerprint identification technology in the fingerprint identification technologies has come into our daily life and become a widely used and mature technology in the Bioassay. The operational principle of the optical fingerprint identification technology is as follows: light emitted by a light source in a display panel firstly irradiates on a finger, and then a reflected light is formed after being reflected by the finger, and then the formed reflected light is transmitted to a fingerprint sensor, and then the fingerprint sensor captures the light signal irradiated thereon. Because of specific textures on a fingerprint, the reflected light formed on each ridge and valley of the finger has different intensities, so that the light signals finally captured by the sensors will be different, thereby determining the identity of a user.

However, the lights reflected by different locations of the touch body may irradiate onto the same fingerprint identification unit, for example, the lights reflected by a ridge and an valley of the touch body may irradiate onto the same fingerprint identification unit, so that the fingerprint identification unit receiving the light will be unable to detect the exact locations of the ridge and the valley of a fingerprint, thus causing a serious crosstalk phenomenon in a fingerprint identification process, and further affecting the accuracy and precision of fingerprint identification of the fingerprint identification sensor.

In the embodiments of the disclosure, an angle defining film is provided between a display module and a fingerprint identification module, wherein among the lights reflected to the fingerprint identification units via a touch body, a transmissivity of the light by the angle defining film is $A_1$ when the incident angle of said light with respect to the angle defining film is smaller than a transmission angle of the angle defining film, and among the lights reflected to the fingerprint identification units via a touch body, a transmissivity of the light by the angle defining film is $A_2$ when the incident angle of said light with respect to the angle defining film is larger than the transmission angle of the angle defining film, wherein $A_1>A_2>0$. Among the lights reflected to the fingerprint identification units via a touch body, the light of which the incident angle with respect to the angle defining film is smaller than the transmission angle of the angle defining film can be used for fingerprint identification detection, and as for the light of which the incident angle with respect to the angle defining film is larger than the transmission angle of the angle defining film, although it can pass through the angle defining film and irradiate onto the fingerprint identification unit, the light can only form a background pattern with a weak brightness in the final fingerprint identification image because $A_1>A_2$, and thus light can still be clearly detected for fingerprint identification. That is, identification can be performed according to the fingerprint identification image formed by the light of which the incident angle with respect to the angle defining film is smaller than the transmission angle of the angle defining film. Compared to the crosstalk phenomenon caused by the lights reflected to the same fingerprint identification unit via different locations of the touch body in the prior art, the accuracy and precision of the fingerprint identification process can be improved. Also, by the display panel and the display device according to the embodiments of the disclosure, the manufacture difficulty of the angle defining film may be lowered, the transmissivity of light of which the incident angle with respect to the angle defining film is smaller than the transmission angle of the angle defining film 3 can be increased, thereby further improving the precision of fingerprint identification, without affecting the read of a fingerprint.

The above shows the core concept of this disclosure, and the technical solutions in the embodiments of the disclosure will be described clearly and fully below in conjunction with the drawings in the embodiments of the disclosure. All other embodiments obtained by one skilled in the art based on the embodiments in the disclosure without inventive efforts will pertain to the protection scope of the disclosure.

Figure 1B:
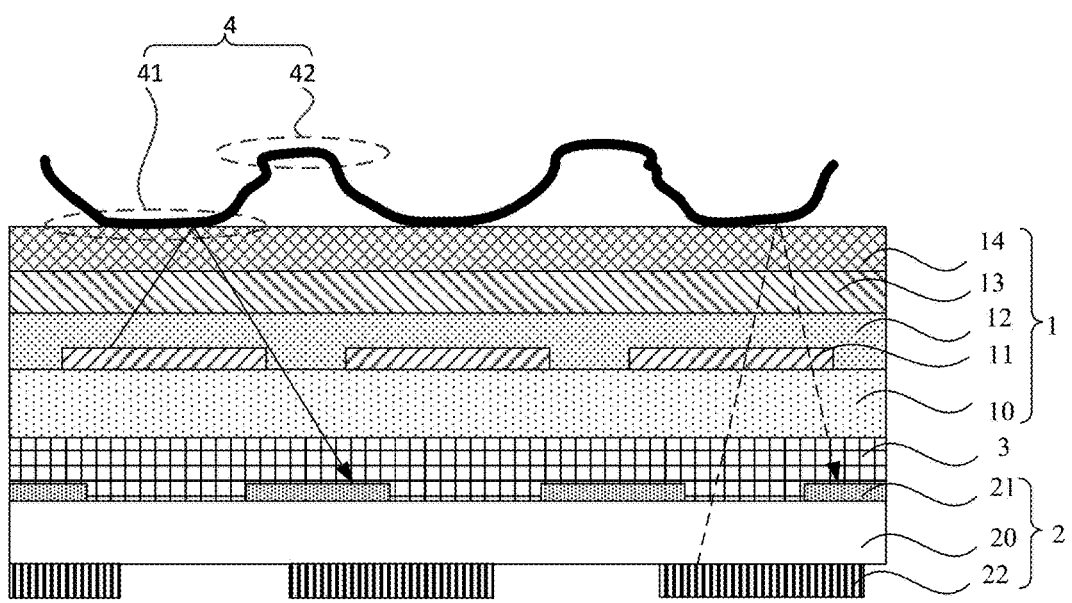
FIG. 1B is a schematic sectional view taken along direction LL' in FIG. 1A.

FIG. 1A is a top view showing the structure of a display panel according to an embodiment of the disclosure, and FIG. 1B is a schematic sectional view taken along direction LL' in FIG. 1A. In conjunction with FIG. 1A and FIG. 1B, the display panel includes a display module 1, a fingerprint identification module 2 and an angle defining film 3. The display module 1 includes an array substrate 10 and a plurality of organic light-emitting structures 11 on the array substrate 10, the fingerprint identification module 2 is located in a display region AA on one side of the array substrate 10 that is facing away from the organic light-emitting structure 11, and includes a first substrate 20 and at least one fingerprint identification unit 21 on the first substrate 20, and the angle defining film 3 is located between the display module 1 and the fingerprint identification module 2.

The fingerprint identification module 2 can perform fingerprint identification according to the light reflected to the fingerprint identification unit 21 via a touch body 4. Among lights reflected to the fingerprint identification unit 21 via a touch body 4, a transmissivity of the light by the angle defining film 3 is $A_1$ when the incident angle of said light with respect to the angle defining film 3 is smaller than a transmission angle of the angle defining film 3, and among lights reflected to the fingerprint identification unit 21 via a touch body 4, a transmissivity of the light by the angle defining film 3 is $A_2$ when the incident angle of said light with respect to the angle defining film 3 is larger than the transmission angle of the angle defining film 3, wherein $A_1>A_2>0$. A transmissivity of the light by the angle defining film 3 is A when the incident angle of said light is vertical with respect to the angle defining film 3. The transmission angle of the angle defining film 3 refers to the incident angle of the light having a transmissivity of kA with respect to the angle defining film 3, wherein $0<k<1$. In one embodiment, k may be set equal to 0.1, that is, the transmission angle of the angle defining film 3 is the incident angle of the light having a transmissivity of 0.1A with respect to the angle defining film 3.

As shown in FIG. 1B, the light emitted by a light source irradiates onto the touch body 4, and corresponding to different light sources, it may be the light represented by a solid line shown in FIG. 1B, or it may be the light represented by a dashed line shown in FIG. 1B. The fingerprint identification unit 21 may perform fingerprint identification according to the light emitted by any light source. Generally, the touch body 4 may be a finger, and a fingerprint is consisted of a series of ridges 41 and valleys 42 on the skin surface of the fingertip. Because the distances from the ridge 41 and the valley 42 to the fingerprint identification unit are different, the intensities of the lights received by the fingerprint identification unit 21, which are reflected by the ridge 41 and the valley 4, are different, so that the magnitudes of the current signals converted by the reflected light formed at the ridge 41 and the reflected light formed at the valley 42 are different, thereby performing the fingerprint identification according to the magnitudes of the current signals. It should be noted that, the touch body 4 may be a palm, etc., and the detection and identification function may also be realized using a palm print.

Specifically, among the light reflected to the fingerprint identification unit 21 via the touch body 4, the light of which an incident angle with respect to the angle defining film 3 is smaller than the transmission angle of the angle defining film 3 may be regarded as the light for fingerprint identification detection. Although the light of which an incident angle with respect to the angle defining film 3 is larger than the transmission angle of the angle defining film 3 can pass through the angle defining film 3 to irradiate onto the fingerprint identification unit 21, such light can only form a background pattern with a weak brightness in the final fingerprint identification image because of $A_1>A_2$, and thus the light can still be clearly detected for fingerprint identification, that is, identification can be performed according to a fingerprint identification image formed by the light of which an incident angle with respect to the angle defining film 3 is smaller than the transmission angle of the angle defining film 3. Compared to the crosstalk phenomenon caused by the light reflected to the same fingerprint identification unit 21 via different locations of the touch body 4 in the prior art, the accuracy and precision of the fingerprint identification process can be improved. Furthermore, by the display panel and the display device according to the embodiments of the disclosure, the manufacture difficulty of the angle defining film 3 may be lowered, the transmissivity of light of which an incident angle with respect to the angle defining film 3 is smaller than the transmission angle of the angle defining film 3 can be increased, and the precision of fingerprint identification can be further improved, without affecting the read of a fingerprint.

In one embodiment, it may be set that $A_1>1.5A_2$. Among the light reflected to the fingerprint identification unit 21 via the touch body 4, the transmissivity of the light by the angle defining film 3 is $A_1$ when an incident angle of said light with respect to the angle defining film 3 is smaller than the transmission angle of the angle defining film 3, and such the light is for the fingerprint identification detection. Among the light reflected to the fingerprint identification unit 21 via the touch body 4, the transmissivity of the light by the angle defining film 3 is $A_2$ when an incident angle of said light with respect to the angle defining film 3 is larger than the transmission angle of the angle defining film 3, and such the light forms a background pattern with a weak brightness in the final fingerprint identification image. By setting $A_1>1.5A_2$, the contrast of the finally formed fingerprint image to the background pattern can be further increased, thereby improving the accuracy and precision of the fingerprint identification process.

In one embodiment, the organic light-emitting structure 11 may provide a light source for the fingerprint identification module 2, and the fingerprint identification unit 21 may perform fingerprint identification according to the light reflected to the fingerprint identification unit 21 via the touch body 4 which is initially emitted from the organic light-emitting structure 11, for example, the light represented by a solid line shown in FIG. 1B. Among the lights emitted by the organic light-emitting structure 11 and reflected to the fingerprint identification unit 21 via the touch body 4, the transmissivity of the light by the angle defining film 3 is $A_1$ when an incident angle of said light with respect to the angle defining film 3 is smaller than the transmission angle of the angle defining film 3, and the transmissivity of the light by the angle defining film 3 is $A_2$ when an incident angle with of said light with respect to the angle defining film 3 is larger than the transmission angle of the angle defining film 3, wherein $A_1 > A_2$. The final fingerprint identification image contains a background pattern with a weak brightness, and under the condition that the fingerprint identification process is not affected, the crosstalk phenomenon caused by the reflecting, the lights emitted by the organic light-emitting structure 11, to the same fingerprint identification unit 21 from different locations of the touch body 4 may be avoided effectively, thereby improving the accuracy and precision of fingerprint identification of the fingerprint identification module.

In one embodiment, the transmissivity of the light reflected perpendicular to the touch body 4 and irradiating onto the fingerprint identification unit 21 via the display module 1 may be larger than 1%. Specifically, when the fingerprint identification unit 21 performs fingerprint identification according to the light emitted by the organic light-emitting structure 11, if the transmissivity of the light reflected perpendicular to the touch body 4 and irradiating onto the fingerprint identification unit 21 via the display module 1 is too small, the intensity of the light when reaching the fingerprint identification unit 21 will be small, and the precision of fingerprint identification will be affected. Exemplarily, the transmissivity of the light reflected perpendicular to the touch body 4 and irradiating onto the fingerprint identification unit 21 via the display module 1 may be adjusted by adjusting the thickness of each film layer through which the light passes.

In one embodiment, the display panel may include an emergent light side and a non-emergent light side, the emergent light side is one side of the organic light-emitting structure 11 that is facing away from the array substrate 10, and the non-emergent light side is one side of the array substrate 10 that is facing away from the organic light-emitting structure 11. When the fingerprint identification unit 21 performs fingerprint identification according to the light emitted by the organic light-emitting structure 11, the brightness ratio of the emergent light side to the non-emergent light side in the display panel may be larger than 10:1. The light on the non-emergent light side of the display panel will affect the fingerprint identification process performed by the fingerprint identification unit 21 according to the light reflected to the fingerprint identification unit 21 via the touch body 4, which is initially emitted by the organic light-emitting structure 11, so that crosstalk exists in the light detected by the fingerprint identification unit, and if the brightness of the non-emergent light side of the display panel is too large, the precision of fingerprint identification will be seriously affected.

It should be noted that, in FIGS. 1A and 1B, the relative locations of the organic light-emitting structure 11 and the fingerprint identification unit 21 are only set exemplarily. In the embodiments of the disclosure, the relative locations of the organic light-emitting structure 11 and the fingerprint identification unit 21 are not limited, so long as it can guarantee that the light emitted by the organic light-emitting structure 11 can be reflected to the fingerprint identification unit 21 via the touch body 4.

In one embodiment, the fingerprint identification module 2 may further include a fingerprint identification light source 22. The fingerprint identification light source 22 is located on one side of the first substrate 20 that is facing away from the fingerprint identification unit 21, and the fingerprint identification unit 21 can perform fingerprint identification according to the light reflected to the fingerprint identification unit 21 via the touch body 4, which is initially emitted by the fingerprint identification light source 22, for example, the light represented by a dashed line shown in FIG. 1B. In one embodiment, the light emitted by the fingerprint identification light source 22 irradiates onto the touch body 4 via a gap between the adjacent fingerprint identification units 21.

In one embodiment, the light emitted by the fingerprint identification light source 22 irradiates onto the touch body 4 via a gap between the adjacent fingerprint identification units 21, and the transmissivity of the light reflected perpendicular to the touch body 4 and irradiating onto the fingerprint identification unit 21 via the display module 1 may be larger than 10%. Specifically, if the transmissivity of the light reflected perpendicular to the touch body 4 and irradiating onto the fingerprint identification unit 21 via the display module 1 is too small, the intensity of the light when reaching the fingerprint identification unit 21 will be small, and the precision of fingerprint identification will be affected. Additionally, compared the case that the fingerprint identification unit 21 performs fingerprint identification according to the light emitted by the organic light-emitting structure 11, in this embodiment the fingerprint identification unit 21 perform fingerprint identification according to the light emitted by the fingerprint identification light source 22, and during the process that the light emitted by the fingerprint identification light source 22 reaches the fingerprint identification unit 21, the light will passed through a larger number of film layers, i.e., a larger total thickness of film layers, so that the transmissivity of the light reflected perpendicular to the touch body 4 and irradiating onto the fingerprint identification unit 21 via the display module 1 will be larger.

It should be noted that, in the embodiments of the disclosure, the location and type of the fingerprint identification light source 22 are not limited, and it may be a spot light source or an area light source, so long as it can guarantee that the light emitted by the fingerprint identification light source 22 can be reflected onto the fingerprint identification unit 21 via the touch body 4. Furthermore, the light represented by the solid line and the dashed line shown in FIG. 1B merely shows a certain light emitted by the organic light-emitting structure 11 and the fingerprint identification light source 22 exemplarily, and the light emitted by the organic light-emitting unit 11 and the fingerprint identification light source may both be divergent. In addition, the light source is not limited in the embodiments of the disclosure, and it may be an organic light-emitting structure 11 or an out-cell fingerprint identification light source 22, so long as it can guarantee that the light emitted by the light source can be reflected to the fingerprint identification unit 21 via the touch body 4 for fingerprint identification.

Figure 2A:
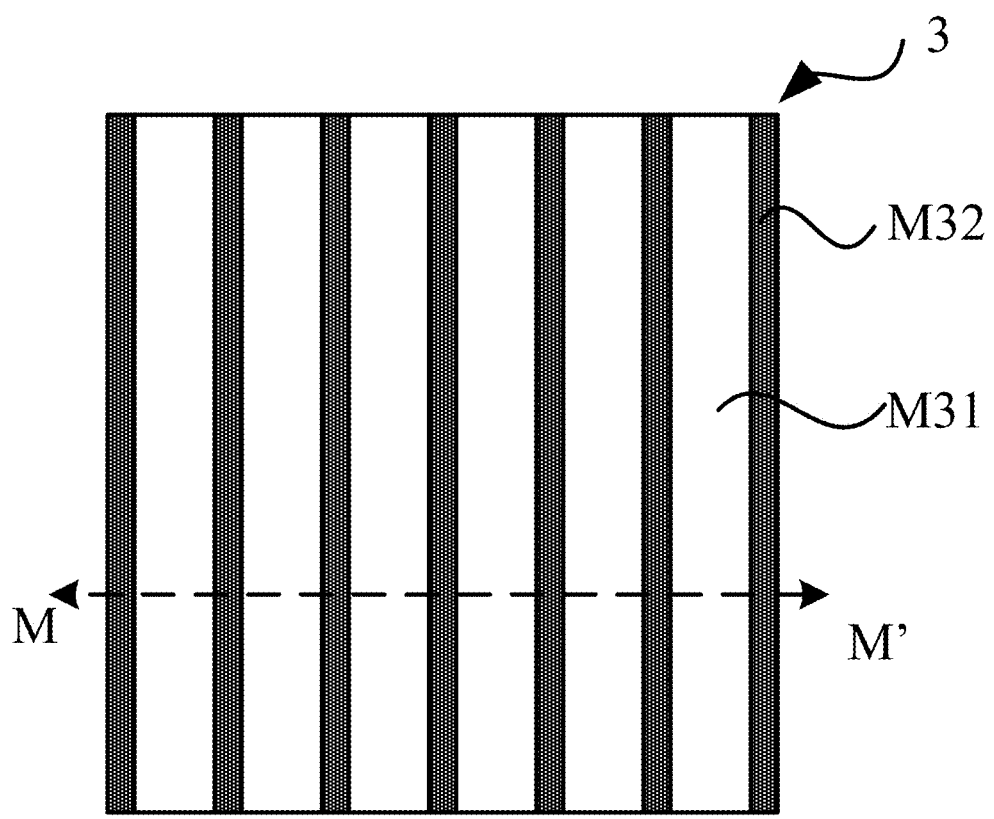
FIG. 2A is a top view showing the structure of an angle defining film according to an embodiment of the disclosure.
Figure 2B:
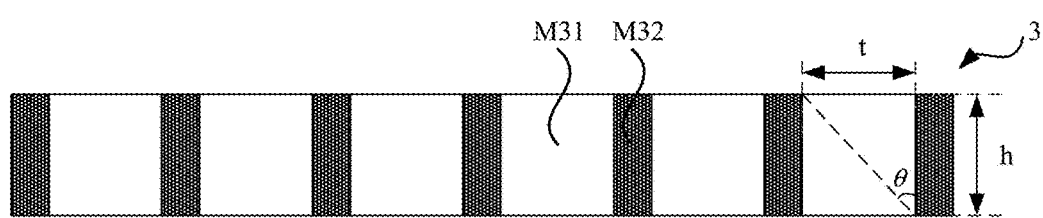
FIG. 2B is a schematic sectional view taken along direction MM' in FIG. 2A.

FIG. 2A is a top view showing the structure of an angle defining film according to an embodiment of the disclosure, and FIG. 2B is a schematic sectional view taken along MM' in FIG. 2A. In conjunction with FIG. 2A and FIG. 2B, the angle defining film 3 includes a plurality of partially light transmitting regions M32 and light transmitting regions M31 that are parallel with the plane of the first substrate 20 and arranged alternately along the same direction, the partially light transmitting region M32 is provided with a light-absorbing material, and the light transmissivity of the light transmitting region M31 is larger than that of the partially light transmitting region M32.

Specifically, the partially light transmitting region M32 is provided with a light-absorbing material, so that among the light reflected to the fingerprint identification unit 21 via the touch body 4, the transmissivity of the light by the angle defining film 3 is the largest when an incident angle of the light with respect to the angle defining film 3 is smaller than the transmission angle of the angle defining film 3, and such the light is configured to perform fingerprint detection, that is, it is the light for fingerprint identification detection. Additionally, the partially light transmitting region M32 is provided with a light-absorbing material, so that by adjusting the thickness of the partially light transmitting region M32, the light irradiating onto the partially light transmitting region M32 can partially pass through the angle defining film 3 and irradiate onto the fingerprint identification unit, that is, the light transmissivity of the light transmitting region M31 is larger than that of the partially light transmitting region M32. Although the light of which an incident angle with respect to the angle defining film 3 is larger than the transmission angle of the angle defining film 3 can partially pass through the angle defining film 3 and irradiate onto the fingerprint identification unit, the light irradiating onto the fingerprint identification unit 21 via the partially light transmitting region M32 only forms a background pattern with a weak brightness in the formed fingerprint identification image, and hence the read of the fingerprint image will not be affected, and the crosstalk phenomenon caused by the light reflected to the same fingerprint identification unit 21 via different locations of the touch body 4 in the prior art can be solved. Moreover, the thickness of the partially light transmitting region M32 along direction MM' may be provided smaller compared to the light transmitting region M31, that is, the thickness of the light transmitting region M31 along direction MM' may be increased relatively, so that the transmissivity of light of which an incident angle with respect to the angle defining film 3 is smaller than the transmission angle of the angle defining film 3 may be improved, thereby improving the precision of fingerprint identification, and lowering the manufacture difficulty of the angle defining film 3. As shown in FIG. 2B, because the light transmissivity of the light transmitting region M31 is larger than that of the partially light transmitting region M32, the transmission angle of the angle defining film 3 meets a formula below:

$$\theta = \arctan\frac{t}{h}$$

wherein, θ is the transmission angle of the angle defining film 3, t is the width of the light transmitting region M31 along the arrangement direction thereof, and h is the thickness of the angle defining film 3. It may be seen from FIG. 2B that, θ, t and h have a calculation relation $$\tan\theta = \frac{t}{h},$$

and thus the transmission angle of the angle defining film 3 meets the above formula. Because the light irradiating onto the partially light transmitting region M32 can be partially absorbed by the light-absorbing material in this region, that is, the light of which an incident angle with respect to the angle defining film 3 is larger than the transmission angle θ will be partially absorbed, and such the light will form a background pattern in the fingerprint identification image, which is uniform and has a weak brightness so that the fingerprint identification process will not be affected. In one embodiment, when the angle defining film 3 includes a plurality of partially light transmitting regions M32 and light transmitting regions M31 that are parallel with the plane of the first substrate 20 and arranged alternately along the same direction, and the partially light transmitting region M32 is provided with a light-absorbing material, when the light transmissivity of the light transmitting region M31 is larger than that of the partially light transmitting region M32, the diffusion distance of the angle defining film 3 meets a formula below:

$$\Delta X = \frac{t \cdot (H + h)}{h}$$

wherein, ΔX is the diffusion distance of the angle defining film 3, and H is the thickness of the display module 1. The diffusion distance of the angle defining film 3 refers to the distance between reflection points of the actual detection light and the interfering detection light on touch body 4 which both correspond to the same fingerprint identification unit 21, the reflected light of which an incident angle with respect to the fingerprint identification unit 21 is minimum is referred as the actual detection light, and the reflected light of which an incident angle with respect to the fingerprint identification unit 21 is larger than the incident angle of the actual detection light with respect to the fingerprint identification unit 21 is referred as the interfering detection light.

Figure 2C:
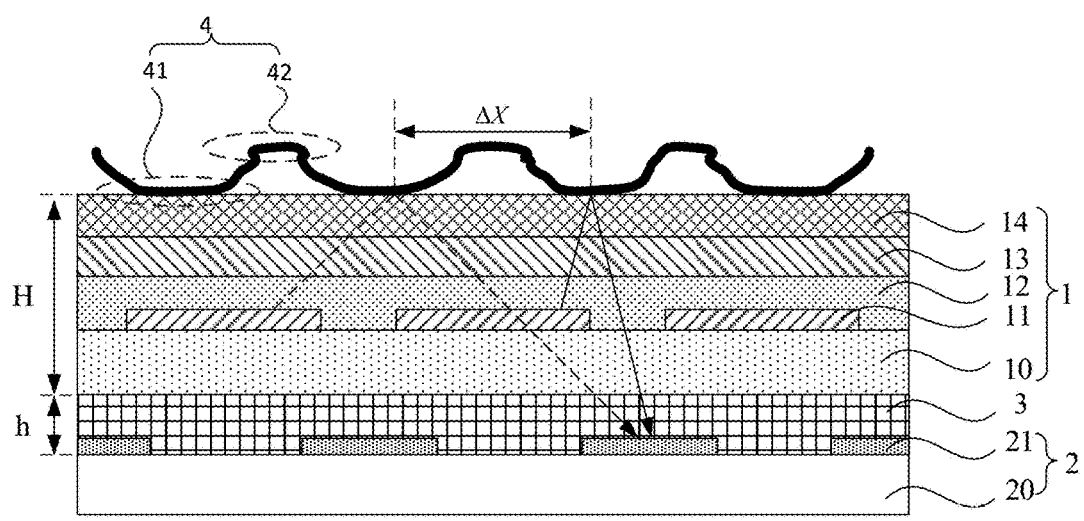
FIG. 2C is a schematic sectional view of a display panel according to an embodiment of the disclosure.

Exemplarily, as shown in FIG. 2C, in an example where the fingerprint identification unit 21 performs fingerprint identification according to the light reflected to the fingerprint identification unit 21 via the touch body 4, which is initially emitted by the organic light-emitting structure 11, the light represented by the solid line in FIG. 2C may be the reflected light of which an incident angle with respect to the fingerprint identification unit 21 is minimum, i.e., the actual detection light; the light represented by the dashed line in FIG. 2C may be the reflected light of which an incident angle with respect to the fingerprint identification unit 21 is larger than the incident angle of the actual detection light with respect to the fingerprint identification unit 21, i.e., the interfering detection light. If no angle defining film 3 is provided, the actual detection light and the interfering detection light can irradiate onto the same fingerprint identification unit 21 after being reflected by different locations of the touch body 4, for example, adjacent two ridges 41, that is, crosstalk is present in the fingerprint identification process.

Figure 2D:
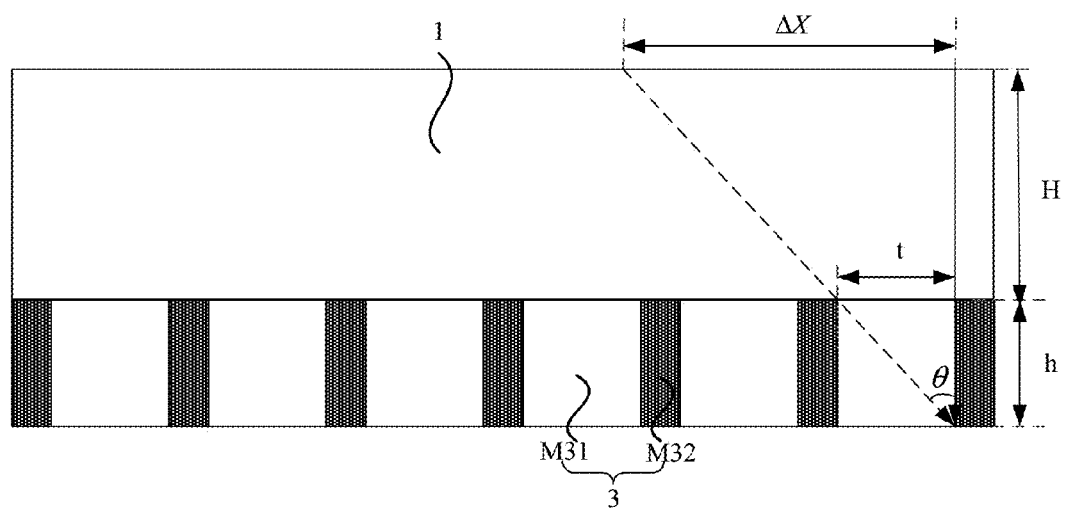
FIG. 2D is a diagram showing a geometric relation of the diffusion distance of the angle defining film shown in FIG. 2A.

At this time, the diffusion distance of the angle defining film 3 is the distance between reflection points of the actual detection light and the interfering detection light on the touch body 4 in the drawing. Exemplarily, as shown in FIG. 2D, the incident angle of the actual detection light with respect to the fingerprint identification unit 21 may be approximatively 0°. Among the interfering light that can pass through the angle defining film 3, the minimum incident angle of the light with respect to the fingerprint identification unit 21 may be the transmission angle of the angle defining film 3, and hence it exists the following calculation relation:

$$\tan\theta = \frac{t}{h} = \frac{\Delta X}{H + h},$$

and the diffusion distance of the angle defining film 3 meets the above formula. The larger the diffusion distance of the angle defining film 3 is, the lower the accuracy and precision of the fingerprint identification performed by the display panel will be.

Figure 2E:
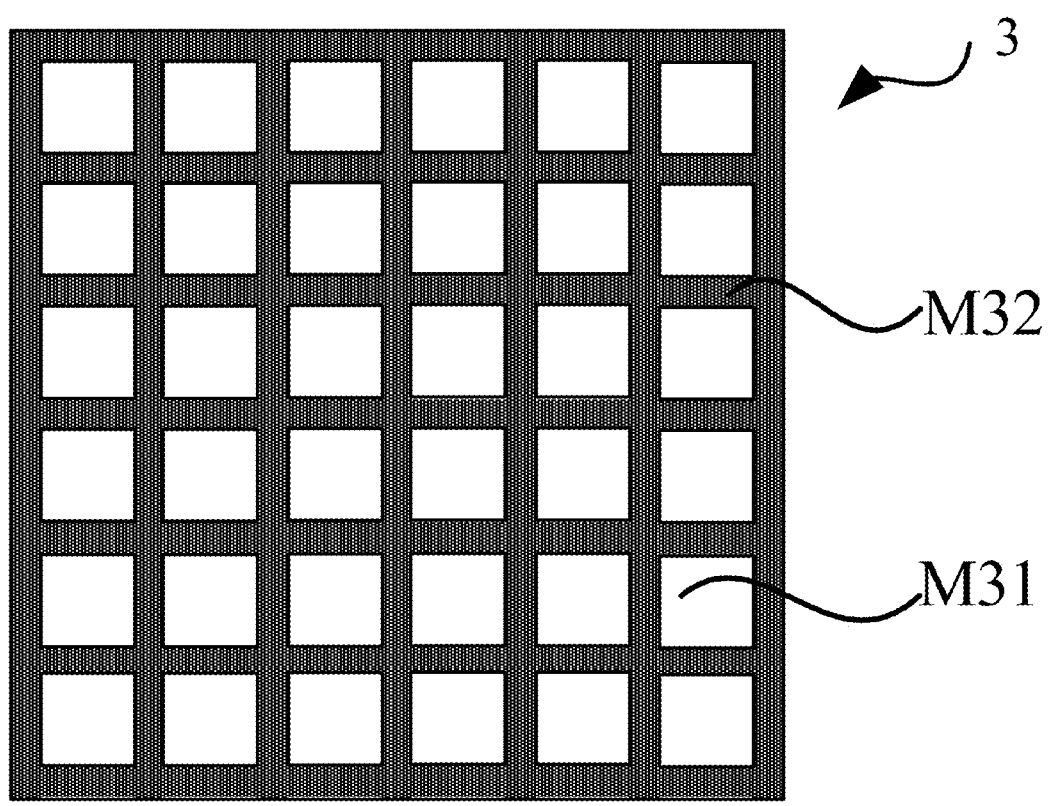
FIG. 2E is a top view showing the structure of another angle defining film according to an embodiment of the disclosure.

In FIG. 2A, exemplarily, the angle defining film 3 is provided as a one-dimensional structure, the light transmitting region M31 and the partially light transmitting region M32 are arranged alternately along the horizontal direction in FIG. 2A. Or, the angle defining film 3 may be provided as a two-dimensional structure, as shown in FIG. 2E, then the light transmitting region M31 and the partially light transmitting region M32 may be arranged alternately along the diagonal direction of the angle defining film 3 shown in FIG. 2E. The incident light on the fingerprint identification unit 21 from each direction may be filtered, and hence the accuracy and precision of the fingerprint identification process may be improved.

It should be noted that, in the above solution, the partially light transmitting region M32 is exemplarily adjusted by adjusting the thickness of the partially light transmitting region M32 so as to enable the light to partially pass through, or the partially light transmitting region M32 can be implemented by setting the material of the partially light transmitting region M32 to enable the light to partially pass through, which is not limited in the embodiments of the disclosure.

Figure 3A:
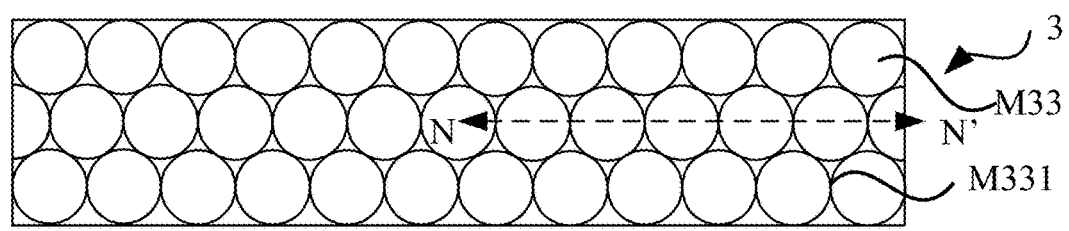
FIG. 3A is a top view showing the structure of another angle defining film according to an embodiment of the disclosure.
Figure 3B:
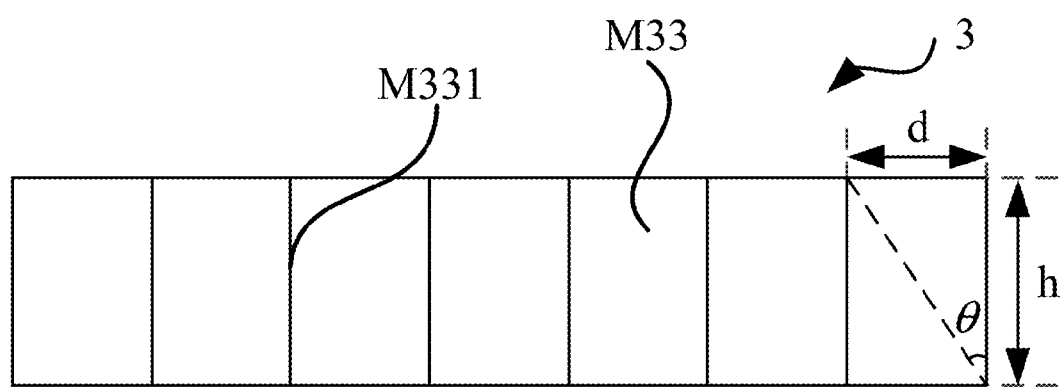
FIG. 3B is a schematic sectional view taken along direction NN' in FIG. 3A.

FIG. 3A is a top view showing the structure of another angle defining film according to an embodiment of the disclosure, and FIG. 3B is a schematic sectional view taken along NN' in FIG. 3A. In conjunction with FIG. 3A and FIG. 3B, the angle defining film 3 includes a porous structure M33, a sidewall M331 of the porous structure M33 can partially absorb the incident light on the sidewall M331. Exemplarily, the porous structure M33 may be a glass tubule structure, and a black light-absorbing material may be coated on the sidewall M331 of the glass tubule, so that the sidewall M331 can partially absorb the incident light on the sidewall M331. In one embodiment, a light-absorbing material may be provided between adjacent porous structures M33, or alternatively, no light-absorbing material may be provided.

Specifically, because the sidewall M331 of the porous structure M33 can partially absorb the incident light on the sidewall M331, the transmissivity of light of which an incident angle with respect to the angle defining film 3 is smaller than the transmission angle of the angle defining film 3 is the largest, and such the light is configured to perform fingerprint detection, that is, the light is the light for fingerprint identification detection. Although the light of which an incident angle with respect to the angle defining film 3 is larger than the transmission angle of the angle defining film 3 can partially pass through the angle defining film 3 and irradiate onto the fingerprint identification unit 21, the light passing through the sidewall M331 and irradiating onto the fingerprint identification unit 21 only forms a background pattern with a weak brightness in the formed fingerprint identification image, so that the read of the fingerprint image will not be affected. Because the sidewall M331 of the porous structure M33 can partially absorb the incident light on the sidewall M331, the transmission angle of the angle defining film 3 meets a formula below:

$$\theta = \arctan\frac{d}{h}$$

wherein, θ is the transmission angle of the angle defining film 3, d is the diameter of the porous structure M33, and h is the thickness of the angle defining film 3. It may be seen from FIG. 3B that, θ, d and h have a calculation relation $$\tan\theta = \frac{d}{h},$$

and hence the transmission angle of the angle defining film 3 meets the above formula.

In one embodiment, when the angle defining film 3 includes the porous structure M33 and the sidewall M331 of the porous structure M33 can partially absorb the incident light on the sidewall M331, the diffusion distance of the angle defining film 3 meets a formula below:

$$\Delta X = \frac{d \cdot (H + h)}{h}$$

wherein, ΔX is the diffusion distance of the angle defining film 3, and H is the thickness of the display module 1. The derivation process of this formula is similar to that of the diffusion distance of the angle defining film 3 of the structure shown in FIG. 2A, which will not be described again here. Similarly, the larger the diffusion distance of the angle defining film 3 is, the lower the accuracy and precision of the fingerprint identification performed by the display panel will be.

Figure 3C:
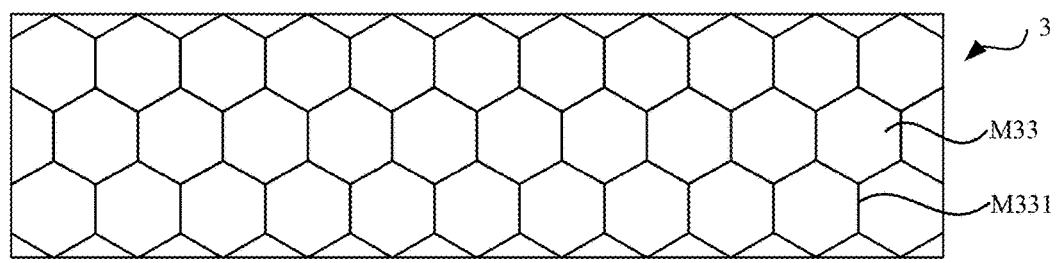
FIG. 3C is a top view showing the structure of another angle defining film according to an embodiment of the disclosure.

It should be noted that, starting from a top view angle of the angle defining film 3, the porous structure M33 may correspond to the circular structure shown in FIG. 3A, and it may also corresponds to the hexagonal structure shown in FIG. 3C. In the embodiments of the disclosure, the shape of the porous structure M33 is not limited.

Figure 4A:
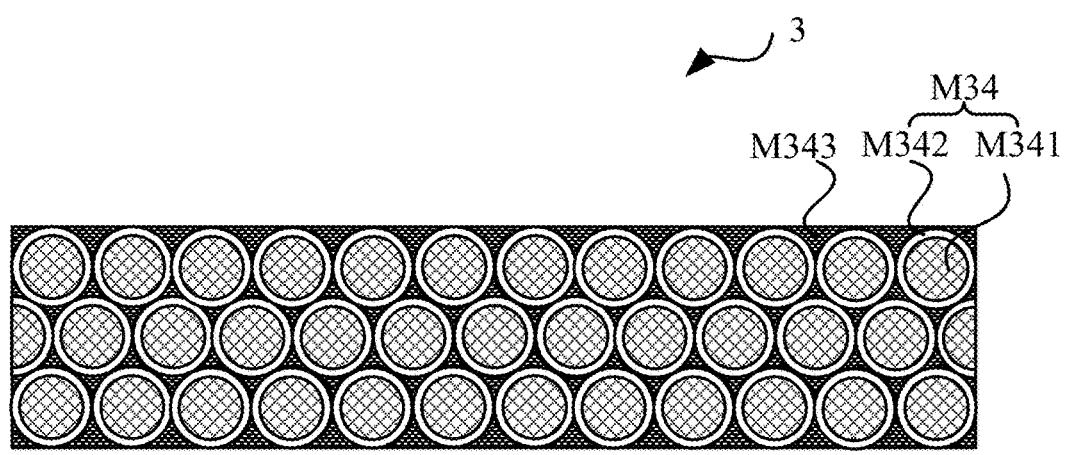
FIG. 4A is a top view showing the structure of another angle defining film according to an embodiment of the disclosure.
Figure 4B:
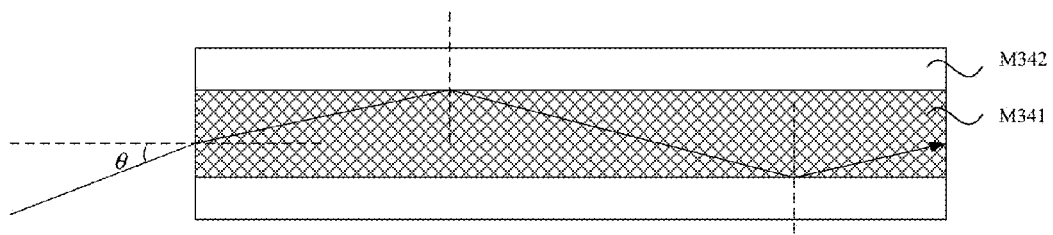
FIG. 4B is a schematic sectional view taken along the extension direction of the optical fiber structure in FIG. 4A.

FIG. 4A is a top view showing the structure of another angle defining film according to an embodiment of the disclosure. As shown in FIG. 4A, the angle defining film 3 includes a plurality of optical fiber structures M34 arranged along the same direction. FIG. 4B is a schematic sectional view taken along the extension direction of the optical fiber structure M34 in FIG. 4A. In conjunction with FIG. 4A and FIG. 4B, the optical fiber structure M34 includes an inner core M341 and a shell M342, and a light-absorbing material M343 is provided between every adjacent two optical fiber structures M34, so that the part of the lights penetrating through the optical fiber structure M34 to the place between two optical fiber structures M34 can be absorbed by the light-absorbing material M343 between the optical fiber structures M34, and a light transmissivity of the inner core M341 is larger than a light transmissivity of the light-absorbing material M343.

Specifically, the refractive indexes of the inner core M341 and the shell M342 of the optical fiber structure M34 are different from each other, and the transmission angle of the angle defining film 3 meets a formula below:

$$n \cdot \sin\theta = \sqrt{n_{core}^2 - n_{clad}^2}$$

wherein, θ is the transmission angle of the angle defining film 3, n is the refractive index of the film layer contacting the angle defining film 3 in the display module 1, $n_{core}$ is the refractive index of the inner core M341 of the optical fiber structure M34, and $n_{clad}$ is the refractive index of the shell M342 of the optical fiber structure M34. As shown in FIG. 4B, when the incident angle of the light reflected by the touch body 4 with respect to the angle defining film 3 including the optical fiber structure M34 is larger than θ, the light will not be totally reflected in the optical fiber structure M34, that is, the light may penetrate through the optical fiber structure M34 and may be partially absorbed by the light-absorbing material M343 between the optical fiber structures M34, and this part of the light may pass through the angle defining film 3 and irradiate onto the fingerprint identification unit; however, this part of the light only corresponds to a background pattern with a weak brightness in the fingerprint image, without affecting the identification of the fingerprint image. Because the light transmissivity of the inner core M341 is larger than the light transmissivity of the light-absorbing material M343, the crosstalk phenomenon caused by the light reflected to the same fingerprint identification unit via different locations of the touch body in the prior art may be solved. In this solution, the thickness of the region set with a light-absorbing material M343 may be provided as compared with the diameter of the inner core M341 of the optical fiber structure M34, that is, the diameter of the inner core M341 of the optical fiber structure M34 may be increased relatively, the transmissivity of light of which an incident angle with respect to the angle defining film 3 is smaller than the transmission angle of the angle defining film 3 may be improved, hence improving the precision of fingerprint identification, and lowering the manufacture difficulty of the angle defining film 3.

Figure 4C:
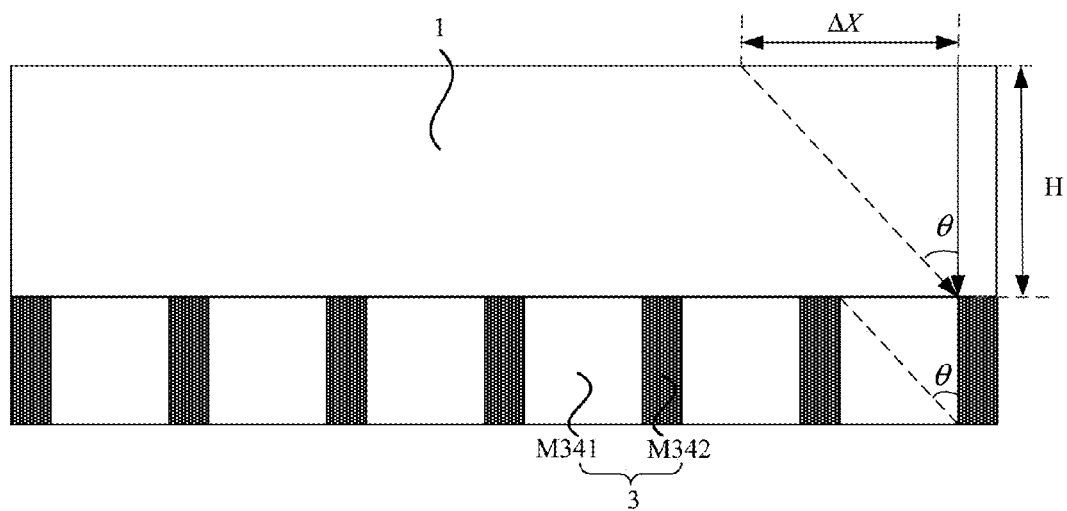
FIG. 4C is a diagram showing a geometric relation of the diffusion distance of the angle defining film shown in FIG. 4A.

In one embodiment, when the angle defining film 3 includes a plurality of optical fiber structures M34 arranged along the same direction, the refractive indexes of the inner core M341 and the shell M342 of the optical fiber structure M34 are different, a light-absorbing material M343 is provided between every adjacent two optical fiber structures M34, and a light transmissivity of the inner core M341 is larger than a light transmissivity of the light-absorbing material M343, the diffusion distance of the angle defining film 3 meets a formula below: ΔX=H·tan θ wherein, ΔX is the diffusion distance of the angle defining film 3, and H is the thickness of the display module 1. Exemplarily, as shown in FIG. 4C, the incident angle of the actual detection light with respect to the fingerprint identification unit 21 may be approximatively 0°, and among the interfering light that can pass through the angle defining film 3, the minimum incident angle of the light with respect to the fingerprint identification unit 21 may be the transmission angle of the angle defining film 3, i.e., the critical value of the incident angle at which the light can be totally reflected in the optical fiber structure M34, so that it exists the following calculation relation $$\tan\theta = \frac{\Delta X}{H}.$$

Similarly, the larger the diffusion distance of the angle defining film 3 is, the lower the accuracy and precision of the fingerprint identification performed by the display panel will be.

Figure 5A:
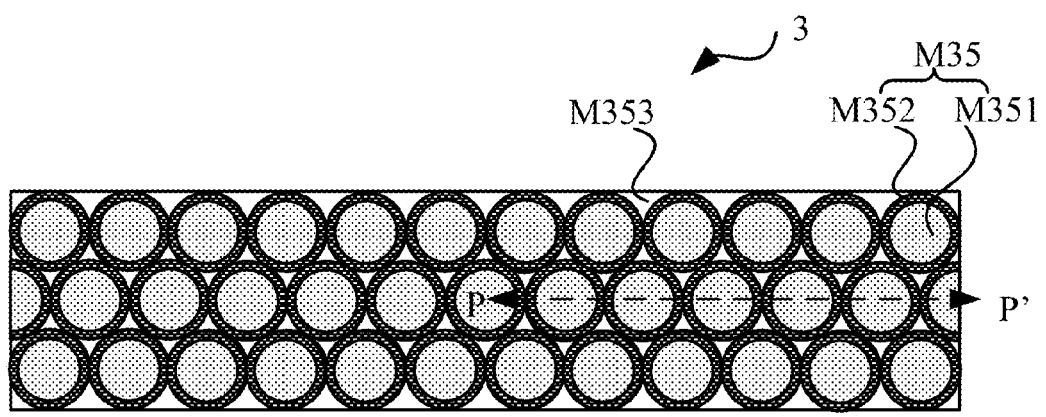
FIG. 5A is a top view showing the structure of another angle defining film according to an embodiment of the disclosure.
Figure 5B:
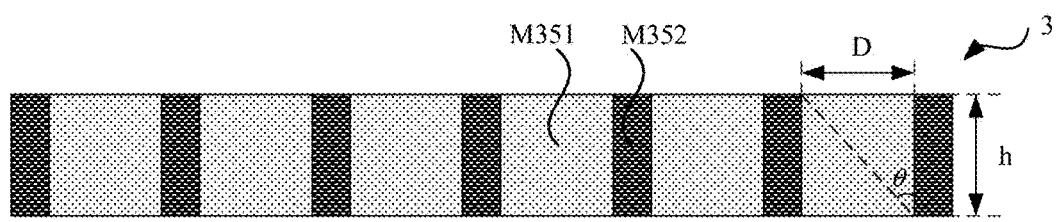
FIG. 5B is a schematic sectional view taken along direction PP' in FIG. 5A.

FIG. 5A is a top view showing the structure of another angle defining film according to an embodiment of the disclosure, and FIG. 5B is a schematic sectional view taken along PP' in FIG. 5A. In conjunction with FIG. 5A and FIG. 5B, the angle defining film 3 includes a plurality of columnar structures M35 arranged along the same direction, the columnar structure M35 includes an inner core M351 and a shell M352, the refractive indexes of the inner core M351 and the shell M352 are the same, the material forming the shell M352 includes a light-absorbing material M353, and the light transmissivity of the inner core M351 is larger than the light transmissivity of the light-absorbing material M353. In one embodiment, the light-absorbing material M353 may be provided between adjacent the columnar structures M35, or alternatively, no light-absorbing material M353 may be provided.

Specifically, the light transmissivity of the inner core M351 is larger than the light transmissivity of the light-absorbing material M353. Therefore, the transmission angle of the angle defining film 3 meets a formula below:

$$\theta = \arctan\frac{D}{h}$$

wherein, θ is the transmission angle of the angle defining film 3, D is the diameter of the inner core M351, and h is the thickness of the angle defining film 3. It may be seen from FIG. 5B that, θ, D and h have a calculation relation $$\tan\theta = \frac{D}{h},$$

and hence the transmission angle of the angle defining film 3 meets the above formula.

In one embodiment, when the angle defining film 3 includes a plurality of columnar structures M35 arranged along the same direction, the columnar structure M35 includes an inner core M351 and a shell M352, the refractive indexes of the inner core M351 and the shell M352 are the same with each other, the material forming the shell M352 includes a light-absorbing material M353, and when the light transmissivity of the inner core M351 is larger than the light transmissivity of the light-absorbing material M353, the diffusion distance of the angle defining film 3 meets a formula below:

$$\Delta X = \frac{D\cdot(H+h)}{h}$$

wherein, ΔX is the diffusion distance of the angle defining film 3, and H is the thickness of the display module 1. The derivation process of this formula is similar to that of the diffusion distance of the angle defining film 3 of the structure shown in FIG. 2A, which will not be described again here. Similarly, the larger the diffusion distance of the angle defining film 3 is, the lower the accuracy and precision of the fingerprint identification performed by the display panel will be.

It should be noted that, starting from a top view angle of the angle defining film 3, the columnar structure M35 may correspond to the circular structure shown in FIG. 5A, or it may correspond to a structure of other shapes. In the embodiments of the disclosure, the shape of the columnar structure M35 is not limited.

In one embodiment, the diffusion distance of the angle defining film 3 is smaller than 400 μm. The larger the diffusion distance of the angle defining film 3 is, the larger the distance between reflection points of the interfering detection light and the actual detection light on the touch body 4 will be. When the distance between reflection points of the actual detection light and the interfering detection light on the touch body 4 is larger than the distance between a valley 42 and a ridge 41 adjacent thereto in a fingerprint, an error may occur in the fingerprint identification process of the display panel, so that fingerprint identification cannot be performed, and thus the accuracy of fingerprint identification of the display panel will be seriously affected.

In one embodiment, the organic light-emitting structure 11 may provide a light source for the fingerprint identification module 2. When the fingerprint identification unit 21 performs fingerprint identification according to the light reflected to the fingerprint identification unit 21 via the touch body 4, which emitted by the organic light-emitting structure 11, in the fingerprint identification stage, only one of the organic light-emitting structures 11 emits light in twice of a range of the diffusion distance of the angle defining film 3. Specifically, By the configuration that only one organic light-emitting structure 11 emits light in twice of a range of the diffusion distance of the angle defining film 3, the probability that the light emitted by different organic light-emitting structures 11 is reflected by different locations of the touch body 4 to the same fingerprint identification unit 21 can be greatly lowered, and hence the crosstalk phenomenon caused by the light of the fingerprint identification light source 22 that is reflected by different locations of the touch body 4 and irradiates onto the same fingerprint identification unit 21 can be alleviated, thereby improving the accuracy and precision of fingerprint identification.

In one embodiment, an optical adhesive layer, which is configured to adhere the fingerprint identification module 2 to the angle defining film 3, may be provided between the fingerprint identification module 2 and the angle defining film 3. In one embodiment, the fingerprint identification unit 21 includes an optical fingerprint sensor, which can perform fingerprint detection and identification according to the light reflected by the touch body 4. Exemplarily, the material forming the fingerprint identification unit 21 includes a light-absorbing material such as amorphous silicon or gallium arsenide or arsenical sulphide, etc., or it may be other light-absorbing materials. In the embodiments of the disclosure, the material forming the fingerprint identification unit 21 is not limited.

In one embodiment, as shown in FIGS. 1B and 2C, the display panel may further include an encapsulation layer 12, a sheet polarizer 13 and a cover glass 14 that are successively provided on the organic light-emitting structure 11. The encapsulation layer 12 may include an encapsulation glass or a thin-film encapsulation layer, when the encapsulation layer 12 includes an encapsulation glass, the display panel is unbendable; when the encapsulation layer 12 includes a thin-film encapsulation layer, the display panel is bendable. In one embodiment, the first substrate 20 functioning as a backing substrate of the fingerprint identification unit 21 may include a glass substrate or a flexible substrate. Exemplarily, the cover glass 14 may be adhered to the sheet polarizer 13 via an optical adhesive.

In one embodiment, the display panel may further include a touch electrode layer, and the touch electrode layer may be located between the encapsulation layer 12 and the sheet polarizer 13 and integrated with the display panel of the touch electrode layer, so that a touch function can be realized together with a display function.

It should be noted that, in the drawings of the embodiments of the disclosure, it only exemplarily shows the size of each element and the thickness of each film layer, which does not represent the actual size of each element and each film layer in the display panel.

In the embodiments of the disclosure, an angle defining film 3 is provided between the display module 1 and the fingerprint identification module 2, wherein among lights reflected to the fingerprint identification unit 21 via the touch body 4, the transmissivity of the light by the angle defining film 3 is $A_1$ when an incident angle of said light with respect to the angle defining film 3 is smaller than the transmission angle of the angle defining film 3, and among the light reflected to the fingerprint identification unit 21 via the touch body 4, the transmissivity of the light by the angle defining film 3 is $A_2$ when an incident angle of said light with respect to the angle defining film 3 is larger than the transmission angle of the angle defining film 3, wherein $A_1 > A_2 > 0$. With respect to the crosstalk phenomenon caused by the lights reflected to the same fingerprint identification unit 21 via different locations of the touch body 4 in the prior art, the accuracy and precision of the fingerprint identification process can be improved. Furthermore, by the display panel and the display device according to the embodiments of the disclosure, the manufacture difficulty of the angle defining film 3 may be lowered, the transmissivity of light of which an incident angle with respect to the angle defining film 3 is smaller than the transmission angle of the angle defining film 3 may be increased, thereby improving the precision of fingerprint identification, without affecting the read of a fingerprint.

Figure 6A:
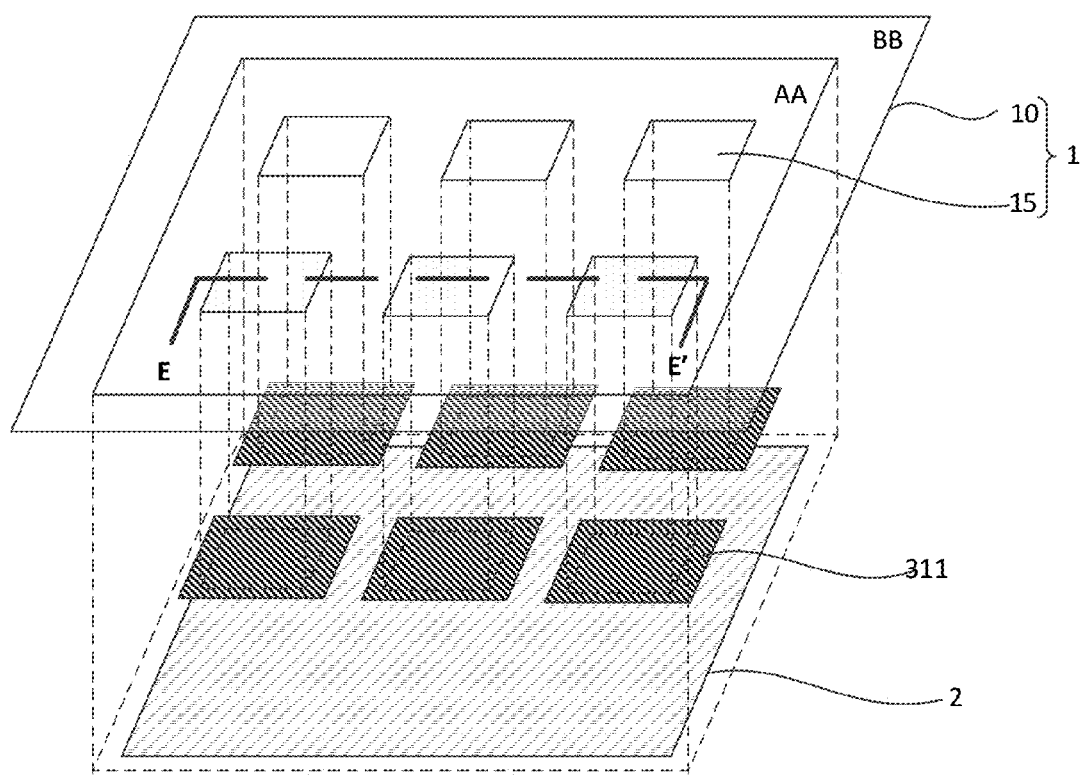
FIG. 6A is a schematic diagram showing the spatial structure of a display panel according to an embodiment of the disclosure.
Figure 6B:
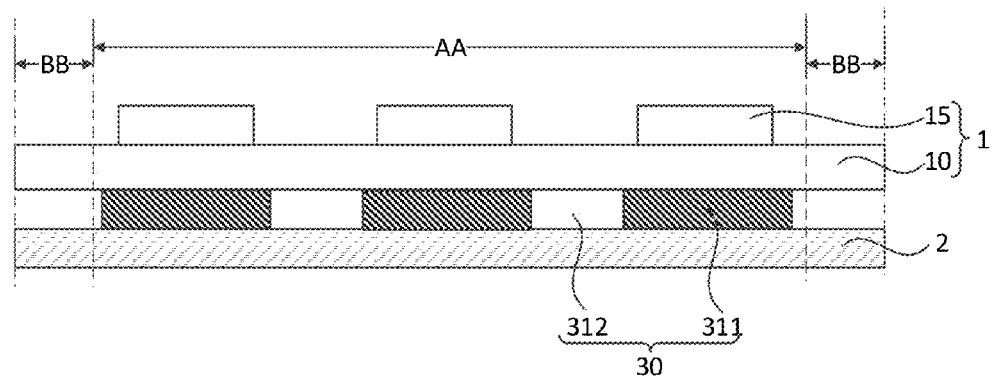
FIG. 6B is a schematic sectional view taken along direction EE' in FIG. 6A.

FIG. 6A is a schematic diagram showing the spatial structure of a display panel according to an embodiment of the disclosure, and FIG. 6B is a schematic sectional view taken along direction EE' in FIG. 6A. Referring to FIG. 6A and FIG. 6B, in an example where fingerprint identification is performed using the light emitted by a fingerprint identification light source 22, the display panel includes a display module 1, a fingerprint identification module 2 and at least one black matrix 30. The display module 1 includes an array substrate 10 and a plurality of pixel circuits 15. The array substrate 10 includes a display region AA and an non-display region BB surrounding the display region AA, the plurality of pixel circuits 15 are located in the display region AA of the array substrate 10, the pixel circuit 15 includes a plurality of thin-film transistors (not shown in FIG. 6A and FIG. 6B), the thin-film transistor includes a gate electrode, a source electrode and a drain electrode. The fingerprint identification module 2 is formed in the display region AA on one side of the array substrate 10 that is facing away from the thin-film transistor (contained in the pixel circuit 15). The black matrix 30 is located between the thin-film transistor (contained in the pixel circuit 15) and the fingerprint identification module 2, and the black matrix 30 includes light-tight regions 311 and light transmitting regions 312 located between the light-tight regions 311, and the projections of the gate electrode, the source electrode and the drain electrode of the thin-film transistor (contained in the pixel circuit 15) on the array substrate 10 are located within the projection of the light-tight region 311 on the array substrate 10.

In the embodiments of the disclosure, a black matrix is set between the thin-film transistor and the fingerprint identification module, and the black matrix is set to include a light-blocking area and an opening areas located between light-blocking areas. The projections of the gate electrode, the source electrode and the drain electrode of the thin-film transistor on the first substrate are located within the projection of the light-blocking area on the first substrate. When fingerprint identification is performed using the light emitted by the fingerprint identification light source, the light-blocking area of the black matrix may be used to block the light emitted from the fingerprint identification module, so that the reflected light formed by the light on the gate electrode, the source electrode and the drain electrode of the thin-film transistor may be reduced, and hence the probability that the reflected light formed at the gate electrode, the source electrode and the drain electrode of the thin-film transistor irradiates into the fingerprint identification module may be lowered, thereby reducing the noise caused by this part of the reflected light irradiating into the fingerprint identification module. Additionally, by providing an opening area on the black matrix, the light emitted from the fingerprint identification module may be allowed to pass through via the opening area and irradiate onto a finger pressed by a user on the display panel, and the reflected light formed after being reflected by the fingerprint of the finger may be allowed to pass through the opening area. By such an arrangement, it can increase the signal-to-noise ratio of the fingerprint identification module, thereby improving the precision of fingerprint identification of the fingerprint identification module.

In one embodiment, the material of the light-tight region 311 of the black matrix 30 may be a black metal, a black organic material or a material doped with a black pigment. Because these materials has a good absorbing capacity of light, when fingerprint identification is performed using the light emitted by the fingerprint identification light source, it is favorable for absorbing the light irradiating onto the light-tight region 311 of the black matrix 30 which is initially emitted from the fingerprint identification module 2, and thus the probability that the reflected light formed at the gate electrode, the source electrode and the drain electrode of the thin-film transistor irradiates into the fingerprint identification module 2 may be further lowered, thereby improving the precision of fingerprint identification of the fingerprint identification module 2. Typically, the material of the light-tight region 311 of the black matrix 30 may be chromium.

Figure 7:
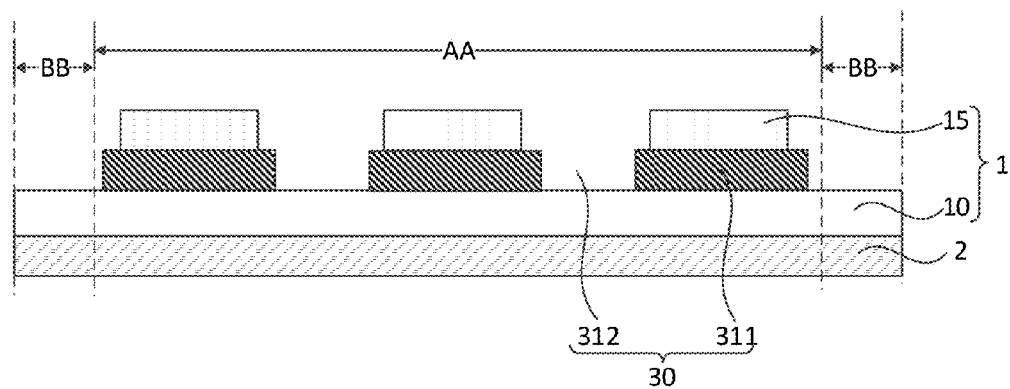
FIG. 7 is a schematic sectional view of another display panel according to an embodiment of the disclosure.
Figure 8:
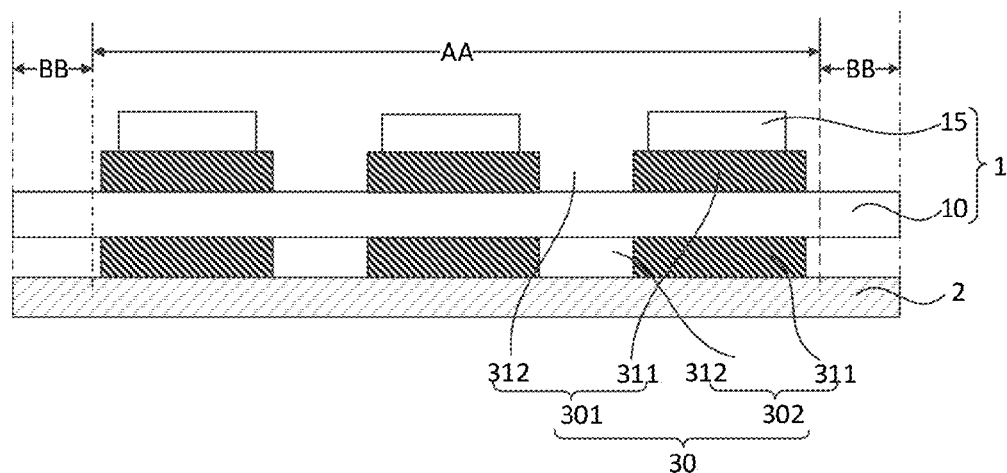
FIG. 8 is a schematic sectional view of another display panel according to an embodiment of the disclosure.

It should be noted that, in FIG. 6B, the black matrix 30 is provided between the array substrate 10 and the fingerprint identification module 2. This is merely an specific example of the disclosure, rather than limiting the disclosure. In one embodiment, as shown in FIG. 7, the black matrix 30 is provided between the thin-film transistor (contained in the pixel circuit 15) and the array substrate 10. Or, as shown in FIG. 8, the display panel includes two black matrixes 30, wherein the first black matrix 301 is provided between the thin-film transistor (contained in the pixel circuit 15) and the array substrate 10, and the second black matrix 302 is provided between the array substrate 10 and the fingerprint identification module 2.

During specific manufacturing, the array substrate 10 may be set as a rigid substrate, for example, of a quartz or glass material, or the array substrate 10 may be set as a flexible substrate, for example, of a polyimide material. Detailed illustration will be given below on a typical display panel structure. However, the examples listed are merely used for explaining and illustrating the disclosure, rather than limiting the disclosure.

Figure 9:
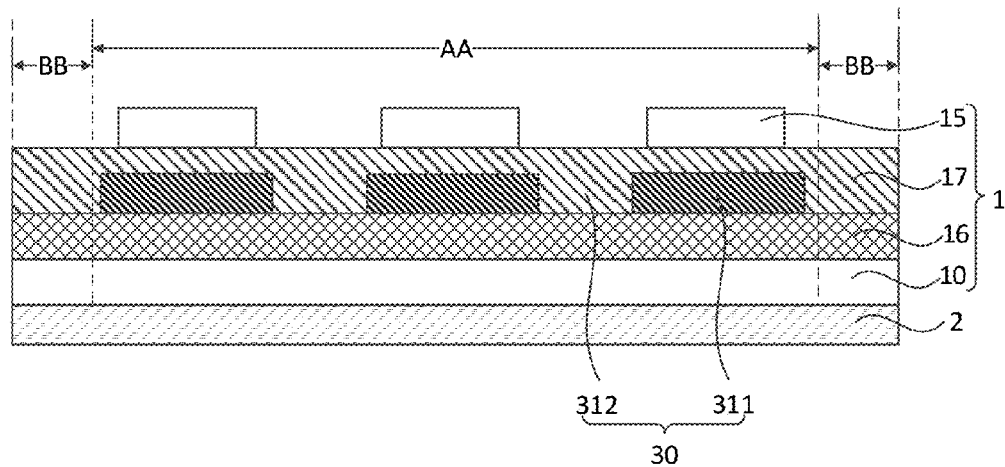
FIG. 9 is a schematic sectional view of another display panel according to an embodiment of the disclosure.

FIG. 9 is a schematic sectional view of another display panel according to an embodiment of the disclosure. Specifically, referring to FIG. 9, the array substrate 10 in the display panel is a rigid substrate; the black matrix 30 is provided between the thin-film transistor (contained in the pixel circuit 15) and the array substrate 10; the display panel further includes a first planarization layer 16 and a second planarization layer 17; the first planarization layer 16 is located on a surface of the array substrate 10 that is adjacent to the black matrix 30; the second planarization layer 17 is located on a surface of the black matrix 30 that is adjacent to the thin-film transistor (contained in the pixel circuit 15), and the second planarization layer 17 covers the light-tight region 311 of the black matrix 30 and fills in the light transmitting region 312 of the black matrix 30. The material of the array substrate 10 may be quartz or glass, etc., and the array substrate 10 is configured to provide a supporting function in the manufacture process of the subsequent parts such as the pixel circuit 15 and the organic light-emitting structure 11, etc.

In practice, as limited by the surface polishing precision of the array substrate 10 and the cleaning degree of the array substrate 10, etc., tiny defects may be present on the array substrate 10. Here, the purpose of arranging a first planarization layer 16 (which may be located on the array substrate 10) is to fill in the tiny defects on the array substrate 10 and planarize the surface of the array substrate 10.

During the practical manufacture process of the black matrix 30, in a planned way, a film layer is only deposited at a location of the array substrate 10 where a light-tight region 311 of the black matrix 30 is arranged, and no film layer is deposited at a location of the array substrate 10 where a light transmitting region 312 of the black matrix 30 is arranged, thus after the black matrix 30 is formed, a thickness difference exists between the light-tight region 311 and the light transmitting region 312 of the black matrix 30. During the subsequent manufacturing, a part of the region of the related film layers consisting the pixel circuit 15 will sink into the light transmitting region 312 of the black matrix 30, causing a part of the elements in the pixel circuit 15 near the light transmitting region 312 of the black matrix 30 to be displaced, so that a bad phenomenon such as short circuit or open circuit may appear in the pixel circuit 15, and the display effect of the display panel may be affected. In this technical solution, the purpose of arranging a second planarization layer 17 on a surface of the black matrix 30 that is adjacent to the thin-film transistor (contained in the pixel circuit 15) and covering the light-tight region 311 of the black matrix 30 and filling in the light transmitting region 312 of the black matrix 30 with the second planarization layer 17 is to eliminate the thickness difference between the light-tight region 311 of the black matrix 30 and the light transmitting region 312 of the black matrix 30, thereby preventing the bad phenomenon of the displacement of a part of the elements in the pixel circuit 15 formed in the subsequent manufacture process, and improving the yield of the display panel. In one embodiment, it may also possible that the second planarization layer 17 only fills in the light transmitting region 312 of the black matrix 30.

During specific manufacturing, the materials of the first planarization layer 16 and the second planarization layer 17 may be any insulating material. Because polyimide has stable physical and chemical properties, a good electric insulation, a simple manufacture process and a low cost, the materials of the first planarization layer 16 and the second planarization layer 17 may be polyimide.

Figure 10:
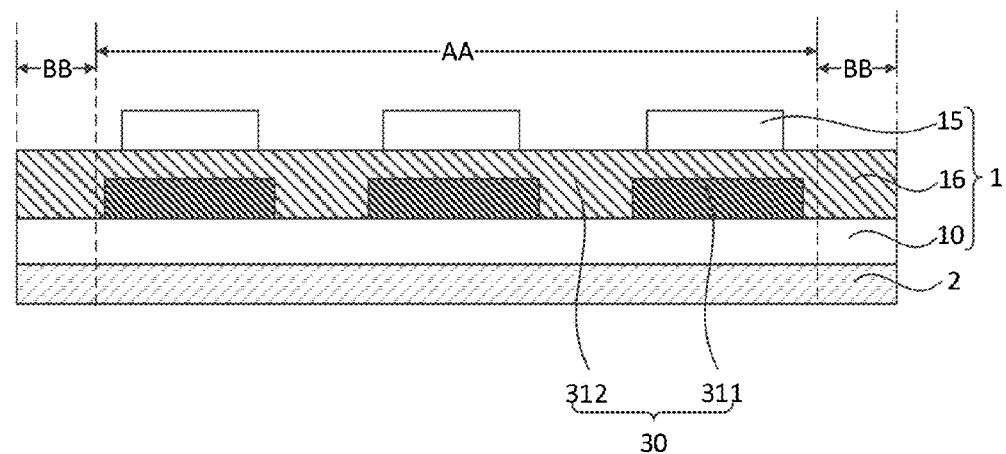
FIG. 10 is a schematic sectional view of another display panel according to an embodiment of the disclosure.

FIG. 10 is a schematic sectional view of another display panel according to an embodiment of the disclosure. Specifically, referring to FIG. 10, in the display panel, the array substrate 10 is a flexible substrate; the black matrix 30 is set between the thin-film transistor (contained in the pixel circuit 15) and the array substrate 10; the display panel further includes a first planarization layer 16, the first planarization layer 16 is located on a surface of the black matrix 30 that is adjacent to the thin-film transistor (contained in the pixel circuit 15), and the first planarization layer 16 covers the light-tight region 311 of the black matrix 30 and fills in the light transmitting region 312 of the black matrix 30.

Similarly, in this technical solution, the purpose of providing a first planarization layer 16 on a surface of the black matrix 30 that is adjacent to the thin-film transistor (contained in the pixel circuit 15) and covering the light-tight region 311 of the black matrix 30 and filling in the light transmitting region 312 of the black matrix 30 with the first planarization layer 16 is to eliminate the thickness difference between the light-tight region 311 of the black matrix 30 and the light transmitting region 312 of the black matrix 30, thereby preventing the bad phenomenon of the displacement of a part of the elements in the pixel circuit 15 formed in the subsequent manufacture process, and improving the yield of the display panel.

During specific manufacturing, the materials of the array substrate 10 and the second planarization layer 17 may be any insulating material. Because polyimide has stable physical and chemical properties, a good electric insulation, a strong toughness, a simple manufacture process and a low cost, the materials of the array substrate 10 and the second planarization layer 17 may be polyimide.

Based on the above technical solutions, in the display panel, the thin-film transistor forming the pixel circuit 15 may have a top gate structure or a bottom gate structure. During specific manufacturing, it may be determined according to product specifications. Detailed illustration will be given below on a typical display panel structure; however, the examples listed are merely used for explaining and illustrating the disclosure, rather than limiting the disclosure.

Figure 11:
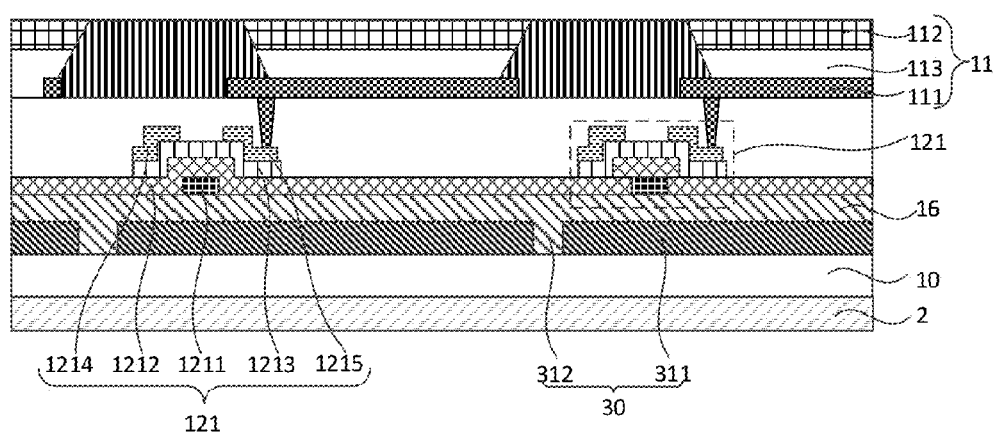
FIG. 11 is a schematic sectional view of another display panel according to an embodiment of the disclosure.

FIG. 11 is a schematic sectional view of another display panel according to an embodiment of the disclosure. Specifically, referring to FIG. 11, exemplarily, the pixel circuit of the display panel only includes one thin-film transistor 121. The thin-film transistor 121 has a bottom gate structure, which includes: a gate electrode 1211 formed on the array substrate 10, a first insulating layer 1212 formed on the gate electrode 1211, an active layer 1213 formed on the first insulating layer 1212, and a source electrode 1214 and a drain electrode 1215 formed on the active layer 1213.

Figure 12:
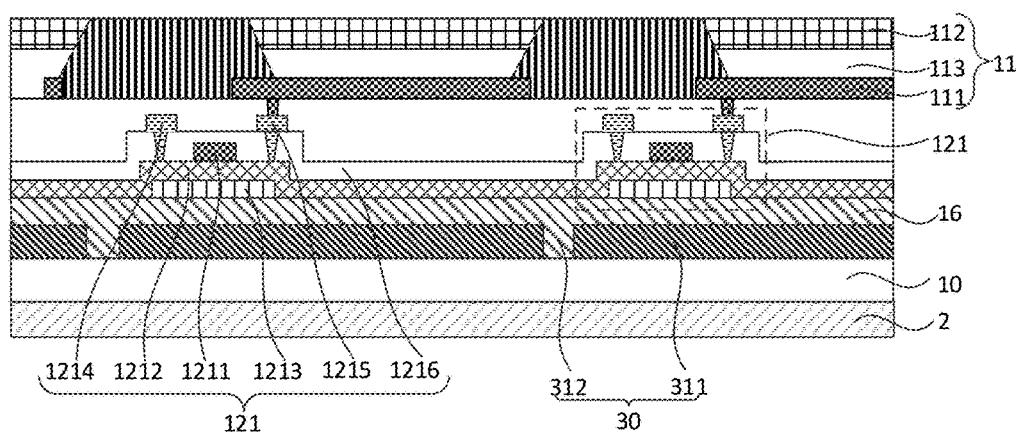
FIG. 12 is a schematic sectional view of another display panel according to an embodiment of the disclosure.

FIG. 12 is a schematic sectional view of another display panel according to an embodiment of the disclosure. Specifically, referring to FIG. 12, exemplarily, the pixel circuit of the display panel only includes one thin-film transistor 121. The thin-film transistor 121 has a top gate structure, which includes: an active layer 1213 formed on the array substrate 10, a first insulating layer 1212 formed on the active layer 1213, a gate electrode 1211 formed on the first insulating layer 1212, a second insulating layer 1216 formed on the gate electrode, and a source electrode 1214 and a drain electrode 1215 formed on the second insulating layer 1216.

It should be noted that, if the display panel is an organic light-emitting display panel, as shown in FIG. 11 or FIG. 12, the organic light-emitting structure 11 may include a first electrode 111, a second electrode 112 and a light-emitting layer 113 located between the first electrode 111 and the second electrode 112. In operation, the first electrode 111 may be provided as an anode, and the second electrode 112 may be provided as a cathode; or, the first electrode 111 may be provided as a cathode, and the second electrode 112 may be provided as an anode. If the display panel is a liquid crystal display panel, the light-emitting unit may be a subpixel unit.

Figure 13A:
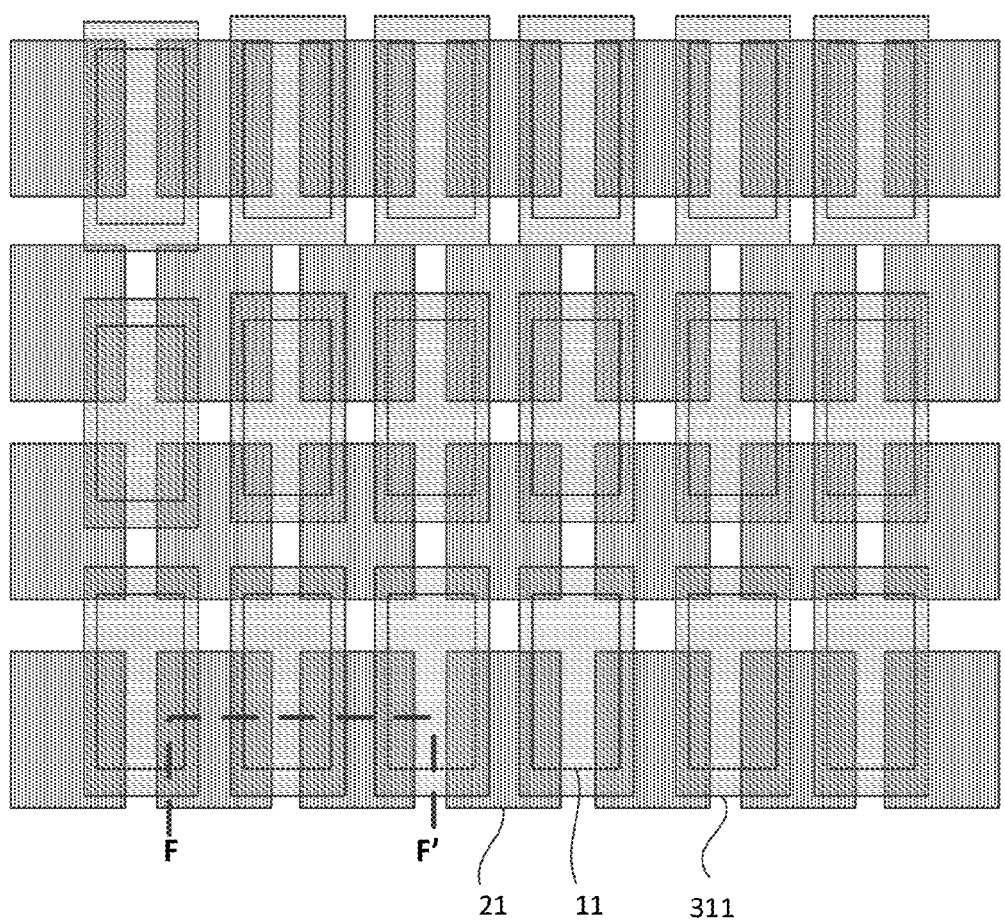
FIG. 13A is a top view showing the structure of another display panel according to an embodiment of the disclosure.
Figure 13B:
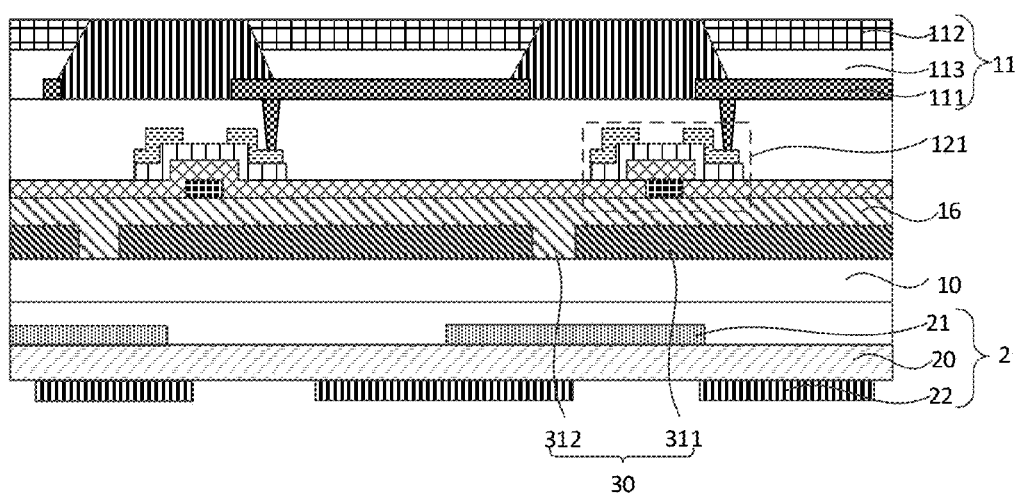
FIG. 13B is a schematic sectional view taken along direction FF' in FIG. 13A.

FIG. 13A is a top view showing the structure of another display panel according to an embodiment of the disclosure, and FIG. 13B is a schematic sectional view taken along direction FF' in FIG. 13A. Specifically, referring to FIG. 13A and FIG. 13B, the fingerprint identification module 2 includes: a first substrate 20 and a plurality of fingerprint identification units 21 provided separately on the first substrate 20, wherein the fingerprint identification unit 21 is provided on one side of the first substrate 20 that is adjacent to the array substrate 10, and the vertical projection of the fingerprint identification unit 21 on the array substrate 10 is at least partially located within the vertical projection of the light transmitting region 312 of the black matrix 30 on the array substrate 10. Here, the configuration that the vertical projection of the fingerprint identification unit 21 on the array substrate 10 is at least partially located within the vertical projection of the light transmitting region 312 of the black matrix 30 on the array substrate 10 has advantages in that, when fingerprint identification is performed using the light emitted by the fingerprint identification light source 22, the shielding effect of the light-tight region 311 of the black matrix 30 on the light reflected by the fingerprint of a user finger may be lowered, so that the lights reflected by the fingerprint of the user finger can pass through the opening area 312 of the black matrix 30 and irradiate into the fingerprint identification unit 21 to large extent, thereby improving the signal-to-noise ratio of the fingerprint identification unit 21.

In one embodiment, the fingerprint identification light source 22 in the fingerprint identification module 2 is a collimated light source or an area light source. In comparison with the area light source, the use of the collimated light source may alleviate the crosstalk of the light reflected by the fingerprint of a user finger between different fingerprint sensors, thereby improving the precision of fingerprint identification. However, because the thickness of a collimated light source is often larger than that of an area light source, the use of a collimated light source will increase the thickness of the display panel.

Figure 14A:
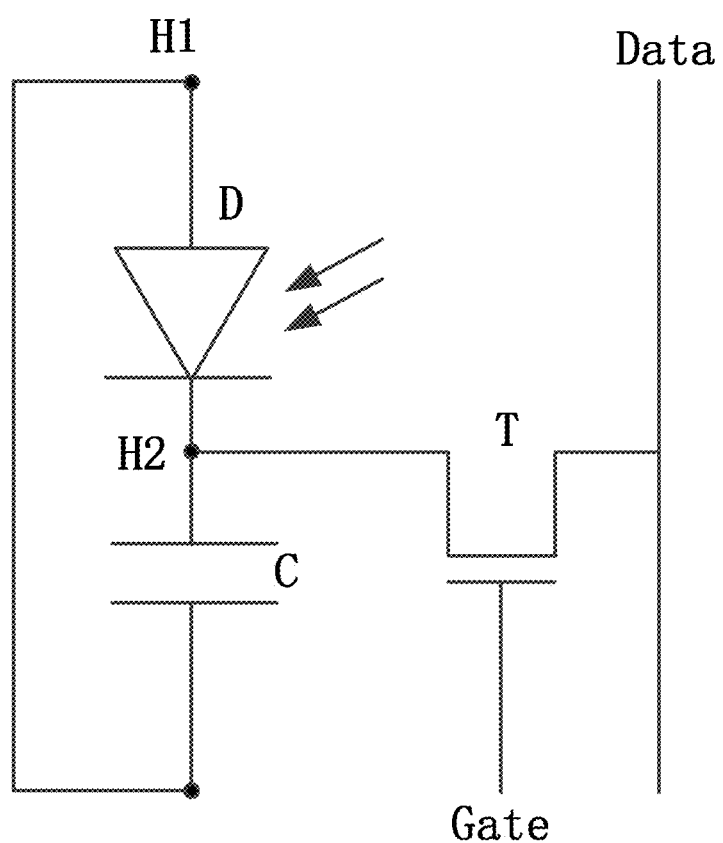
FIG. 14A is a schematic circuit diagram of a fingerprint identification unit according to an embodiment of the disclosure.
Figure 14B:
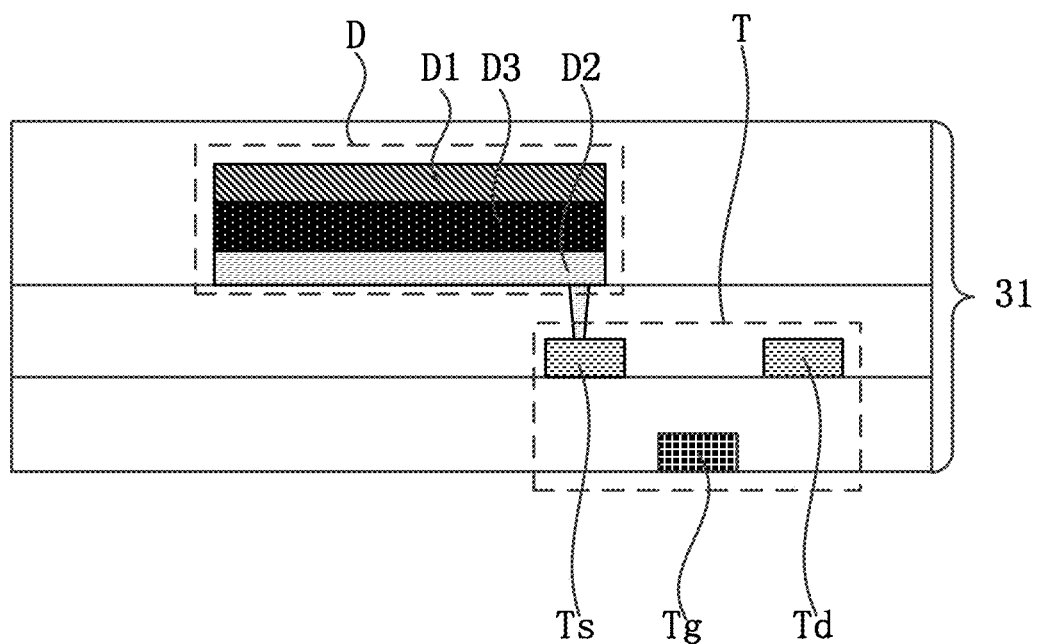
FIG. 14B is a schematic diagram showing the film structure of a fingerprint identification unit according to an embodiment of the disclosure.

FIG. 14A is a schematic circuit diagram of a fingerprint identification unit according to an embodiment of the disclosure, and FIG. 14B is a schematic diagram showing the film structure of a fingerprint identification unit according to an embodiment of the disclosure. Referring to FIG. 14A and FIG. 14B, the fingerprint identification unit may include a photosensitive diode D, a storage capacitor C and a thin-film transistor T. The anode D1 of the photosensitive diode D is electrically connected with the first electrode of the storage capacitor C, and the cathode D2 is electrically connected with the second electrode of the storage capacitor C and the source electrode Ts of the thin-film transistor T; the gate electrode Tg of the thin-film transistor T is electrically connected with a switch control line Gate, the drain electrode Td of the thin-film transistor T is electrically connected with a signal line Data. The photosensitive diode D is configured to convert the light reflected by the touch body into a current signal.

Specifically, the photosensitive diode D further includes a PIN junction D3 located between the anode D1 and the cathode D2. The cathode D2 is formed of a light-tight metal, and the boundary of the PIN junction D3 does not exceed the boundary of the cathode D2. The anode D1 of the photosensitive diode D is located on one side of the PIN junction D3 that is facing away from the thin-film transistor T. The PIN junction D3 has a photosensitive feature and a unilateral conductivity. When there is no light to irradiate, the PIN junction D3 has a very small saturated reverse leakage current, i.e., dark current, and at this time, the photosensitive diode D is cut off. When there is light to irradiate, the saturated reverse leakage current of the PIN junction D3 increases greatly to form a photoelectric current, which changes with the intensity of the incident light.

Figure 15:
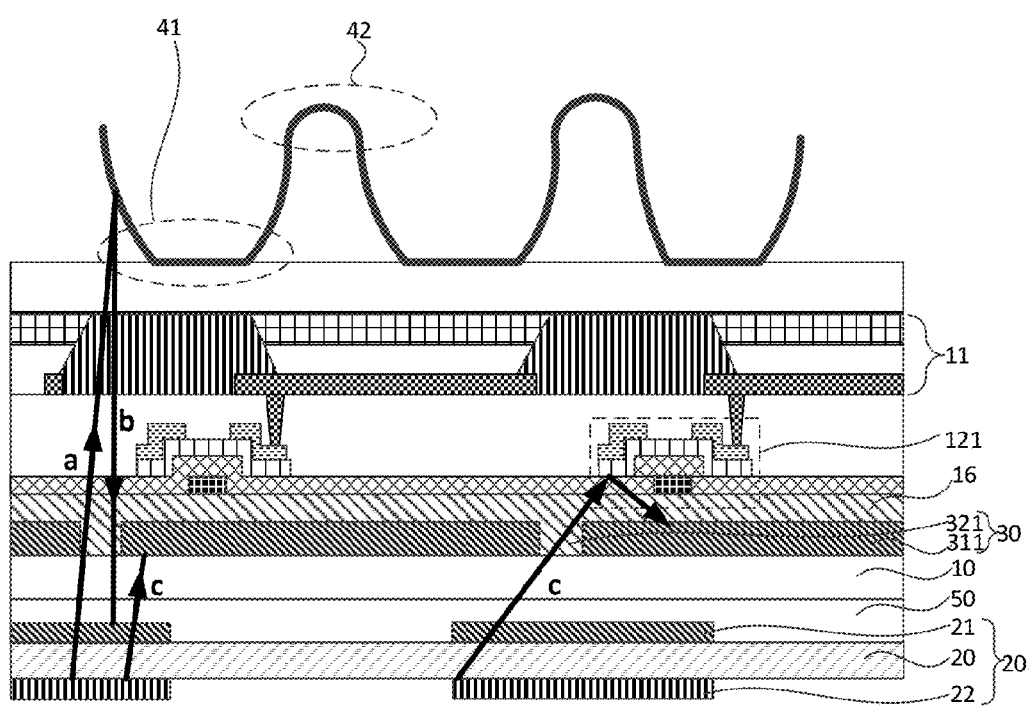
FIG. 15 is a functional diagram showing the fingerprint identification of a fingerprint identification module.

Exemplarily, FIG. 15 is a functional diagram showing the fingerprint identification of a fingerprint identification module. The fingerprint identification principle is illustrated in detail in conjunction with FIG. 14A, FIG. 14B and FIG. 15. In the fingerprint identification stage, a low-voltage signal (for example, a constant voltage signal of −5V) is input to node H1, and a high-voltage signal (for example, a constant voltage signal of 1.5V) is input to signal line Data. The whole fingerprint identification stage includes a preparation stage, a fingerprint signal acquisition stage and a fingerprint signal detection stage. In the preparation stage, a drive chip electrically connected with the fingerprint identification unit (not shown in FIG. 14A, FIG. 14B and FIG. 15) controls the thin-film transistor T of the fingerprint identification unit to be turned on via a switch control line Gate, and the storage capacitor C is charged until it is fully charged. In the fingerprint identification stage, the thin-film transistor T of the fingerprint identification unit is controlled to be turned off via the switch control line Gate. When a user press a finger on the display panel, the reflected light formed by reflecting on the finger may irradiate into the fingerprint identification unit 31 and then received by the photosensitive diode D of the fingerprint identification unit, so that photoelectric current is formed. The photoelectric current flows in a direction from node H2 to node H1, so that the potential on H2 is changed. In the fingerprint signal detection stage, the potential variation of the node H2 may be directly detected, thereby determining the photoelectric current.

In one embodiment, in the fingerprint signal detection stage, the thin-film transistor T of the fingerprint identification unit may also be controlled to be turned on via the switch control line Gate, and at this time, there is a potential difference between the two electrodes of the storage capacitor C, and hence the storage capacitor C is in a charging state, so that the magnitude of the photoelectric current may be determined by detecting the quantity of electric charges charged into the storage capacitor C.

Here, in an example in which fingerprint identification is performed using a fingerprint identification light source, when a user presses a finger on the display panel, the light emitted by the fingerprint identification light source 22 in the fingerprint identification module 2 is divided into two parts: light a, this part of the lights may pass through the light transmitting region 312, irradiate on the finger and form reflected light b by reflecting on the surface of the fingerprint; and light c, this part of the lights may irradiate onto the light-tight region 311 of the black matrix 30 and hence may be absorbed by the light-tight region 311 of the black matrix 30. Because the ridge 41 of the fingerprint pressed on the display panel contacts the surface of the display panel and the valley 42 does not contact the surface of the display panel, the reflectivity of the lights irradiating onto the valley 42 and the ridge 41 of the fingerprint will be different, so that the intensity of the reflected light formed at the ridge 41 and the reflected light formed at the valley 42 that are received by the fingerprint identification unit will be different, and hence the magnitude of the photoelectric currents converted by the reflected light formed at the ridge 41 and by the reflected light formed at the valley 42 will be different. Fingerprint identification may be performed according to the magnitude of the photoelectric current.

In each of the above technical solutions, in order to prevent relative displacement from occurring between the display module 1 and the fingerprint identification module 2, and ensure a good light transmissivity of the display panel, as shown in FIG. 15, the fingerprint identification module 2 and the array substrate 10 be adhered to each other via an optical adhesive 50. The material of the optical adhesive 50 may be an acrylic material and a silicon material.

In the embodiments of the disclosure, a black matrix is provided between the thin-film transistor and the fingerprint identification module, and the black matrix is provided to include a light-blocking area and an opening areas located between light-blocking areas, the projections of the gate electrode, the source electrode and the drain electrode of the thin-film transistor on the first substrate are located within the projection of the light-blocking area on the first substrate, when fingerprint identification is performed using the light emitted by the fingerprint identification light source, the light-blocking area of the black matrix may be used to block the light emitted from the fingerprint identification module, so that the reflected light formed by the light on the gate electrode, the source electrode and the drain electrode of the thin-film transistor may be reduced, thereby lowering the probability that the reflected light formed at the gate electrode, the source electrode and the drain electrode of the thin-film transistor irradiates into the fingerprint identification module, and further reducing the noise caused by this part of the reflected light irradiating into the fingerprint identification module. Additionally, by providing an opening area on the black matrix, the light emitted from the fingerprint identification module may be allowed to pass through the opening area and irradiate onto a finger pressed by a user on the display panel, and the reflected light formed after being reflected by the fingerprint of the finger may be allowed to pass through the opening area. By such an arrangement, it can increase the signal-to-noise ratio of the fingerprint identification module and improve the precision of fingerprint identification of the fingerprint identification module.

Figure 16A:
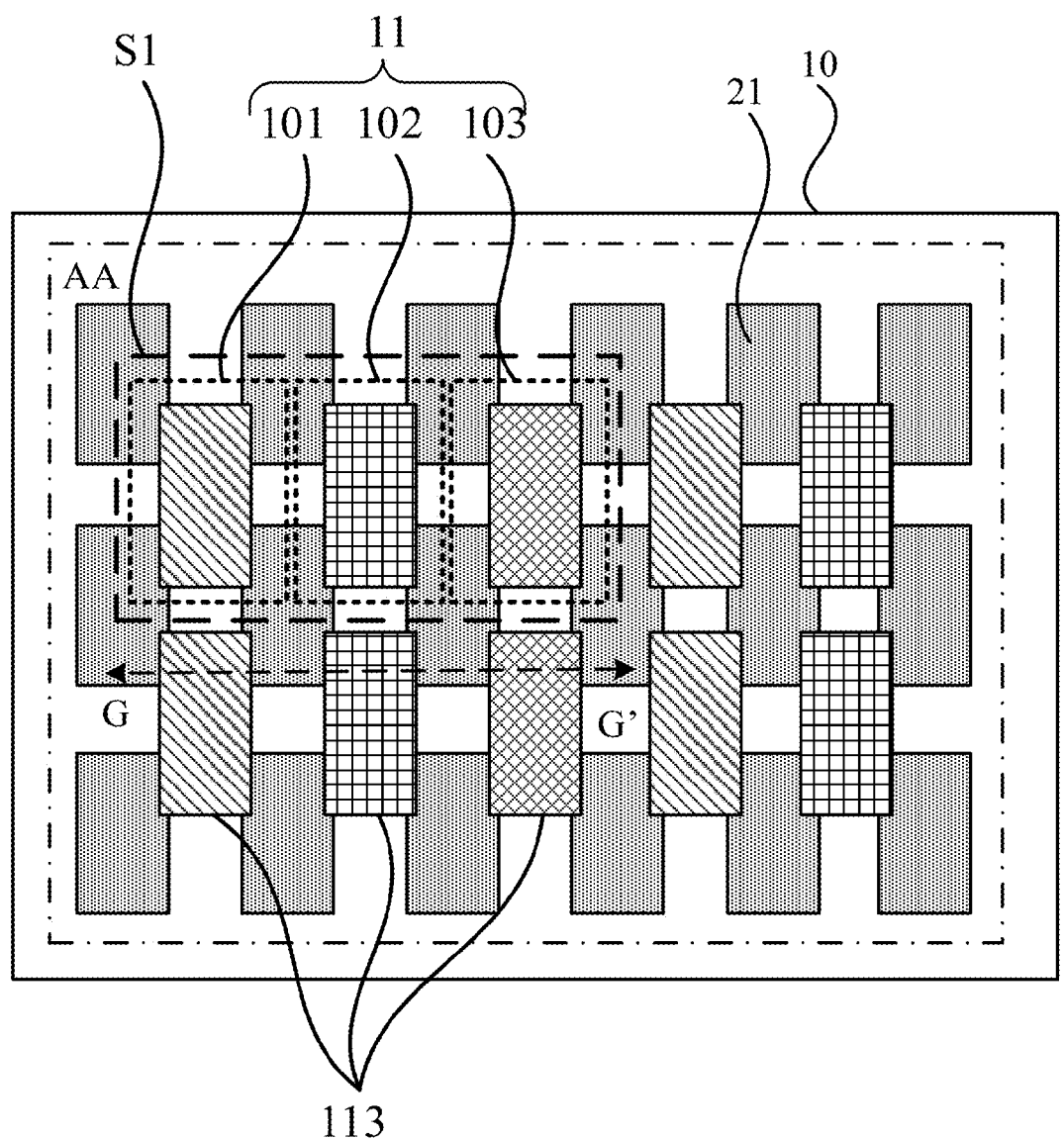
FIG. 16A is a top view showing the structure of a display panel according to an embodiment of the disclosure.
Figure 16B:
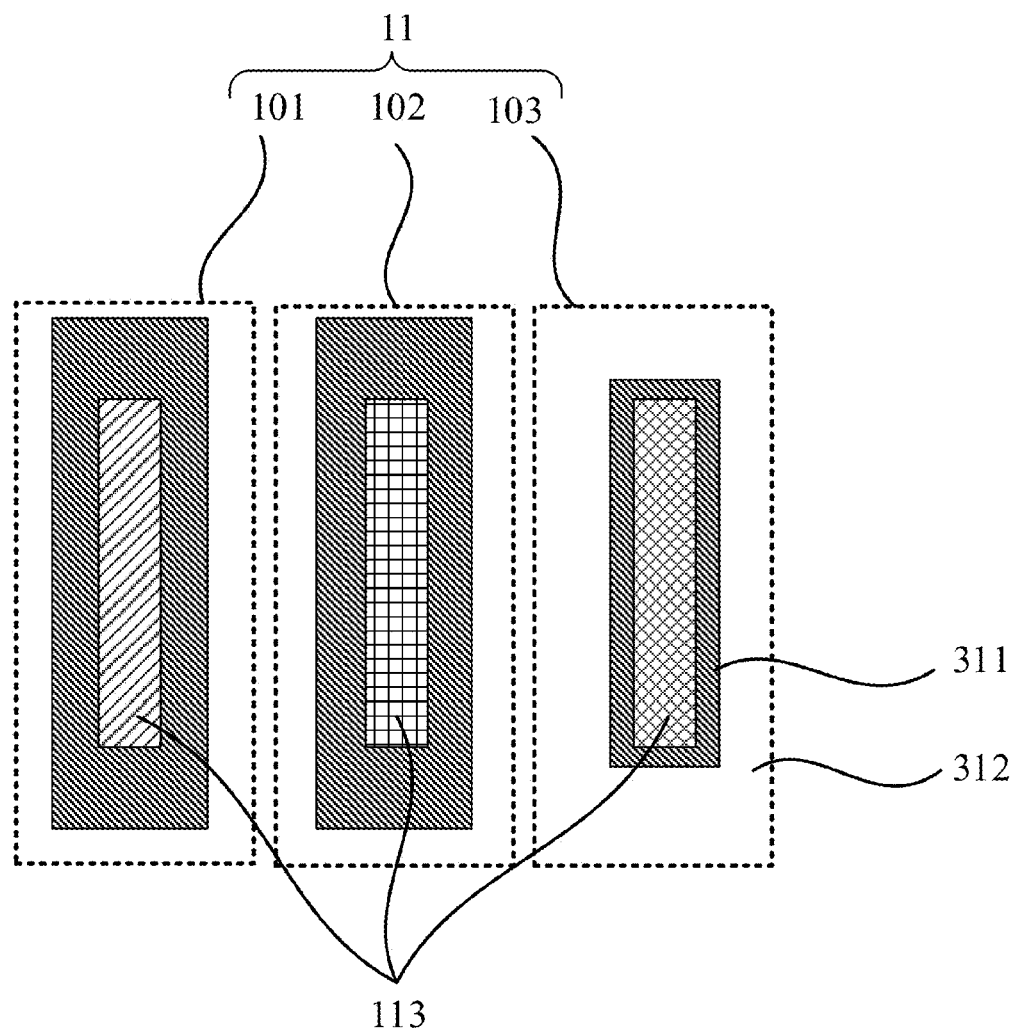
FIG. 16B is a close-up view of a region S1 in FIG. 16A.
Figure 16C:
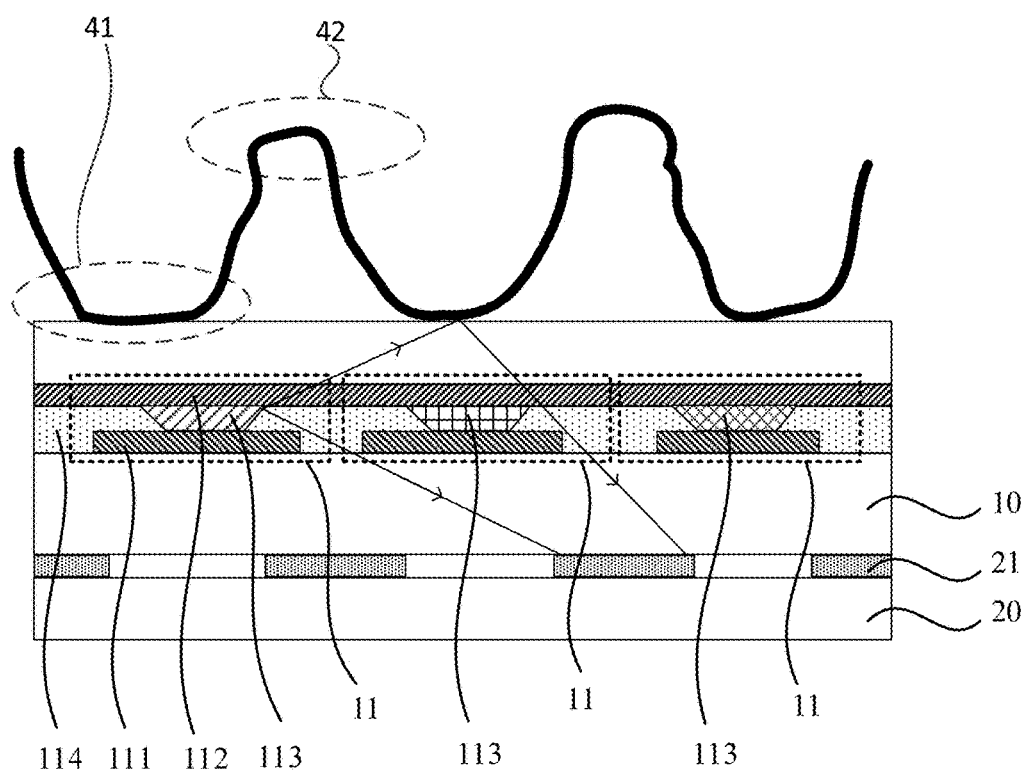
FIG. 16C is a schematic sectional view taken along direction GG' in FIG. 16A.

FIG. 16A is a top view showing the structure of a display panel according to an embodiment of the disclosure, FIG. 16B is a close-up view of a region S1 in FIG. 16A, and FIG. 16C is a schematic sectional view taken along direction GG' in FIG. 16A. Referring to FIG. 16A, FIG. 16B and FIG. 16C, in an example in which fingerprint identification is performed using the light emitted by an organic light-emitting structure 11, the display panel according to an embodiment of the disclosure includes an array substrate 10, a plurality of organic light-emitting structures 11 and at least one fingerprint identification unit 21. The plurality of organic light-emitting structures 11 are located on the array substrate 10, the fingerprint identification unit 21 is located in a display region AA on one side of the organic light-emitting structure 11 that is adjacent to the array substrate 10, the fingerprint identification unit 21 is configured to perform fingerprint identification according to the light reflected by a touch body (for example, a finger) to the fingerprint identification unit 21. The organic light-emitting structure 11 includes a red organic light-emitting structure 101, a green organic light-emitting structure 102 and a blue organic light-emitting structure 103. The red organic light-emitting structure 101 and/or the green organic light-emitting structure 102 may be used as the light source of the fingerprint identification unit 21. The light transmission area of the red organic light-emitting structure 101 and/or the green organic light-emitting structure 102 functioning as the light source of the fingerprint identification unit 21 towards the emergent light side departing from the display panel is less than the light transmission area of the blue organic light-emitting structure 103 towards the emergent light side departing from the display panel. It should be noted that, the number of the organic light-emitting structures 11 and the arrangement of the red organic light-emitting structure 101, the green organic light-emitting structure 102 and the blue organic light-emitting structure 103 in the organic light-emitting structure 11 are not limited in the embodiments of the disclosure.

Exemplarily, referring to FIG. 16B and FIG. 16C, each of the organic light-emitting structures 11 successively includes a first electrode 111, a light-emitting layer 113 and a second electrode 112 along the direction in which the organic light-emitting structure 11 departs from the array substrate 10. The organic light-emitting structure 11 includes a red organic light-emitting structure 101, a green organic light-emitting structure 102 and a blue organic light-emitting structure 103, wherein the organic light-emitting structure 11 includes a light-emitting layer 113, and a light transmitting region 312 and a light-tight region 311 are present in the direction in which the light-emitting layer 113 departs from the emergent light side of the display panel. For a top-emission display panel, the emergent light side of the display panel is the direction in which the organic light-emitting structure 11 departs from the array substrate 10. The light-emitting layer 113 may include a first auxiliary functional layer, a luminescent material layer and a second auxiliary functional layer. The first auxiliary functional layer is a hole-type auxiliary functional layer, and may have a multi-layer structure, for example, it may include one or more of a hole injection layer, a hole transport layer and an electron blocking layer. The second auxiliary functional layer is an electron-type auxiliary functional layer, and may also have a multilayer structure and include one or more of an electron transport layer, an electron injection layer and a hole blocking layer. Under the action of an external electric field, electrons and holes are injected respectively from the second electrode 112 and the first electrode 111 into the luminescent material layer in the light-emitting layer 113 and combined to generate excitons, and the excitons migrate under the action of an external electric field, transfer the energy to the luminescent molecules in the luminescent material layer and excite the electrons to transit from a ground state to an excitation state. In the excitation state, energy is released via radiative transition, and hence light is generated. In this embodiment, the first electrode 111 is provided as an anode, and the second electrode 112 is provided as an cathode. In other embodiments, the first electrode 111 may be provided as a cathode, and the second electrode 112 may be provided as an anode, which is not limited in the embodiments of the disclosure.

The display panel according to an embodiment of the disclosure includes a plurality of organic light-emitting structures on the array substrate and at least one fingerprint identification unit, wherein the organic light-emitting structure includes a red organic light-emitting structure, a green organic light-emitting structure and a blue organic light-emitting structure. When fingerprint identification is performed using the light emitted by the organic light-emitting structure, in the light-emitting display stage, the red organic light-emitting structure, the green organic light-emitting structure and the blue light-emitting structure emit light as preset; in the fingerprint identification stage, because the wavelength of the light emitted by the blue organic light-emitting structure is short and each film layer (an organic insulating layer, an inorganic insulating layer and a sheet polarizer, etc.) in the display panel has a strong absorption on short-wavelength light, the light emitted by the blue organic light-emitting structure has a low light transmittance. Therefore, the light emitted by the red organic light-emitting structure and/or the green organic light-emitting structure is taken as the light source of the fingerprint identification unit; moreover, the light transmission area of the red organic light-emitting structure and/or the green organic light-emitting structure functioning as the light source of the fingerprint identification unit towards the emergent light side departing from the display panel is less than the light transmission area of the blue organic light-emitting structure towards the emergent light side departing from the display panel. By such an arrangement, since the organic light-emitting structure functioning as the light source has a smaller light transmission area, the stray light directly irradiating on the fingerprint identification unit without being reflected by the touch body (for example, a finger) will be reduced. Because only the light reflected by the touch body carries the fingerprint information and the light directly irradiating on the fingerprint identification unit without being reflected by the touch body (that is, the stray light) does not carry the fingerprint information, the noise during fingerprint detection is reduced by reducing the stray light in the embodiment of the disclosure, thereby improving the precision of fingerprint identification.

In one embodiment, referring to FIG. 16C, the display panel further includes a first substrate 20, the first substrate 20 is located on one side of the array substrate 10 that is facing away from the organic light-emitting structure 11, and the fingerprint identification unit 21 is located between the array substrate 10 and the first substrate 20. The fingerprint identification unit 21 and the first substrate 20 may be taken as a part of the fingerprint identification module, and the fingerprint identification module may further include some metal connection lines and an IC drive circuit (not shown).

In one embodiment, referring to FIG. 16B and FIG. 16C, each of the organic light-emitting structures 11 successively includes a first electrode 111, a light-emitting layer 113 and a second electrode 112 along the direction in which the organic light-emitting structure 11 departs from the array substrate 10, The first electrode 111 is provided as a reflection electrode, for example, it is possible that the reflection electrode includes a tin indium oxide conducting film, a reflection electrode layer (Ag) and a tin indium oxide conducting film that are set successively. The tin indium oxide conducting film is made of material with a high work function, which is favorable for hole injection. Furthermore, a pixel-defining layer 114 is provided between the light-emitting layer 113 of the red organic light-emitting structure 101, the light-emitting layer 113 of the green organic light-emitting structure 102 and the light-emitting layer 113 of the blue organic light-emitting structure 103. As shown in FIG. 16B and FIG. 16C, in the embodiment of the disclosure, exemplarily, a red organic light-emitting structure 101 and a green organic light-emitting structure 102 are both provided as the light source during fingerprint identification, and the area of the first electrode 111 of the red organic light-emitting structure 101 and the green organic light-emitting structure 102 is larger than that of the first electrode 111 of the blue organic light-emitting structure 103. Because the light emitted by the light-emitting layer 113 in organic light-emitting structure 11 to the side of the array substrate 10 will be blocked by the first electrode 111 between the light-emitting layer 113 and the fingerprint identification unit 21, and the reflection electrode of the red organic light-emitting structure 101 and the green organic light-emitting structure 102 functioning as the light source of the fingerprint identification unit 21 extends outward if compared with the prior art, thereby blocking the stray light irradiating on the fingerprint identification unit 21, and hence improving the precision of fingerprint identification, that is, the area of the reflection electrode in the blue organic light-emitting structure 103 may be set constant, and the area of the reflection electrodes in the red organic light-emitting structure 101 and the green organic light-emitting structure 102 may be increased on the basis of the prior art so as to block the stray light. Additionally, the reflection electrode is adjacent to contacts the light-emitting functional layer, therefore, the light emitted by the light-emitting functional layer to the array substrate side is close to the edge of the reflection electrode, and hence the reflection electrode may be set to extend a certain distance outwardly to block the light emitted by the light-emitting functional layer from directly irradiating on the fingerprint identification unit, and when the reflection electrode extends outwardly to a certain degree, the stray light irradiating on the fingerprint identification unit can be totally blocked, and hence the precision of fingerprint identification can be greatly improved.

In one embodiment, referring to FIG. 16B and FIG. 16C, when fingerprint identification is performed using the light emitted by the organic light-emitting structure, the ratio of the area of the first electrode 111 of the organic light-emitting structure 11 functioning as the light source of the fingerprint identification unit to the area of the light-emitting layer 113 is in a range of 1.2 to 6, and the ratio of the area of the first electrode 111 of the organic light-emitting structure 11 that does not function as the light source of the fingerprint identification unit 21 to the area of the light-emitting layer 113 is in a range of 1 to 1.2. Exemplarily, referring to 16B and FIG. 16C, the red organic light-emitting structure 101 and the green organic light-emitting structure 102 function as the light source of the fingerprint identification unit, and the light-tight region 311 in FIG. 16B is the vertical projection of the first electrode 111 of the organic light-emitting structure 11 on the array substrate 10. It may be seen that, compared with the ratio of the area of the light-tight region 311 in the blue organic light-emitting structure 103 to the area of the light-emitting layer 113, the ratio of the area of the light-tight region 311 in the red organic light-emitting structure 101 and the green organic light-emitting structure 102 (the area of the first electrode) to the area of the light-emitting layer 113 is larger, and when the ratio of the area of the first electrode of the organic light-emitting structure functioning as the light source of the fingerprint identification unit to the area of the light-emitting functional layer is set in a range of 1.2 to 6, the first electrode can effectively prevent the light emitted by the light-emitting functional layer from directly irradiating on the fingerprint identification unit, that is, stray light can be effectively prevented, the noise during fingerprint detection can be reduced, and the precision of fingerprint identification can be improved. It may be understood that, the larger the ratio of the area of the first electrode of the organic light-emitting structure functioning as the light source of the fingerprint identification unit to the area of the light-emitting functional layer is, the more effectively the first electrode blocks the stray light; when the ratio of the area of the first electrode of the organic light-emitting structure functioning as the light source of the fingerprint identification unit to the area of the light-emitting functional layer is 6, the first electrode can just block most of the stray light, and the precision of fingerprint identification can be greatly improved.

Figure 16D:
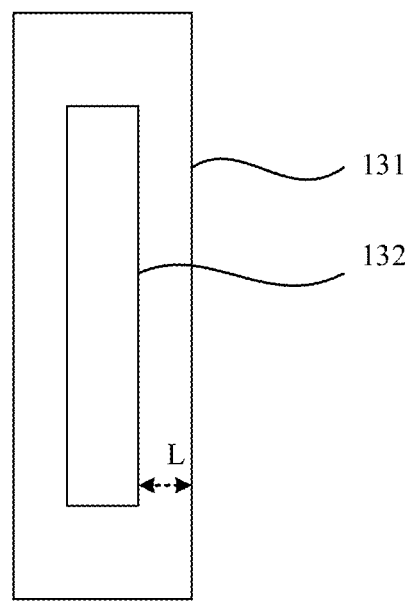
FIG. 16D is a schematic diagram showing the range of distance between a first enclosed coil and a second enclosed coil.

In one embodiment, referring to FIG. 16C to FIG. 16D, when fingerprint identification is performed using the light emitted by the organic light-emitting structure, the vertical projection of the edge of the first electrode 111 of the organic light-emitting structure 11 functioning as the light source of the fingerprint identification unit 21 on the array substrate 10 forms a first enclosed coil 131, and the vertical projection of the edge of the light-emitting layer 113 on the array substrate 10 forms a second enclosed coil 132. FIG. 16D is a schematic diagram showing the range of distance between a first enclosed coil and a second enclosed coil. Referring to FIG. 16D, the first enclosed coil 131 surrounds the second enclosed coil 132. For each point on the first enclosed coil 131, it is necessarily to have a shortest distance L between the point and a corresponding point on the second enclosed coil 132. The range of distance between the first enclosed coil 131 and the second enclosed coil 132 represents a set of shortest distances L corresponding to all the points on the first enclosed coil 131. The range of distance between the first enclosed coil 131 and the second enclosed coil 132 is 3 μm to 30 μm. The range of distance between the first enclosed coil 131 and the second enclosed coil 132 represents the extension degree of the first electrode in any direction in the plane of the first electrode, and when the range of distance between the first enclosed coil 131 and the second enclosed coil 132 is 3 μm to 30 μm, stray light can be effectively prevented by the first electrode, thereby improving the precision of fingerprint identification.

Figure 16E:
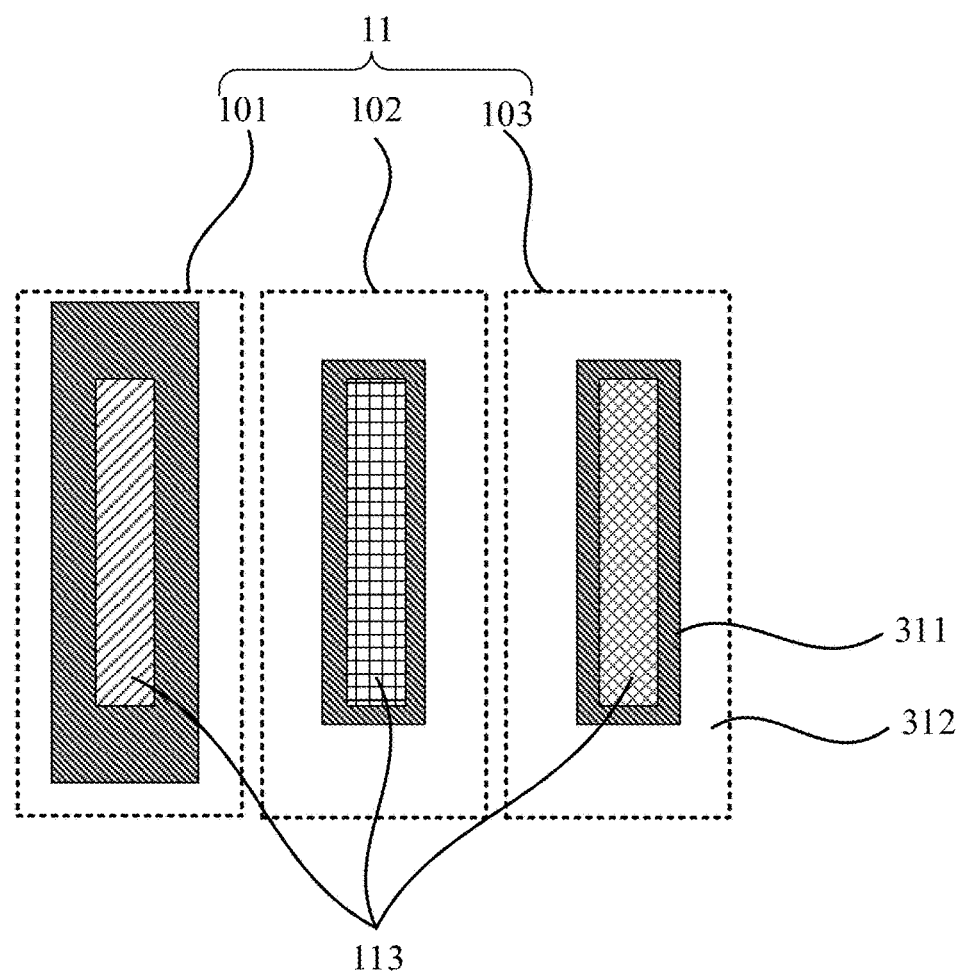
FIG. 16E is a close-up view of another region S1 according to an embodiment of the disclosure.

FIG. 16E is a close-up view of another region S1 according to an embodiment of the disclosure. As shown in FIG. 16E, when fingerprint identification is performed using the light emitted by the organic light-emitting structure, the light transmission area of the red organic light-emitting structure 101 functioning as the light source of the fingerprint identification unit towards the emergent light side departing from the display panel is less than the light transmission area of the blue organic light-emitting structure 103 towards the emergent light side departing from the display panel, and the light transmission area of the red organic light-emitting structure 101 functioning as the light source of the fingerprint identification unit towards the emergent light side departing from the display panel is less than the light transmission area of the green organic light-emitting structure 102 towards the emergent light side departing from the display panel. Because only the red light-emitting structure functions as the light source during fingerprint identification, the light emitted by the light-emitting functional layer in the red organic light-emitting structure towards the emergent light side departing from the display panel is only needed to be blocked. For example, it only needs to extend the first electrode in the red organic light-emitting structure outwardly without the additional arrangement for the green organic light-emitting structure and the blue organic light-emitting structure. Since the light transmission areas of the green organic light-emitting structure and the blue organic light-emitting structure are both larger than that of the red organic light-emitting structure functioning as the light source, such an arrangement can ensure both the precision of fingerprint identification and the adequate light transmission area to pass the signal light reflected by the touch body (for example, a finger) so as to improve the intensity of the signal light detected on the fingerprint identification unit. Additionally, the intensity of the emergent light from the light source may also be increased by appropriately increasing the working voltage of the red organic light-emitting unit, thereby improving the intensity of the signal light detected on the fingerprint identification unit. In other embodiments, it is possible that only the green organic light-emitting structure is taken as the light source during fingerprint identification. In this case, the light transmission area of the green organic light-emitting structure towards the emergent light side departing from the display panel is less than the light transmission area of the blue organic light-emitting structure towards the emergent light side departing from the display panel, and the light transmission area of the green organic light-emitting structure towards the emergent light side departing from the display panel is less than the light transmission area of the red organic light-emitting structure towards the emergent light side departing from the display panel.

Figure 17:
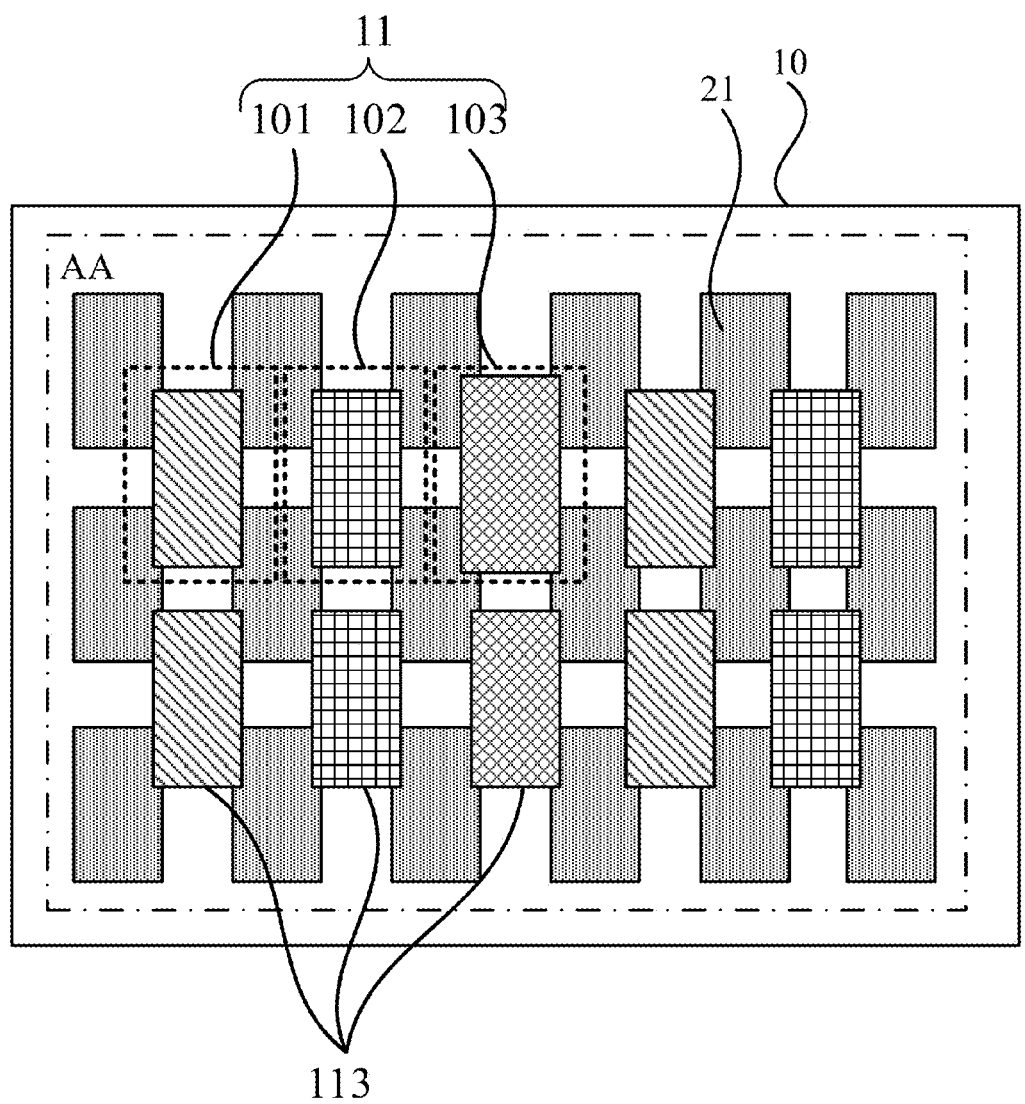
FIG. 17 is a top view showing the structure of another display panel according to an embodiment of the disclosure.

FIG. 17 is a top view showing the structure of another display panel according to an embodiment of the disclosure. In one embodiment, as shown in FIG. 17, when fingerprint identification is performed using the light emitted by the organic light-emitting structure 11, the area of the light-emitting layer of the blue organic light-emitting structure 103 is larger than the area of the light-emitting layer of the red organic light-emitting structure 101, and the area of the light-emitting layer of the blue organic light-emitting structure 103 is larger than the area of the light-emitting layer of the green organic light-emitting structure 102. Because the material of the light-emitting layer of the blue organic light-emitting structure has a shorter lifetime than the material of the light-emitting layer in the red organic light emitting mechanism and the blue organic light-emitting structure, the area of the light-emitting layer in the blue organic light-emitting structure is made larger, and hence the light-emitting layer of the blue organic light-emitting structure may work at a low voltage, for example, the working voltage of the light-emitting layer in the red organic light-emitting structure and the green organic light-emitting structure may be set as 3V, and the working voltage of the light-emitting layer in the blue organic light-emitting structure may be set as 2V, so that the working life thereof may be prolonged in order to attain a life balance among the red organic light-emitting structure, the green organic light-emitting structure and the blue organic light-emitting structure, thereby improving the working life of the whole display panel.

Figure 18:
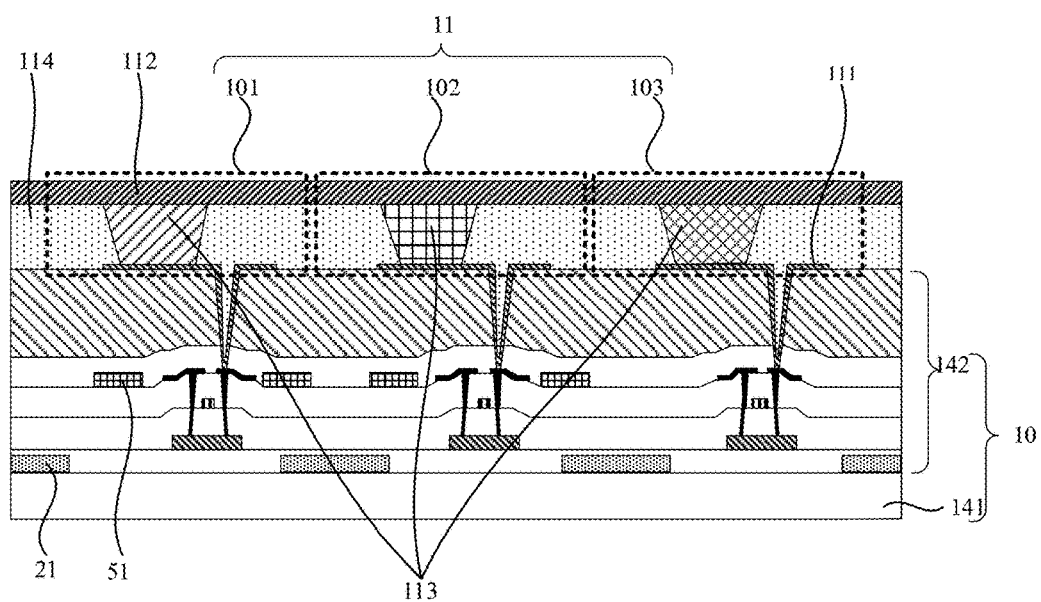
FIG. 18 is a schematic sectional view of another display panel according to an embodiment of the disclosure.

FIG. 18 is a schematic sectional view of another display panel according to an embodiment of the disclosure. In one embodiment, referring to FIG. 18, when fingerprint identification is performed using the light emitted by the organic light-emitting structure 11, the array substrate 10 further includes a plurality of light-blocking pads 51, the light-blocking pads 51 are located between the organic light-emitting structure 11 functioning as the light source of the fingerprint identification unit 21 and the fingerprint identification unit 21, each of the organic light-emitting structures 11 successively includes a first electrode 111, a light-emitting layer 113 and a second electrode 112 along the direction in which the organic light-emitting structure 11 departs from the array substrate 10. The first electrode 111 is provided as a reflection electrode, the area of the combined vertical projection of the first electrode 111 of the organic light-emitting structure 11 functioning as the light source of the fingerprint identification unit 21 and the light-blocking pads 51 on the array substrate 10 is larger than the area of the vertical projection, on the array substrate 10, of the first electrode 111 of the organic light-emitting structure 11 that does not function as the light source of the fingerprint identification unit 21. The combined vertical projection of the first electrode 111 and the light-blocking pads 51 on the array substrate 10 is a union set of the vertical projection of the first electrode 111 on the array substrate 10 and the vertical projection of the light-blocking pads 51 on the array substrate 10. Specifically, if A and B are both sets, a union set of A and B refers to a set including all the elements in A and all the elements in B, rather than including other elements.

In one embodiment, referring to FIG. 18, the vertical projection of the edge of the first electrode 111 of the organic light-emitting structure 11 functioning as the light source of the fingerprint identification unit 21 on the array substrate 10 is located within the vertical projection of the light-blocking pads 51 on the array substrate 10. Such an arrangement has an effect in that the reflection electrode is extended outwardly. That is, compared to the prior art, the area of the reflection electrode in the red organic light-emitting structure 101 and/or the green organic light-emitting structure 102 is increased under the condition that the area of the reflection electrode in the blue organic light-emitting structure 103 is constant, so that the stray light can be blocked. In the embodiments of the disclosure, the stray light can be effectively prevented from irradiating on the fingerprint identification unit.

In one embodiment, referring to FIG. 18, the array substrate 10 includes a second substrate 141 and a plurality of pixel drive circuits 142 on the second substrate 141. The pixel drive circuit 142 includes a data line, a scanning line and a capacitor metal plate (not shown in FIG. 18), the light-blocking pads 51 are provided on the same layer as the data line, the scanning line or the capacitor metal plate, and hence the technical process may be saved. No additional metal layer is needed for the display panel to manufacture the light-blocking pad, thereby improving the manufacture efficiency, and saving the production cost.

The light-blocking pad 51 may be made of a metal material or a non-metal material that has a light-blocking action. In the embodiments of the disclosure, the light-blocking pad is configured to prevent the stray light from irradiating on the fingerprint identification unit in order to improve the precision of fingerprint identification. It should be noted that, the solutions in the above embodiments may be combined with each other to improve the precision of fingerprint identification, for example, the reflection electrode of the organic light-emitting structure functioning as a light source may be extended outwardly, and under this situation, the pixel drive circuit is designed to block a part of the stray light. The reflection electrode of the organic light-emitting structure functioning as a light source may be extended outwardly, and under this situation, the light-blocking pad may be set to block a part of the stray light. The light-blocking pad may be set to block a part of the stray light, and under this situation, the pixel drive circuit is designed to block a part of the stray light. Also, the reflection electrode of the organic light-emitting structure functioning as a light source may be extended outwardly to allow the pixel drive circuit to block a part of the stray light, and under this situation, the light-blocking pad may be set to block a part of the stray light.

Embodiments of the disclosure further provide a display panel, including: a display module, which includes an array substrate and a sheet polarizer on the array substrate, and the emergent light side of the display module is located on one side of the sheet polarizer that is facing away from array substrate; a fingerprint identification module, which is located on one side of the array substrate that is facing away from the sheet polarizer and includes a fingerprint identification unit and a second sheet polarizer located on one side of the fingerprint identification unit that is adjacent to the display module; a light source, which is located on one side of the sheet polarizer that is facing away from the emergent light side of the display module; the fingerprint identification unit is configured to perform fingerprint identification according to the fingerprint signal light reflected to the fingerprint identification unit via a touch body, which is formed from the light emitted by a light source. The sheet polarizer cooperates with the second sheet polarizer to make the fingerprint signal light pass through the sheet polarizer and the second sheet polarizer without loss of light intensity; the second sheet polarizer is configured to alleviate the light intensity of the fingerprint noise light. The fingerprint noise light refers to the light other than the fingerprint signal light.

In the embodiments of the disclosure, a sheet polarizer is provided on one side of the array substrate that is adjacent to the emergent light side of the display module, the fingerprint identification module is provided on one side of the array substrate that is facing away from the sheet polarizer, and the fingerprint identification module has a fingerprint identification unit and a second sheet polarizer located on one side of the fingerprint identification unit that is adjacent to the display module. In the fingerprint identification stage, the light emitted by the light source on one side of the sheet polarizer that is facing away from the emergent light side of the display module is reflected by a touch body on a touch display screen to form a fingerprint signal light. At this time, the sheet polarizer cooperates with the second sheet polarizer to make the fingerprint signal light pass through the sheet polarizer and the second sheet polarizer without loss of light intensity. Furthermore, before the light that is not reflected by the touch body (that is, the fingerprint noise light) reaches the fingerprint identification unit, the second sheet polarizer may at least alleviate the light intensity of the fingerprint noise light, thus improving the interference on the fingerprint noise light to increase the signal-to-noise ratio, and improving the precision of fingerprint identification of the fingerprint identification module.

In the embodiments of the disclosure, the fingerprint noise light may include the light leaked from the organic light-emitting structure in the display module towards one side of the fingerprint identification module and/or the light reflected by the metal (for example, the gate electrode, the source electrode and the drain electrode and the metal wiring of the thin-film transistor) in the display module, which is initially emitted by an external add-on light source.

For the light leaked from the light-emitting structure in the display module towards one side of the fingerprint identification module, the second sheet polarizer may be a linear sheet polarizer or a circular sheet polarizer, and the light intensity of such the fingerprint noise light may be reduce by one half; for the light reflected by the metal in the display module, the second sheet polarizer may be a circular sheet polarizer, and such the fingerprint noise light may be totally eliminated. In one embodiment, when the second sheet polarizer is a linear sheet polarizer, the sheet polarizer should be provided as a linear sheet polarizer with a polarization direction consistent with the second sheet polarizer, in order to make the fingerprint signal light pass through the sheet polarizer and the second sheet polarizer without loss of light intensity; when the second sheet polarizer is a circular sheet polarizer, the sheet polarizer should be provided as a circular sheet polarizer matching the second sheet polarizer, in order to make the fingerprint signal light pass through the sheet polarizer and the second sheet polarizer without loss of light intensity.

Figure 19:
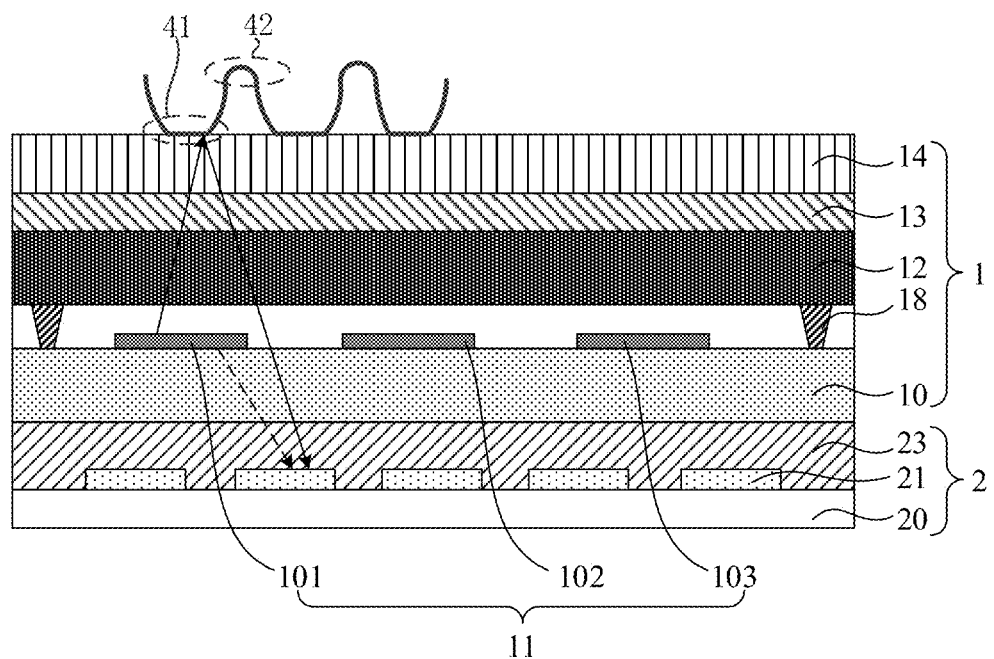
FIG. 19 is a schematic sectional view of another display panel according to an embodiment of the disclosure.

Exemplarily, FIG. 19 is a schematic sectional view of another display panel according to an embodiment of the disclosure. As shown in FIG. 19, the display panel of this embodiment includes a display module 1 and a fingerprint identification module 2. The display module 1 includes an array substrate 10 and a sheet polarizer 13 on the array substrate 10, the emergent light side of the display module 1 (the emergent light side) is located on one side of the sheet polarizer 13 that is facing away from the array substrate 10; the fingerprint identification module 2 is located on one side of the array substrate 10 that is facing away from the sheet polarizer 13 and includes a fingerprint identification unit 21 and a second sheet polarizer 23 located on one side of the fingerprint identification unit 21 that is adjacent to the display module 1, the fingerprint identification unit 21 is configured to perform fingerprint identification according to the fingerprint signal light reflected by the touch body to the fingerprint identification unit 21, which formed from the light emitted by the light source; the display module 1 further includes an organic light-emitting structure 11 that is located between the array substrate 10 and the sheet polarizer 13 and configured to generate light for displaying an image. In one embodiment, as shown in FIG. 19, the organic light-emitting structure 11 may include a red organic light-emitting structure 101, a green organic light-emitting structure 102 and a blue organic light-emitting structure 103.

In one embodiment, fingerprint identification may be performed using the light emitted by the organic light-emitting structure 11. Exemplarily, a plurality of organic light-emitting structures 11 and a plurality of fingerprint identification units 21 may be both arranged in an array, the fingerprint identification units 21 may be provided corresponding to the organic light-emitting structures 11, multiple of fingerprint signal lights generated by one organic light-emitting structure 11 functioning as the light source may be received by one or more fingerprint identification units 21 corresponding to the organic light-emitting structure 11.

In consideration that the above organic light-emitting structure 11 may not only function as the light source for image display but also function as the light source for fingerprint identification, the organic light-emitting structure 11 needs to emit light no matter in the display stage or in the fingerprint identification stage Or, in the display stage, a light-emitting drive signal is input into the organic light-emitting structure 11; and in the fingerprint identification stage, a light-emitting drive signal is input to a part of the organic light-emitting structures 11. Therefore, based on the above solution, the display module 1 of this embodiment further includes a first display drive circuit (not shown), which is configured to output in the fingerprint identification stage a drive signal for driving at least a part of the organic light-emitting structures 11 to emit light, so as to provide a light source for the fingerprint identification module 2.

Exemplarily, in consideration that the wavelength of the light emitted by the blue organic light-emitting structure is short and each film layer in the display panel (for example, an organic insulating layer, an inorganic insulating layer and a sheet polarizer, etc.) has a strong absorption on light with a short wavelength, the light emitted by the blue organic light-emitting structure has a low light transmittance, so as to be easily absorbed by the touch display panel. Moreover, the material of the light-emitting layer of the blue organic light-emitting structure has a shorter lifetime than the material of the light-emitting layer in the red organic light-emitting structure and the blue organic light-emitting structure, so that in the fingerprint identification stage, the first display drive circuit may output a drive signal for driving the red organic light-emitting structure and/or the green organic light-emitting structure to emit light. In one embodiment, the display panel of this embodiment may also include a touch functional layer, and the structure and location of the touch functional layer are not limited here, so long as the location at which the screen is touched can be detected. After the location at which a finger touches the screen is detected, in the fingerprint identification stage, the first display drive circuit may output a drive signal to drive the organic light-emitting structure in the region to emit light, which corresponds to the location at which the finger touches the screen.

In one embodiment, the sheet polarizer 13 of this embodiment may include a first linear sheet polarizer, and the second sheet polarizer 23 may include a second linear sheet polarizer, wherein the polarization direction of the first linear sheet polarizer is consistent with that of the second linear sheet polarizer.

As shown in FIG. 19, the solid line represents the light emitted by the organic light-emitting structure 11 towards the emergent light side and the fingerprint signal light formed after being reflected by the touch body, and the dashed line represents the light leaked by the organic light-emitting structure 11 towards the fingerprint identification module 2. For example, the organic light-emitting structure 11 may be a red organic light-emitting structure 101, by which the light is emitted is first converted into linearly-polarized light via the sheet polarizer 13. The linearly-polarized light is remained to linearly-polarized light after being reflected by the touch body (and at this time, it is provided as the fingerprint signal light), and the polarization direction keeps constant. The light may pass through the sheet polarizer 13 again without loss of light intensity. When the fingerprint signal light passes through the second sheet polarizer 23, because the polarization direction of the second sheet polarizer 23 is consistent with that of the sheet polarizer 13, the fingerprint signal light may pass through the second sheet polarizer 23 without loss of light intensity to reach the fingerprint identification unit 21. However, the light leaked by the red organic light-emitting structure 101 is light distributed uniformly in different polarization directions, and after passing through the second sheet polarizer 23, it is converted into the light with only one polarization direction, and also the light intensity thereof will be lost by one half, so that when the light leaked by the organic light-emitting unit reaches the fingerprint identification unit 21, the light intensity will be reduced greatly. In conclusion, in the case that the light intensity of the fingerprint signal light is kept constant, the light intensity of the fingerprint noise light is alleviated relatively, thereby improving the signal-to-noise ratio of the fingerprint identification module 2, and further improving the precision of fingerprint identification of the fingerprint identification module 2.

In one embodiment, the display panel of this embodiment is a rigid display panel. Specifically, as shown in FIG. 19, the array substrate 10 is a first glass substrate, and the display module 1 further includes an encapsulation layer 12, and the encapsulation layer 12 may also employ a glass substrate; the organic light-emitting structure 11 is located between the first glass substrate 10 and the encapsulation layer 12, the first glass substrate 10 and the encapsulation layer 12 are supported by a support column 18, and an air gap exists between the first glass substrate 10 and the encapsulation layer 12. In one embodiment, the thickness of the air gap is 4 µm. The display panel further includes a cover glass 14, the cover glass 14 may be adhered via a liquid optical adhesive to the surface on one side of the sheet polarizer 13 that is facing away from the organic light-emitting structure 11.

In one embodiment, the thickness of the display module is 1410 µm. In this embodiment, the fingerprint identification module 2 further includes a first substrate 20, and the fingerprint identification unit 21 is provided on the surface on one side of the first substrate 20 that is adjacent to the display module 1, whereas the fingerprint identification unit 21 may be directly manufactured on the first substrate 20, which not only is convenient for the arrangement of the fingerprint identification unit 21, but also can protect the fingerprint identification unit 21 via the first substrate 20. Additionally, the second sheet polarizer 23 may be adhered to the array substrate 10 via an optical adhesive layer (not shown) to apply the display module 1 to the fingerprint identification module 2 and form a display panel.

Additionally, the sheet polarizer 13 in embodiment of the disclosure may include a first quarter wave plate and a third linear sheet polarizer that are laminated, wherein the first quarter wave plate is located on one side of the third linear sheet polarizer that is adjacent to the organic light-emitting structure 11. The second sheet polarizer 23 may include a second quarter wave plate and a fourth linear sheet polarizer that are laminated, wherein the second quarter wave plate is located on one side of the fourth linear sheet polarizer that is adjacent to the organic light-emitting structure 11, and the first quarter wave plate may have the same material of and thickness as those of the second quarter wave plate.

From the side facing to the transmission direction of the fingerprint signal light and in the configuration that the counterclockwise direction is taken as the positive direction, an included angle between the optical axis direction of the first quarter wave plate and the polarization direction of the third linear sheet polarizer is 45°, and an included angle between the optical axis direction of the second quarter wave plate and the polarization direction of the fourth linear sheet polarizer is −45°; or, an included angle between the optical axis direction of the first quarter wave plate and the polarization direction of the third linear sheet polarizer is −45°, and an included angle between the optical axis direction of the second quarter wave plate and the polarization direction of the fourth linear sheet polarizer is 45°. Thereby, the sheet polarizer 13 and the second sheet polarizer 23 are both circular sheet polarizers.

Figure 20A:
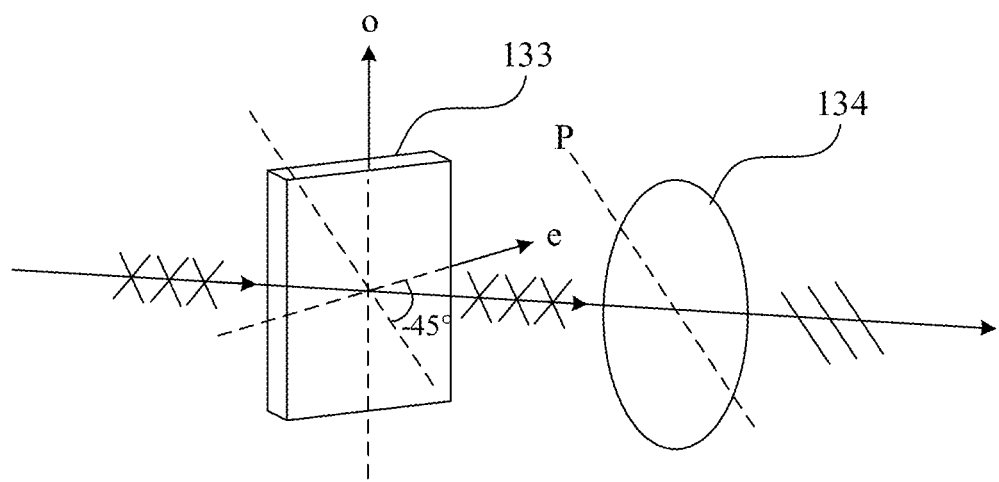
FIG. 20A is a schematic optical path diagram of the light emitted by an organic light-emitting structure according to an embodiment of the disclosure before being reflected by a touch body.
Figure 20B:
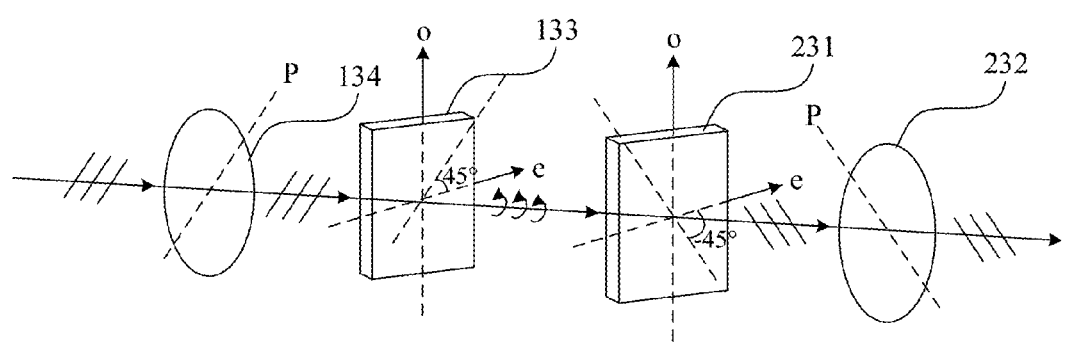
FIG. 20B is a schematic optical path diagram of the light emitted by an organic light-emitting structure according to an embodiment of the disclosure after being reflected by a touch body.

Exemplarily, illustration will be given by an example in which the side is facing to the transmission direction of the fingerprint signal light, the counterclockwise direction is taken as the positive direction, an included angle between the optical axis direction of the first quarter wave plate and the polarization direction of the third linear sheet polarizer is 45° and an included angle between the optical axis direction of the second quarter wave plate and the polarization direction of the fourth linear sheet polarizer is −45°. The material of the first quarter wave plate and the second quarter wave plate is both calcite, and the e axis of the first quarter wave plate and the second quarter wave plate is regarded as the optical axis. Still referring to FIG. 19, in the fingerprint identification stage, as shown in FIG. 20A, before the light emitted by the organic light-emitting structure 11 is reflected by a touch body, from the side facing to the transmission direction of the light and in the configuration that the counterclockwise direction is taken as the positive direction, an included angle between the e axis direction of the first quarter wave plate 133 and the polarization direction P of the third sheet polarizer 134 is −45°. The natural light emitted by the organic light-emitting structure 11 is still natural light after passing through the first quarter wave plate 133, and next, the natural light, after passing through the third sheet polarizer 134, is converted into a linearly-polarized light of which the polarization direction is the same as the polarization direction P of the third sheet polarizer 134 and located in the second and the fourth quadrants. Referring to FIG. 20B, after being reflected by the touch body, the linearly-polarized light forms the fingerprint signal light which is still linearly-polarized light with the same polarization direction. However, from the side facing to the transmission direction of the fingerprint signal light, an included angle between the e axis direction of the first quarter wave plate 133 and the polarization direction of the third sheet polarizer 134 is 45°, and the fingerprint signal light is linearly-polarized light with a polarization direction in the first and the third quadrants. When passing through the third sheet polarizer 134 again, the polarization state and the light intensity of the fingerprint signal light are kept constant, and when passing through the first quarter wave plate 133, the fingerprint signal light is converted into left-hand circularly-polarized light and the light intensity thereof is kept constant. When passing through the second quarter wave plate 231, the left-hand circularly-polarized light is converted into linearly-polarized light with a polarization direction located in the second and the fourth quadrants and the light intensity thereof is kept constant. Finally the linearly-polarized light passes through the fourth linear sheet polarizer 232 of which a polarization direction is parallel with that of the linearly-polarized light, and linearly-polarized light with the same light intensity is output.

Figure 21:
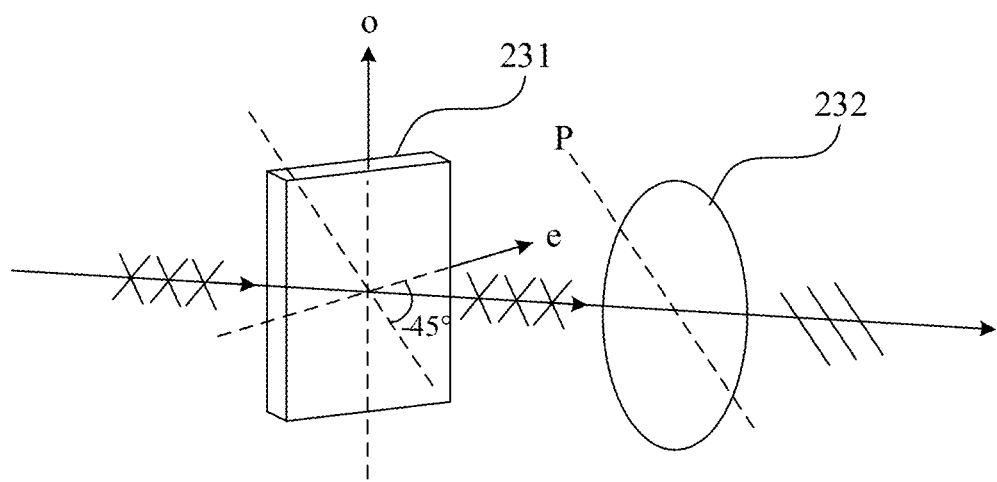
FIG. 21 is a schematic optical path diagram of the fingerprint noise light emitted by an organic light-emitting structure according to an embodiment of the disclosure.

Referring to FIG. 21, the fingerprint noise light emitted by the organic light-emitting structure directly enters the second sheet polarizer, and from the side facing to the transmission direction of the fingerprint noise light, an included angle between the e axis direction of the second quarter wave plate 231 and the polarization direction P of the fourth linear sheet polarizer 232 is −45°. After passing through the second quarter wave plate 231, the fingerprint noise light is still natural light, and after passing through the fourth linear sheet polarizer 232, the natural light is converted into linearly-polarized light located in the second and the fourth quadrants of which a polarization direction is the same as the polarization direction P of the fourth linear sheet polarizer 232, but the light intensity is lost by one half. Therefore, the second sheet polarizer may reduce the light intensity of the fingerprint noise light to improve the signal-to-noise ratio.

Figure 22:
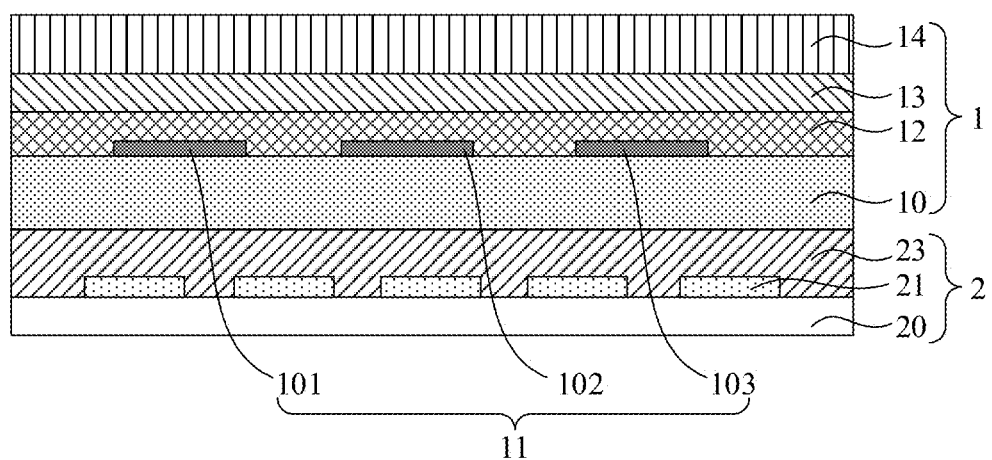
FIG. 22 is a schematic sectional view of another display panel according to an embodiment of the disclosure.

FIG. 22 is a schematic sectional view of another display panel according to an embodiment of the disclosure. The display panel may be a flexible display panel. Specifically, as shown in FIG. 22, the array substrate 10 is a flexible substrate, and the display module 1 further includes an encapsulation layer 12, for example, it may be a thin-film encapsulation layer to replace the second glass substrate in the above embodiments. The thin-film encapsulation layer 12 covers the organic light-emitting structure 11.

Figure 23:
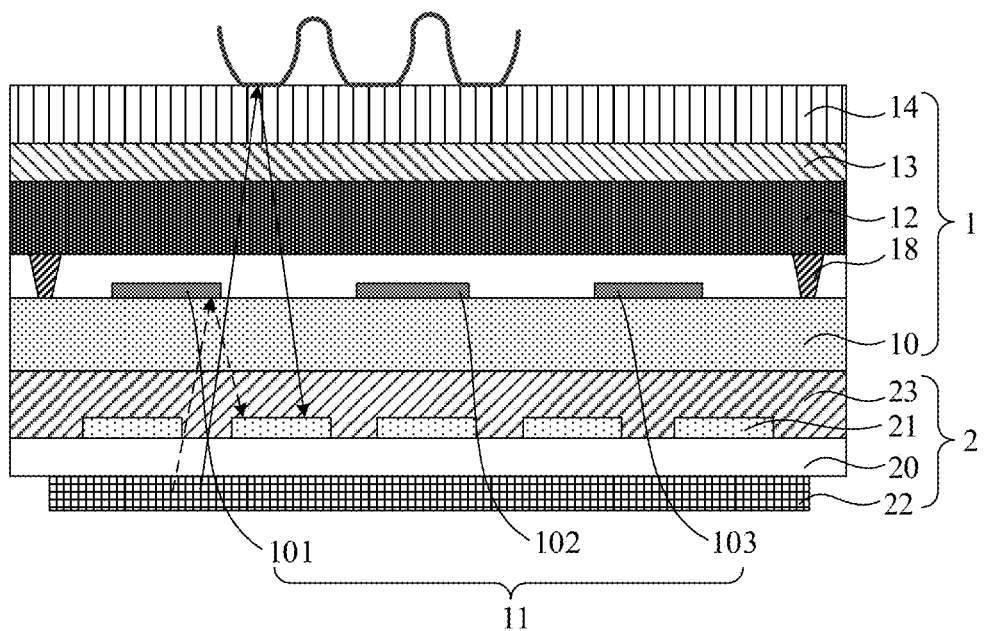
FIG. 23 is a schematic sectional view of another display panel according to an embodiment of the disclosure.

FIG. 23 is a schematic sectional view of another display panel according to an embodiment of the disclosure. As shown in FIG. 23, the display panel of this embodiment may include: a display module 1, which includes an array substrate 10 and a sheet polarizer 13 on the array substrate 10, and the emergent light side of the display module 1 is located on one side of the sheet polarizer 13 that is facing away from the array substrate 10; an organic light-emitting structure 11, which is located between the array substrate 10 and the sheet polarizer 13 and configured to generate light for displaying an image; a fingerprint identification module 2, which is located on one side of the array substrate 10 that is facing away from the sheet polarizer 13 and includes a fingerprint identification unit 21 and a second sheet polarizer 23 located on one side of the fingerprint identification unit 21 that is adjacent to the display module 1, wherein the fingerprint identification unit 21 is configured to perform fingerprint identification according to the fingerprint signal light reflected by the touch body to the fingerprint identification unit 21 which is formed from the light emitted by the light source; a fingerprint identification light source 22, which is located on one side of the fingerprint identification module 2 that is facing away from the display module 1. The fingerprint identification light source 22 functions as the light source of the fingerprint identification module 2.

In consideration that the above organic light-emitting structure 11 is configured to generate light for displaying an image, the fingerprint identification light source 22 may be employed as the light source of the fingerprint identification module 2, and in the display stage, the fingerprint identification light source 22 does not emit light, so that the display effect is not affected; in the fingerprint identification stage, the organic light-emitting structure 11 should not emit light, and thus the light leaked by the organic light-emitting structure 11 may be avoided, and the interference on fingerprint identification caused by such the light emitted and reflected by the touch body to the fingerprint identification unit 21 may be avoided. Therefore, based on the above solution, the display module 1 of this embodiment further includes a second display drive circuit (not shown), which is configured in the fingerprint identification stage not to output a display drive signal that drives the organic light-emitting structure to emit light, and also in the display stage not to output a detection drive signal that drives the fingerprint identification light source to emit light.

In one embodiment, the sheet polarizer 13 of this embodiment may include a first quarter wave plate and a third linear sheet polarizer that are laminated, and the first quarter wave plate is located on one side of the third linear sheet polarizer that is adjacent to the organic light-emitting structure 11; the second sheet polarizer 23 may include a second quarter wave plate and a fourth linear sheet polarizer that are laminated, and the second quarter wave plate is located on one side of the fourth linear sheet polarizer that is adjacent to the organic light-emitting structure 11. The material and thickness of the first quarter wave plate are the same as those of the second quarter wave plate.

From the side facing to the transmission direction of the fingerprint signal light and in the configuration that the counterclockwise direction is taken as the positive direction, an included angle between the optical axis direction of the first quarter wave plate and the polarization direction of the third linear sheet polarizer is 45°, and an included angle between the optical axis direction of the second quarter wave plate and the polarization direction of the fourth linear sheet polarizer is −45°; or, an included angle between the optical axis direction of the first quarter wave plate and the polarization direction of the third linear sheet polarizer is −45°, and an included angle between the optical axis direction of the second quarter wave plate and the polarization direction of the fourth linear sheet polarizer is 45°.

Exemplarily, illustration will be given by an example in which the side is facing to the transmission direction of the fingerprint signal light, the counterclockwise direction is taken as the positive direction, an included angle between the optical axis direction of the first quarter wave plate and the polarization direction of the third linear sheet polarizer is 45° and an included angle between the optical axis direction of the second quarter wave plate and the polarization direction of the fourth linear sheet polarizer is −45°. The material of the first quarter wave plate and the second quarter wave plate is both calcite, and the e axis of the first quarter wave plate and the second quarter wave plate is regarded as the optical axis. Still referring to FIG. 23, the solid line represents the light emitted by the fingerprint identification light source 22 towards the emergent light side and the light of the fingerprint signal light formed after being reflected by the touch body, and the dashed line represents the light emitted by the fingerprint identification light source 22 and reflected by the metal in the display module 1.

Figure 24A:
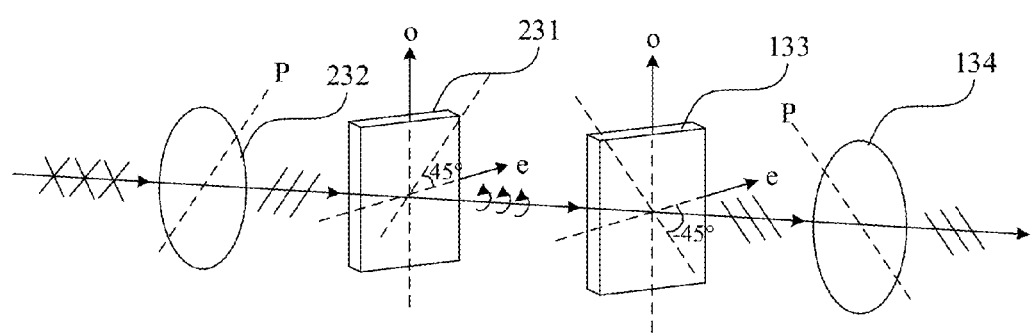
FIG. 24A is a schematic optical path diagram of the light emitted by a backlight source according to an embodiment of the disclosure before being reflected by a touch body.
Figure 24B:
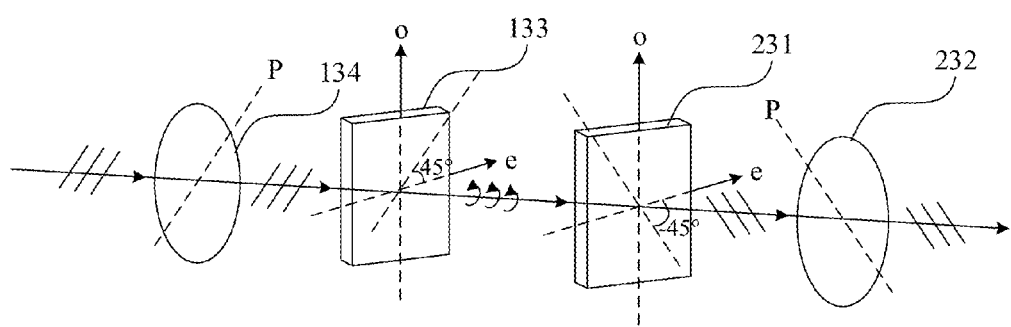
FIG. 24B is a schematic optical path diagram of the light emitted by a backlight source according to an embodiment of the disclosure after being reflected by a touch body.

In the fingerprint identification stage, referring to FIG. 24A, before the light emitted by the fingerprint identification light source 22 is reflected by a touch body, from the side facing the transmission direction of the light and in the configuration that the counterclockwise direction is taken as the positive direction, an included angle between the e axis direction of the first quarter wave plate 133 and the polarization direction P of the third sheet polarizer 134 is −45°, and an included angle between the e axis direction of the second quarter wave plate 231 and the polarization direction of the fourth linear sheet polarizer 232 is 45°. After passing through the fourth linear sheet polarizer 232, the natural light emitted by the fingerprint identification light source 22 is converted into linearly-polarized light with a polarization direction in the first and the third quadrants, and after passing through the second quarter wave plate 231, it is converted into left-hand circularly-polarized light, and after passing through the first quarter wave plate 133, it is converted into linearly-polarized light with a polarization direction in the second and the fourth quadrants and the polarization direction thereof is parallel with the polarization direction of the third sheet polarizer 134, and hence the polarization state is kept constant when passing through the third sheet polarizer 134. Referring to FIG. 24B, after being reflected by the touch body, the linearly-polarized light forms the fingerprint signal light that is still linearly-polarized light with the same polarization direction. However, from the side facing to the transmission direction of the fingerprint signal light, the fingerprint signal light is linearly-polarized light with a polarization direction in the first and the third quadrants. When passing through the third sheet polarizer 134 again, the polarization state and the light intensity of the fingerprint signal light are kept constant, and when passing through the first quarter wave plate 133, the fingerprint signal light is converted into left-hand circularly-polarized light and the light intensity thereof is kept constant; when passing through the second quarter wave plate 231, the left-hand circularly-polarized light is converted into linearly-polarized light with a polarization direction located in the second and the fourth quadrants and the light intensity thereof is kept constant, and finally it passes through the fourth linear sheet polarizer 232 of which a polarization direction is parallel with that of the linearly-polarized light, and linearly-polarized light with the same light intensity is output.

Figure 25A:
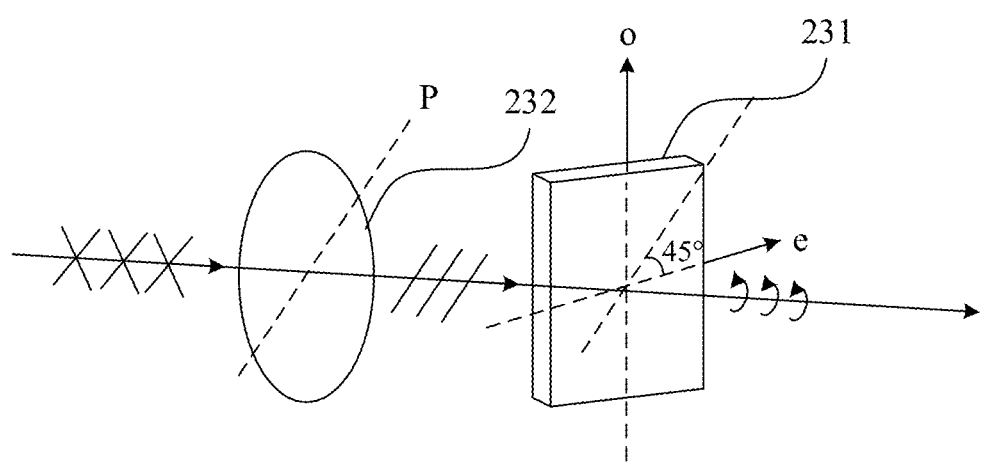
FIG. 25A is a schematic optical path diagram of the fingerprint noise light emitted by a backlight source according to an embodiment of the disclosure before being reflected by a metal.
Figure 25B:
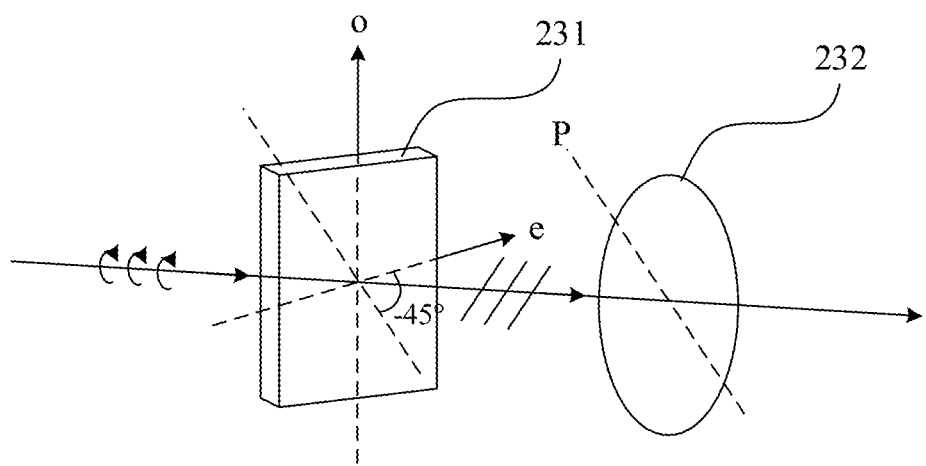
FIG. 25B is a schematic optical path diagram of the fingerprint noise light emitted by a backlight source according to an embodiment of the disclosure after being reflected by a metal.

However, for the fingerprint noise light formed by the light emitted by the fingerprint identification light source after being reflected by a metal, reference may be made to FIG. 25A. After passing through the fourth linear sheet polarizer 232, the natural light emitted by the fingerprint identification light source 22 is converted into linearly-polarized light with a polarization direction in the first and the third quadrants, and after passing through the second quarter wave plate 231, it is converted into left-hand circularly-polarized light, and after being reflected by a metal, the left-hand circularly-polarized light is converted into right-hand circularly-polarized light. Referring to FIG. 25B, after passing through the second quarter wave plate 231 again, the right-hand circularly-polarized light is converted into linearly-polarized light with a polarization direction in the first and the third quadrants and vertical to the polarization direction of the fourth linear sheet polarizer 232, so that the fingerprint noise light cannot pass through the fourth linear sheet polarizer 232 to reach the fingerprint identification unit 21. Therefore, the second sheet polarizer 23 may completely eliminate the fingerprint noise light reflected by the metal in the display module, thereby improving the signal-to-noise ratio.

In one embodiment, the display panel of this embodiment is a rigid display panel. Specifically, as shown in FIG. 23, the array substrate 10 is a first glass substrate, and the display module 1 further includes an encapsulation layer 12; the organic light-emitting structure 11 is located between the first glass substrate 10 and the encapsulation layer 12, the first glass substrate 10 and the encapsulation layer 12 are supported by the support column 18, and an air gap exists between the first glass substrate 10 and the encapsulation layer 12. In one embodiment, the thickness of the air gap is 4p.m. The display panel further includes a cover glass 14, the cover glass 14 may be adhered via a liquid optical adhesive to the surface on one side of the sheet polarizer 13 that is facing away from the organic light-emitting structure. In one embodiment, the thickness of the display module is 1410 µm. In this embodiment, the fingerprint identification module 2 further includes a first substrate 20, the fingerprint identification unit 21 is provided on the surface on one side of the first substrate 20 that is adjacent to the display module 1, and the fingerprint identification light source 22 is provided on the surface on one side of the first substrate 20 that is facing away from the display module 1. Hence, the fingerprint identification unit 21 may be directly manufactured on the first substrate 20, which not only is convenient for the arrangement of the fingerprint identification unit 21, but also can protect the fingerprint identification unit 21 via the first substrate 20. Additionally, the second sheet polarizer 23 may be adhered to the array substrate 10 via an optical adhesive layer (not shown) to apply the display module 1 to the fingerprint identification module 2 and form a display panel.

Figure 26:
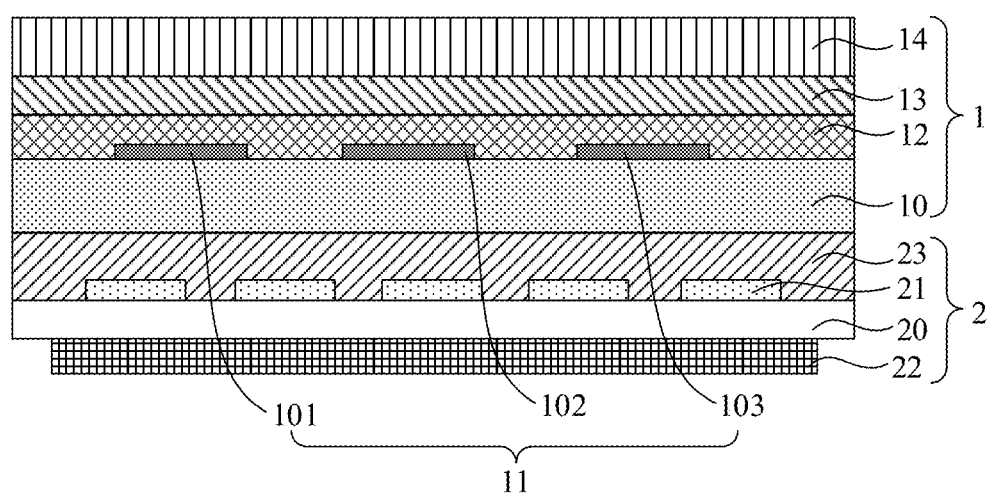
FIG. 26 is a schematic sectional view of another display panel according to an embodiment of the disclosure.

FIG. 26 is a schematic sectional view of another display panel according to an embodiment of the disclosure. The display panel may be a flexible display panel, and the encapsulation layer 12 may be a thin-film encapsulation layer 12 to cover the organic light-emitting structure 11 in place of the second glass substrate in the above embodiments.

It should be noted that, the optical axis direction of the quarter wave plate and the polarization direction of the linear sheet polarizer shown in FIG. 20A, FIG. 24A and FIG. 24B corresponding to the above embodiments are merely used for easily understanding the disclosure, and in the embodiments of the disclosure, the optical axis direction of the first quarter wave plate and the optical axis direction of the second quarter wave plate have no specific relation, and the polarization direction of the third linear sheet polarizer and the polarization direction of the fourth linear sheet polarizer have no specific relation either, so long as the included angle between the optical axis direction of the first quarter wave plate and the polarization direction of the third linear sheet polarizer and the included angle between the optical axis direction of the second quarter wave plate and the polarization direction of the fourth linear sheet polarizer can meet the restrictive conditions in the above embodiments.

Figure 27A:
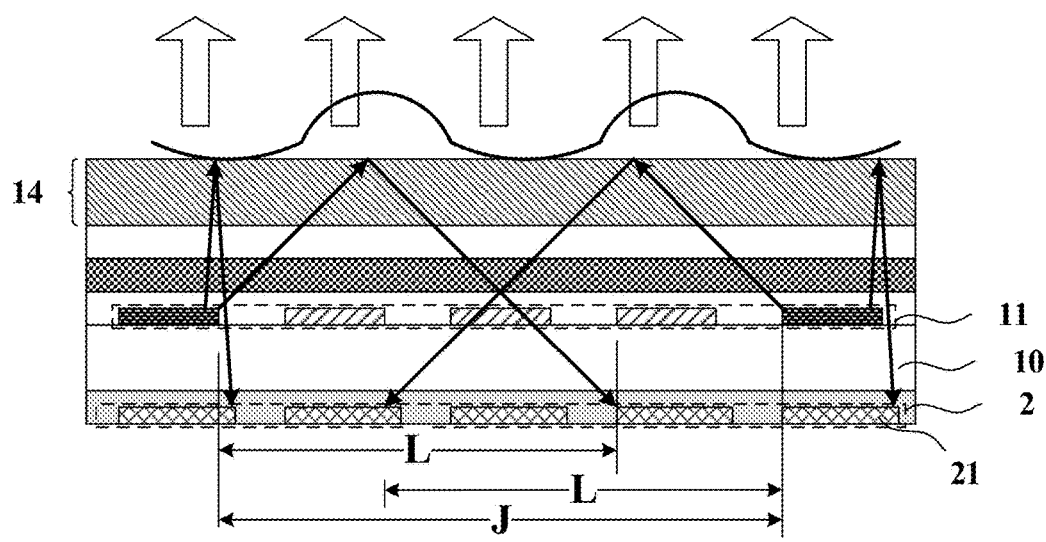
FIG. 27A is a schematic sectional view of a display panel according to an embodiment of the disclosure.
Figure 27B:
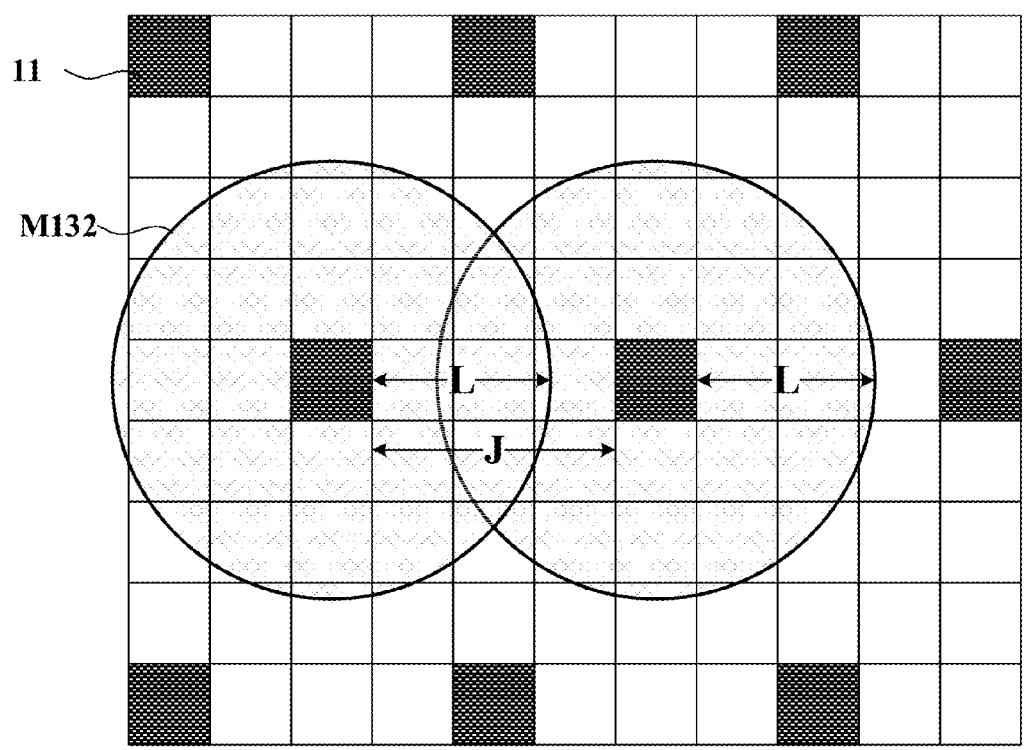
FIG. 27B is a partial top view of the display panel shown in FIG. 27A.
Figure 27C:
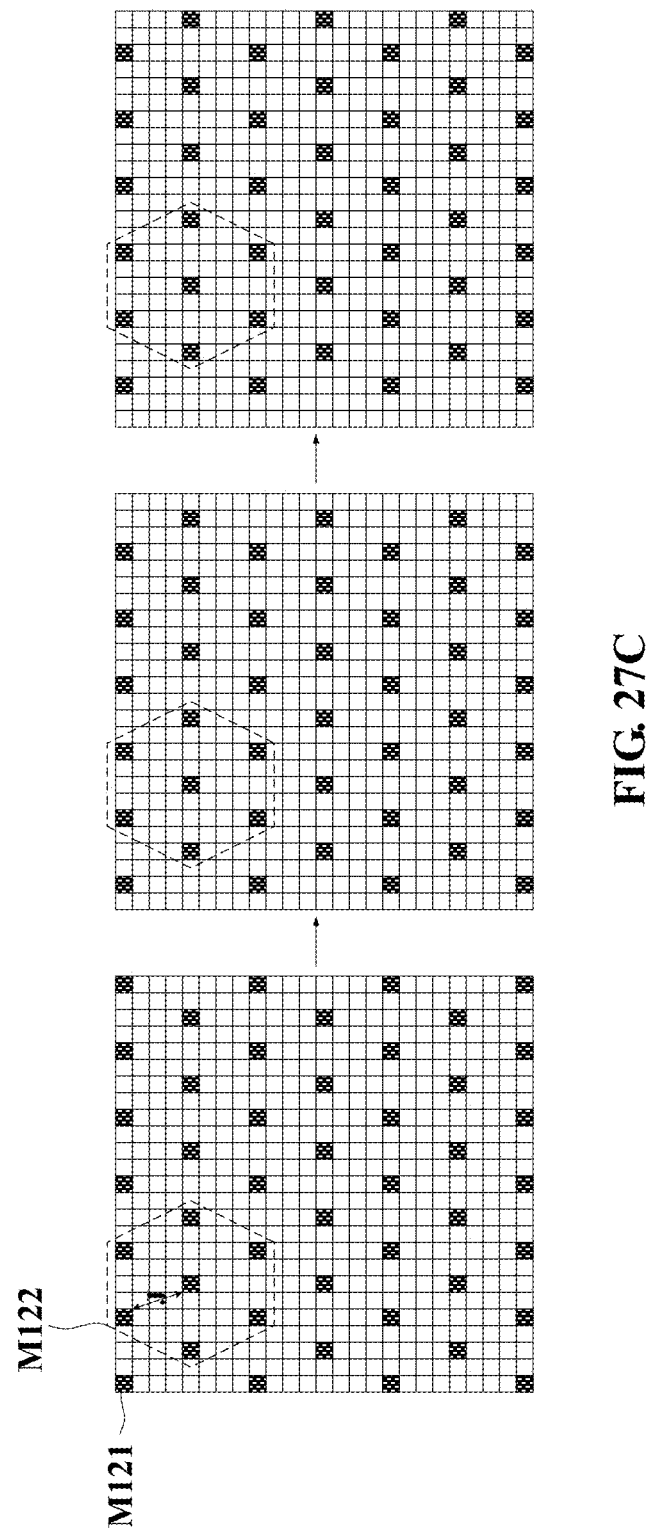
FIG. 27C is a schematic scanning diagram of a fingerprint identification stage of the display panel shown in FIG. 27A.

FIG. 27A is a schematic sectional view of a display panel according to an embodiment of the disclosure, FIG. 27B is a partial top view of the display panel shown in FIG. 27A, and FIG. 27C is a schematic scanning graph of a fingerprint identification stage of the display panel shown in FIG. 27A.

The display panel according to an embodiment of the disclosure includes an array substrate 10, an organic light-emitting structure 11 on one side of the array substrate 10 that faces a cover plate 14, a fingerprint identification module 2 and the cover plate 14. The first surface of the cover plate 14 of the organic light-emitting structure 11 that is facing away from the array substrate 10 is located at the emergent light side of the display panel. In the fingerprint identification stage, fingerprint identification may be performed using the light emitted by the organic light-emitting structure 11, a plurality of organic light-emitting structures 11 displace and emit light according to a first luminous dot matrix M122. The distance J between any adjacent two organic light-emitting structures 11 in the first luminous dot matrix M122 is larger than or equal to the minimum crosstalk-free distance L, wherein the minimum crosstalk-free distance L is the maximum radius of the cover region M132 formed on the fingerprint identification module 2 by reflecting, by the first surface of the cover plate 14, the light emitted from any organic light-emitting structure 11. In one embodiment, a fingerprint identification module 2 is provided on one side of the array substrate 10 that is facing away from the cover plate 14, the fingerprint identification module 2 includes a plurality of fingerprint identification units 21, and the plurality of fingerprint identification units 21 correspond to the plurality of organic light-emitting structures 11, respectively.

Figure 28:
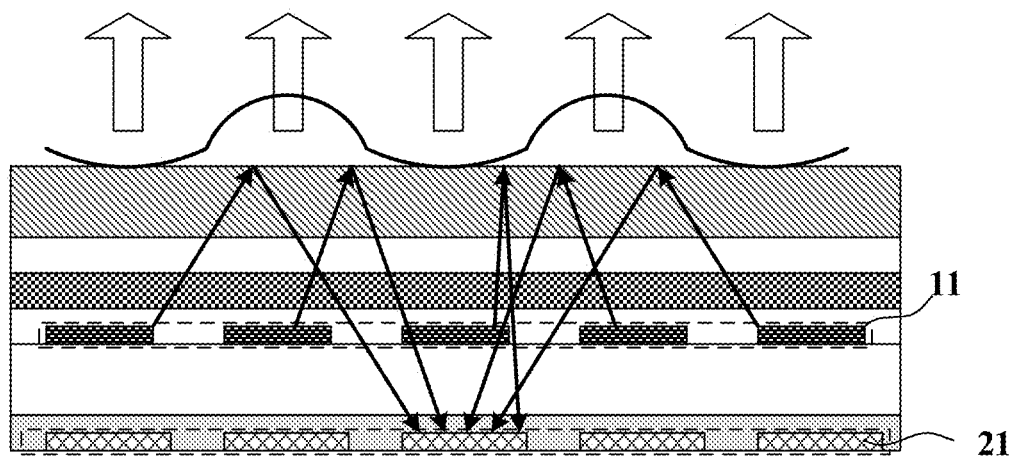
FIG. 28 is a schematic diagram showing the crosstalk of a display panel.

The reason that the first luminous dot matrix M122 is taken as the detection light source of the fingerprint identification unit 21 lies in that the light emitted by the organic light-emitting structure 11 has a large range of angle distribution. As shown in FIG. 28, in the display panel, if all the organic light-emitting structures 11 emit lights simultaneously for fingerprint identification, each fingerprint identification unit M13 will receive, in addition to the fingerprint reflection light from the corresponding organic light-emitting structure 11, crosstalk signals from a plurality of other organic light-emitting structures 11, so that the precision of fingerprint identification will be low.

To improve the precision of fingerprint identification, in the display device according to this embodiment, in the fingerprint identification stage, a plurality of organic light-emitting structures 11 displace and emit light according to a first luminous dot matrix M122, the distance J between any adjacent two organic light-emitting structures 11 in the first luminous dot matrix M122 is larger than or equal to the minimum crosstalk-free distance L. As shown in FIG. 27A and FIG. 27B, the light emitted from organic light-emitting structure 11 has an angle distribution, so that the light emitted by organic light-emitting structure 11 will form a cover region M132 on the fingerprint identification module 2 after being reflected by the first surface of the cover plate 14, the fingerprint reflection light for light emitted at any angle by organic light-emitting structure 11 will all fall into the cover region M132, The maximum radius of the cover region M132 will be the minimum crosstalk-free distance L. In this embodiment, the distance J between any adjacent two organic light-emitting structures 11 in the first luminous dot matrix M122 is larger than or equal to the minimum crosstalk-free distance L, so that the fingerprint reflection light of any organic light-emitting structure 11 that emits light will never irradiate on the fingerprint identification unit 21 corresponding to other organic light-emitting structures 11 that emit light simultaneously, that is, the fingerprint identification unit 21 corresponding to any organic light-emitting structure 11 in the first luminous dot matrix M122 can only receive the fingerprint reflection light of an organic light-emitting structure 11 corresponding thereto. Therefore, in the display device according to this embodiment, the fingerprint identification unit 21 will not be affected by the crosstalk signals from other organic light-emitting structures, and the fingerprint identification circuit of the corresponding display panel is able to perform fingerprint identification according to the inductive signal generated by said fingerprint identification unit 21, thereby improving the precision of fingerprint identification of the display panel.

It is noted that, the fingerprint reflection light is the reflected light formed by reflecting the emergent light of the organic light-emitting structure 11 via the fingerprint of the user finger that is pressed on the first surface of the cover plate 14, the distance between the fingerprint of the user finger and the first surface of the cover plate 14 is very small with respect to the thickness of the display panel, so that there is little affection on the range of the cover region M132. Therefore, in this embodiment, the reflection distance between the user finger and the first surface of the cover plate 14 is neglected during the arrangement of the minimum crosstalk-free distance L. Additionally, the radius L of the cover region M132 should substantially be calculated by taking the center point of the organic light-emitting structure 11 as the initial point; however, in fact, the display panel has a very larger number of organic light-emitting structures 11, so that the size of the organic light-emitting structure 11 is very small. Therefore, in this embodiment, the organic light-emitting structure 11 as a whole may be taken as the initial point of the cover region M132, and in this case the radius L of the cover region M132 may be represented by the length from the edge of the organic light-emitting structure 11 to the edge of the cover region M132, and the size of the organic light-emitting structure 11 may not be accounted for the minimum crosstalk-free distance L. It may be understood by one skilled in the art that, the minimum crosstalk-free distance L is related to the factors such as the thickness of the display panel and the emergent light angle of the organic light-emitting structure, etc., and thus different display panels may have different values of minimum crosstalk-free distance L. In one embodiment, in other embodiments, the size of the organic light-emitting structure may be accounted for in the minimum crosstalk-free distance, which is not specifically limited in the disclosure.

As indicated above, the light emitted from the organic light-emitting structure 11 has an angle distribution, and the minimum crosstalk-free distance L is the maximum radius of the cover region M132 formed on the fingerprint identification module 2 by reflecting the light emitted from any organic light-emitting structure 11 by the first surface of the cover plate 14. Apparently, the range defined on the fingerprint identification module 2 by the reflected light of the light with the maximum angle emitted from the edge of the organic light-emitting structure 11 will be the cover region M132, and the reflected light of the light with any angle emitted by the organic light-emitting structure 11 will fall into the cover region M132.

Figure 27D:
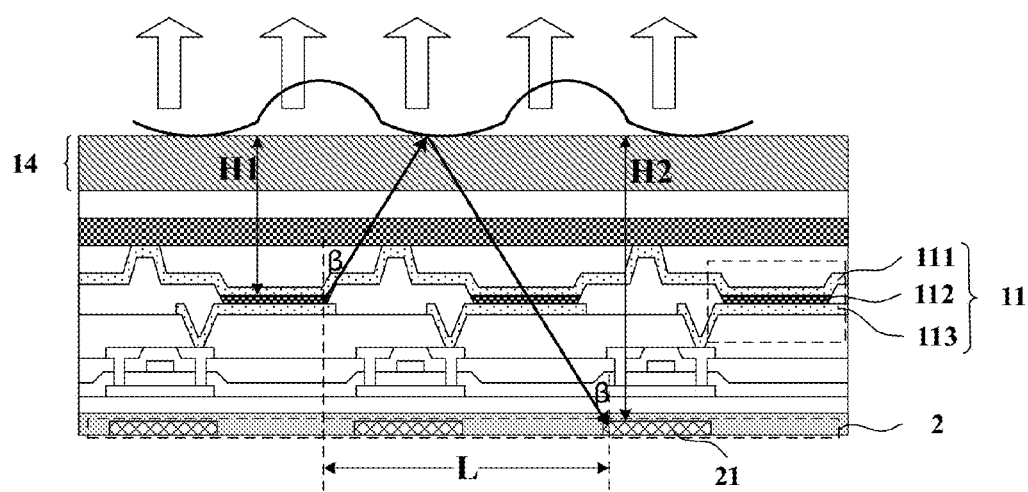
FIG. 27D is a specific structural representation of FIG. 27A.

As shown in FIG. 27D, in the embodiment of the disclosure, the organic light-emitting structure 11 successively includes a first electrode 111, a light-emitting layer 112 and a second electrode 113 along the direction departing from the array substrate 10, and one organic light-emitting unit is consisted of one first electrode 111, one light-emitting layer 112 arranged corresponding to the first electrode 111 and a region of the second electrode 113 corresponding to the first electrode 111. If the organic light-emitting structure 11 includes organic light-emitting units with three colors, one organic light-emitting structure 11 will include organic light-emitting units with three different colors. A signal is applied to the first electrode 111 and the second electrode 113, and the light-emitting layer 112 emits light, the light emitted by the light-emitting layer 112 has an angle distribution. The reflection of a signal by a fingerprint is basically mirror reflection, wherein reflection angle=incident angle. Thus, it may be known that L=tan β*H1+tan β*H2, wherein, L is the minimum crosstalk-free distance, β is an included angle between the direction corresponding to the preset brightness of the organic light-emitting structure 11 and the direction vertical to the organic light emitting layer, H1 is the height from the first surface of the cover plate 14 to the light-emitting functional layer in the direction vertical to the display panel, H2 is the height from the first surface of the cover plate 14 to the fingerprint identification module 2 in the direction vertical to the display panel, and the preset brightness is less than or equals to 10% of the brightness in the direction vertical to the organic light emitting layer.

In this embodiment, the angle of the light emitted from the organic light-emitting structure 11 is related to the brightness of the organic light-emitting structure 11, wherein brightness is a subjective feeling to the (achromatic) luminous intensity. In this embodiment, the brightness of the organic light-emitting structure 11 in the vertical direction is defined as 100%, the lower the brightness percentage is, the larger the corresponding emergent light angle (the included angle with the direction vertical to the organic light emitting layer) will be, and the weaker the corresponding luminous intensity will be. However, when the brightness of the organic light-emitting structure 11 is less than or equals to 10%, the luminous intensity of the light emitted from the organic light-emitting structure 11 will be very weak, and the reflected light thereof formed on the first surface of the cover plate 14 will not cause a crosstalk to the fingerprint identification unit 21, therefore, in this embodiment, a brightness of 10% is set as the critical value for the emergent light angle of the organic light-emitting structure 11. Based on this, the process for determining β is as follows: the brightness of the organic light-emitting structure 11 in the vertical direction is measured, the location corresponding to 10% of the brightness in the direction vertical to the organic light emitting layer is determined, and β is determined according to an included angle between the direction of the location and the direction vertical to the organic light emitting layer. It may be understood by one skilled in the art that, the luminous intensities of the organic light-emitting structures of different display panels may be different, and the value of the corresponding preset brightness may also be different, for example, in other embodiments, the value of the preset brightness may be selected as 12% or 9%, etc., of the brightness in the direction vertical to the organic light emitting layer, which is not specifically limited in the disclosure.

FIG. 27C is a schematic scanning graph of the display panel. In the fingerprint identification stage, the display panel performs fingerprint identification in a picture scanning mode. Specifically, the organic light-emitting structures 11 are lighted simultaneously according to the first luminous dot matrix M122, and inductive signals generated by the fingerprint identification units 20 at the locations corresponding to the lighted organic light-emitting structures 11 are recorded; in the next picture, the organic light-emitting structures 11 lighted simultaneously are displaced, and the corresponding inductive signals are recorded, until all the organic light-emitting structures 11 are lighted circularly, and fingerprint identification is performed according to the obtained inductive signal of each fingerprint identification unit 21. Because the fingerprint identification unit 21 in this embodiment will not be affected by crosstalk signals, the precision of fingerprint identification will be very high. It may be understood by one skilled in the art that, the first luminous dot matrix may be a minimum repeating unit formed by a plurality of organic light-emitting structures that emit light simultaneously, rather than being limited to a dot matrix formed by a plurality of organic light-emitting structures that emit light simultaneously.

In the display panel according to an embodiment of the disclosure, in the fingerprint identification stage, a plurality of organic light-emitting structures displace and emit light according to the first luminous dot matrix, the distance between any adjacent two organic light-emitting structures in the first luminous dot matrix is larger than or equal to the minimum crosstalk-free distance, wherein the minimum crosstalk-free distance is the maximum radius of the cover region formed on the fingerprint identification array by reflecting the light emitted from any organic light-emitting structure by the first surface of the cover plate. Apparently, the fingerprint reflection light of any organic light-emitting structure that emits light in the first luminous dot matrix will never irradiate on the fingerprint identification unit corresponding to other organic light-emitting structures that emit light simultaneously, that is, the fingerprint identification unit corresponding to any organic light-emitting structure in the first luminous dot matrix can only receive fingerprint reflection light of an organic light-emitting structure corresponding thereto. Therefore, the fingerprint identification unit will not be affected by the crosstalk signals from other organic light-emitting structures, and the fingerprint identification circuit of the corresponding display panel performs fingerprint identification according to the inductive signal generated by the fingerprint identification unit, thereby improving the precision of fingerprint identification of the display panel.

It is noted that, the display panel shown in FIG. 27A only shows a structure of a display panel according to the disclosure. In other embodiments of the disclosure, display panels with various different structures are further provided.

Figure 29:
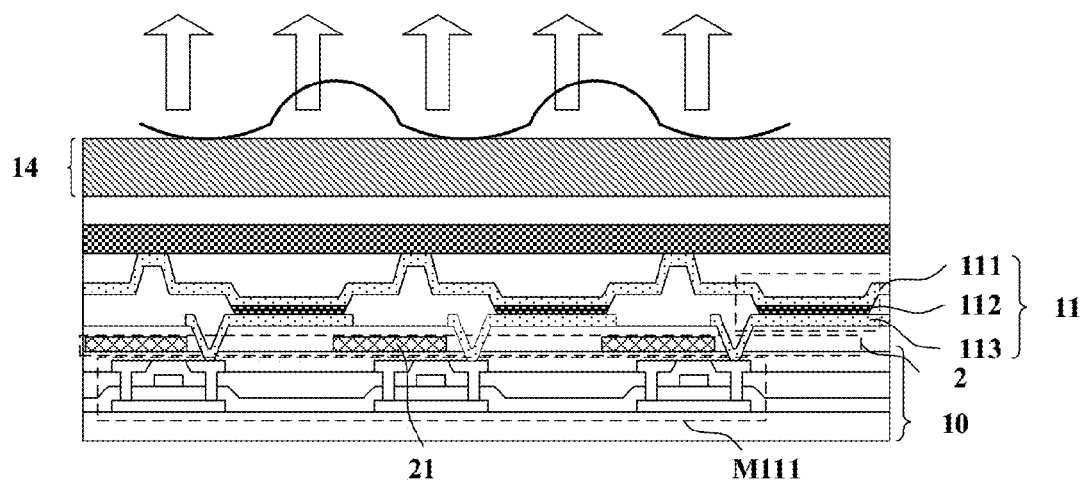
FIG. 29 is a schematic sectional view of another display panel according to an embodiment of the disclosure.

One embodiment of the disclosure further provides another display panel, and the difference between this display panel and the display panel shown in FIG. 27A only lies in that the structures are different. Specifically, in the display panel as shown in FIG. 29, a thin-film transistor array M111, a fingerprint identification module 2 and an organic light-emitting structure 11 are laminated on one side of the array substrate 10 that faces the cover plate 14. As shown in FIG. 29, the fingerprint identification module 2 is provided between the thin-film transistor array M111 and the organic light-emitting structure 11, the fingerprint identification module 2 and the thin-film transistor array M111 are laminated in an insulated way, and the fingerprint identification module 2 and the organic light-emitting structure 11 are laminated in an insulated way. The fingerprint identification process of this display panel is similar to that of the display panel shown in FIG. 27A, and it will not be described again here. It needs to be noted that, the fingerprint identification module 2 is provided between the thin-film transistor array M111 and the organic light-emitting structure 11, so that this will not affect the aperture ratio of the first electrode in the organic light-emitting structure 11. Therefore, the arrangement mode of the fingerprint identification unit 21 in the fingerprint identification module 2 may be determined as necessary by the product, which will not be specifically defined in the disclosure.

Figure 30A:
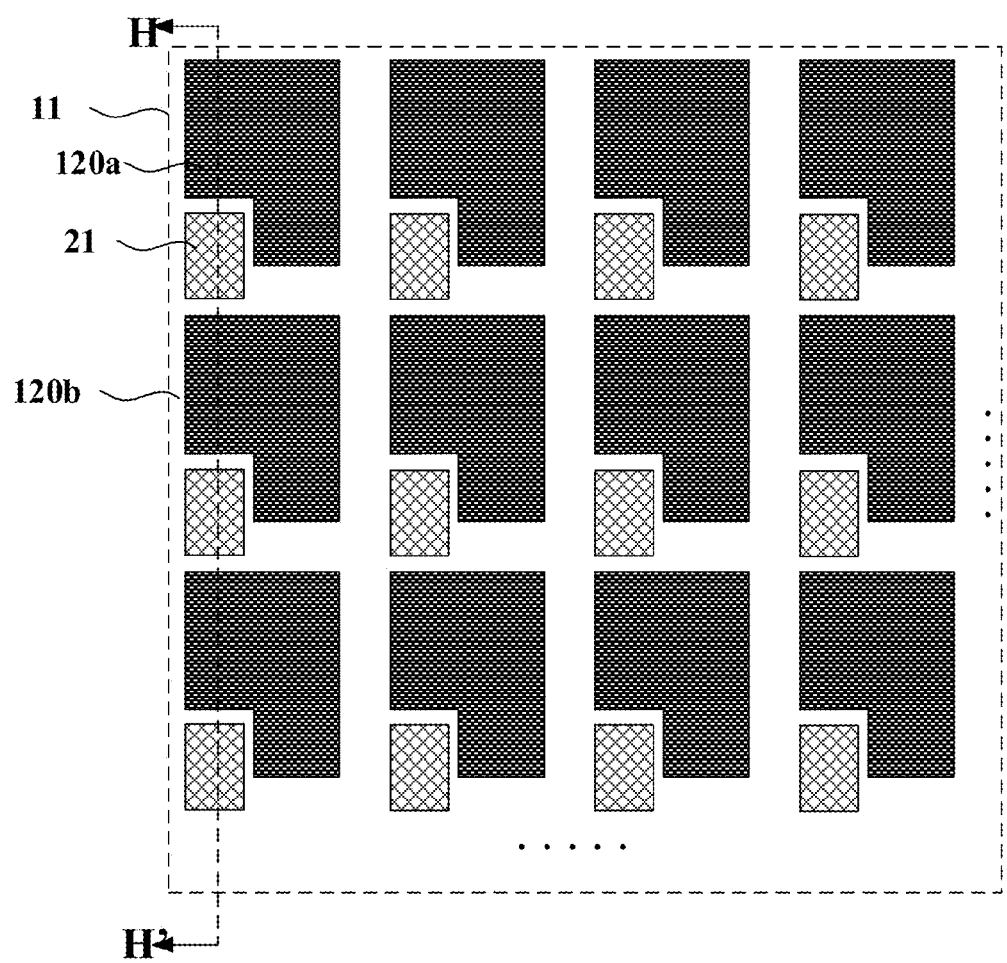
FIG. 30A is a schematic top view showing the structure of another display panel according to an embodiment of the disclosure.
Figure 30B:
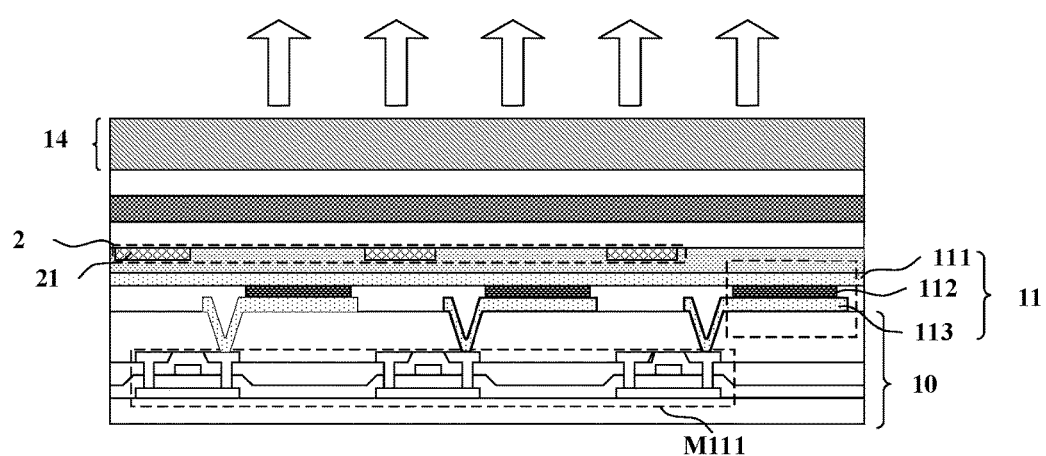
FIG. 30B is a schematic sectional view taken along direction HH' in FIG. 30A.

One embodiment of the disclosure further provides another display panel, and the difference between this display panel and any of the above display panels only lies in that the structures are different. Specifically, FIG. 30A is a top view of the display panel, and FIG. 30B is a sectional view of FIG. 30A taken along direction HH'. In the array substrate 10 shown in FIG. 30A-FIG. 30B, a thin-film transistor array M111, an organic light-emitting structure 11 and a fingerprint identification module 2 are provided on one side of the array substrate 10 that faces the cover plate 14; as shown in FIG. 30A, the organic light-emitting layer consisted of the organic light-emitting structure 11 includes a display region 120A and a non-display region 120B, and the projection of the fingerprint identification module 2 in the direction vertical to the display panel is located within the non-display region 120B of the organic light-emitting layer. As shown in FIG. 30A-FIG. 30B, the fingerprint identification module 2 is provided on the surface on one side of the organic light-emitting structure 11 that faces the cover plate 14, and the fingerprint identification module 2 and the organic light-emitting structure 11 are laminated in an insulated way. The fingerprint identification process of the display panel is similar to that of the display panel shown in FIG. 27A, and it will not be described again here. It should be noted that, the fingerprint identification module 2 is provided on the surface on one side of the organic light-emitting structure 11 that faces the cover plate 14, and in order to prevent the aperture ratio of the first electrode 111 in the organic light-emitting structure 11 from being lowered, the projection of the fingerprint identification unit 21 in the fingerprint identification module 2 in the direction vertical to the display panel is located within the non-display region 120B of the organic light-emitting structure 11.

Figure 31A:
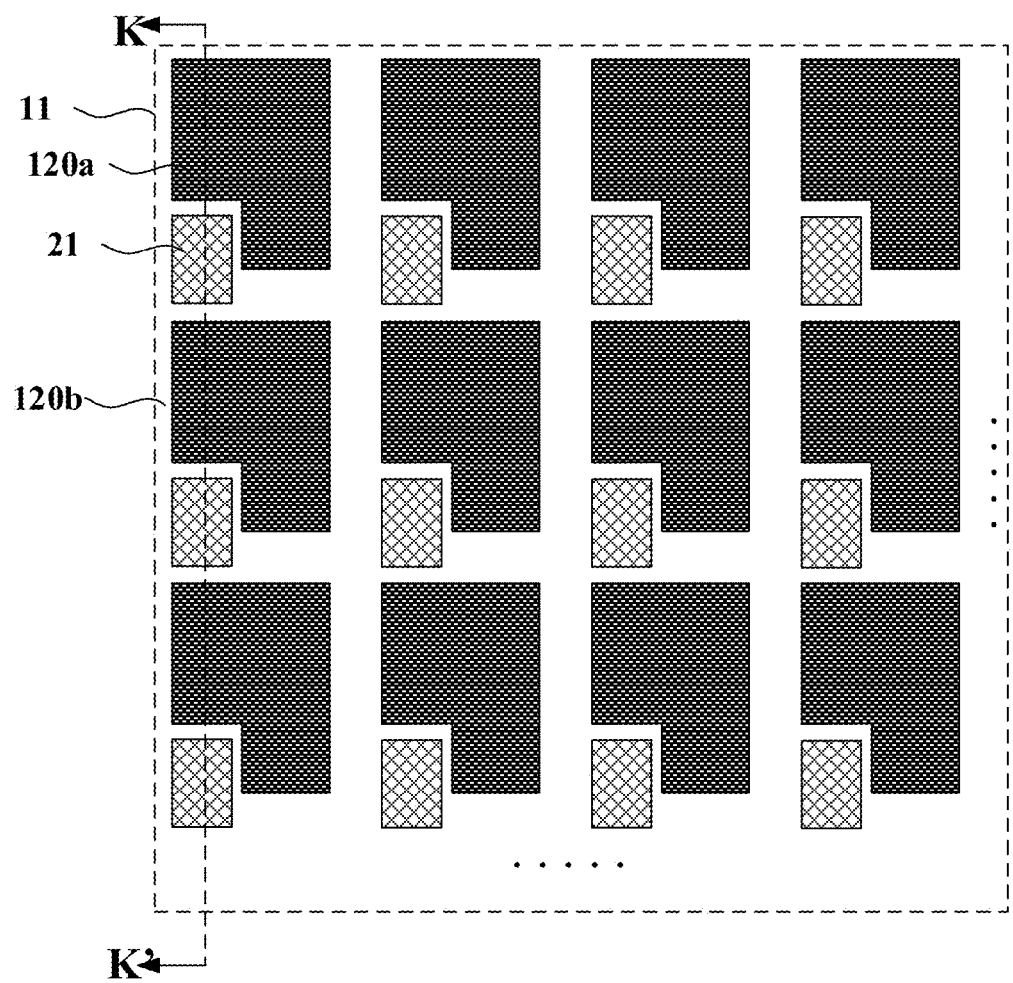
FIG. 31A is a top view showing the structure of another display panel according to an embodiment of the disclosure.
Figure 31B:
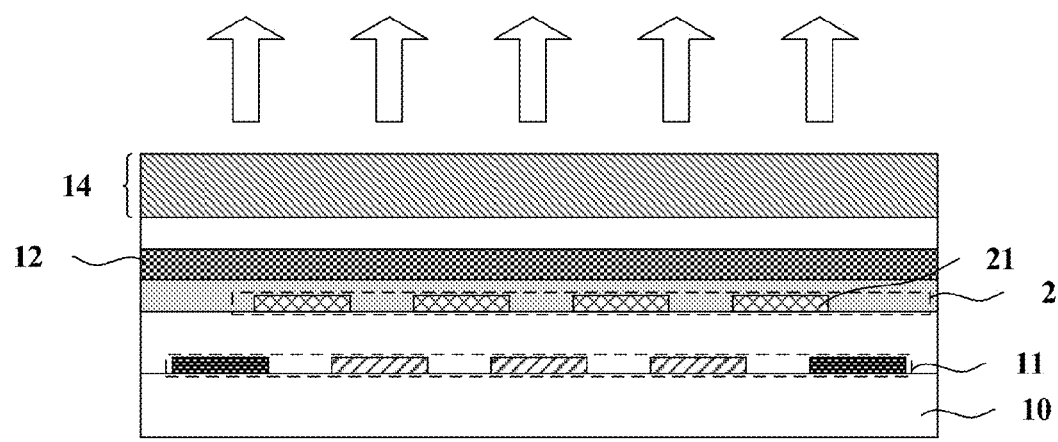
FIG. 31B is a schematic sectional view taken along direction KK' in FIG. 31A.

An embodiment of the disclosure further provides another display panel. Specifically, FIG. 31A is a top view of the display panel, and FIG. 31B is a sectional view of FIG. 31A along direction KK'. The display panel shown in FIG. 31A-FIG. 31B further includes an encapsulation glass 12 located on one side of the array substrate 10 that faces the cover plate 14. An organic light-emitting structure 11 is provided on one side of the array substrate 10 that faces the cover plate 14, and a fingerprint identification module 2 is provided on one side of the encapsulation glass 12 that faces the array substrate 10, the organic light-emitting structure 11 includes a display region 120A and a non-display region 120B, and the projection of the fingerprint identification module 2 in the direction vertical to the display panel is located within the non-display region 120B of the organic light-emitting structure 11. The display panel employs an encapsulation glass 12 for encapsulation, and the fingerprint identification module 2 is provided on one side of the encapsulation glass 12 that faces the array substrate 10, i.e., the inner side of the encapsulation glass 12. The fingerprint identification process of the display panel is similar to that of the display panel shown in FIG. 27A, and it will not be described again here. In order to prevent the aperture ratio from being lowered, the projection of the fingerprint identification unit 21 in the fingerprint identification module 2 in the direction vertical to the display panel is located within the non-display region 120B of the organic light-emitting structure 11.

Figure 32A:
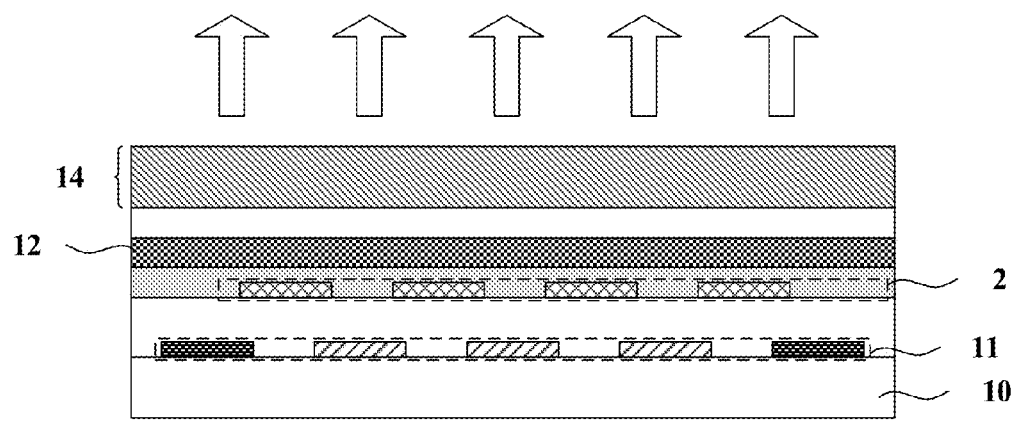
FIG. 32A and FIG. 32B are schematic diagrams of two display panels according to embodiments of the disclosure.
Figure 32B:
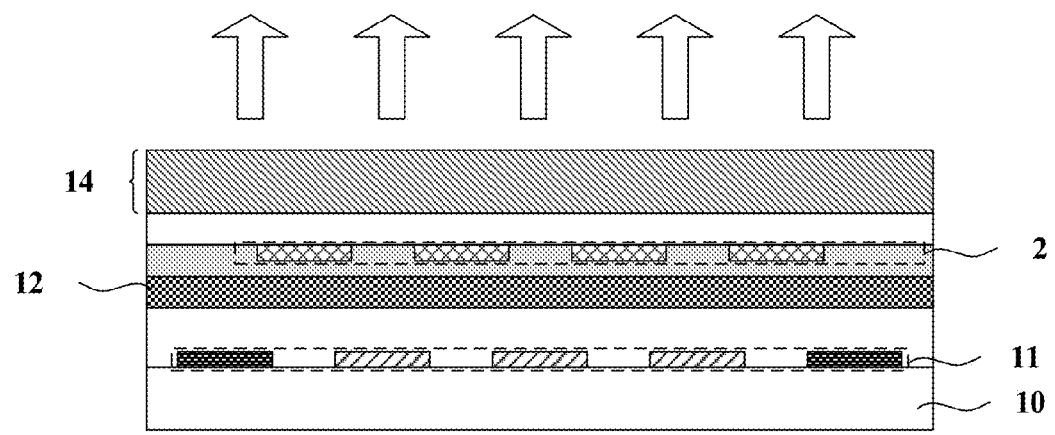
Figure 32C:
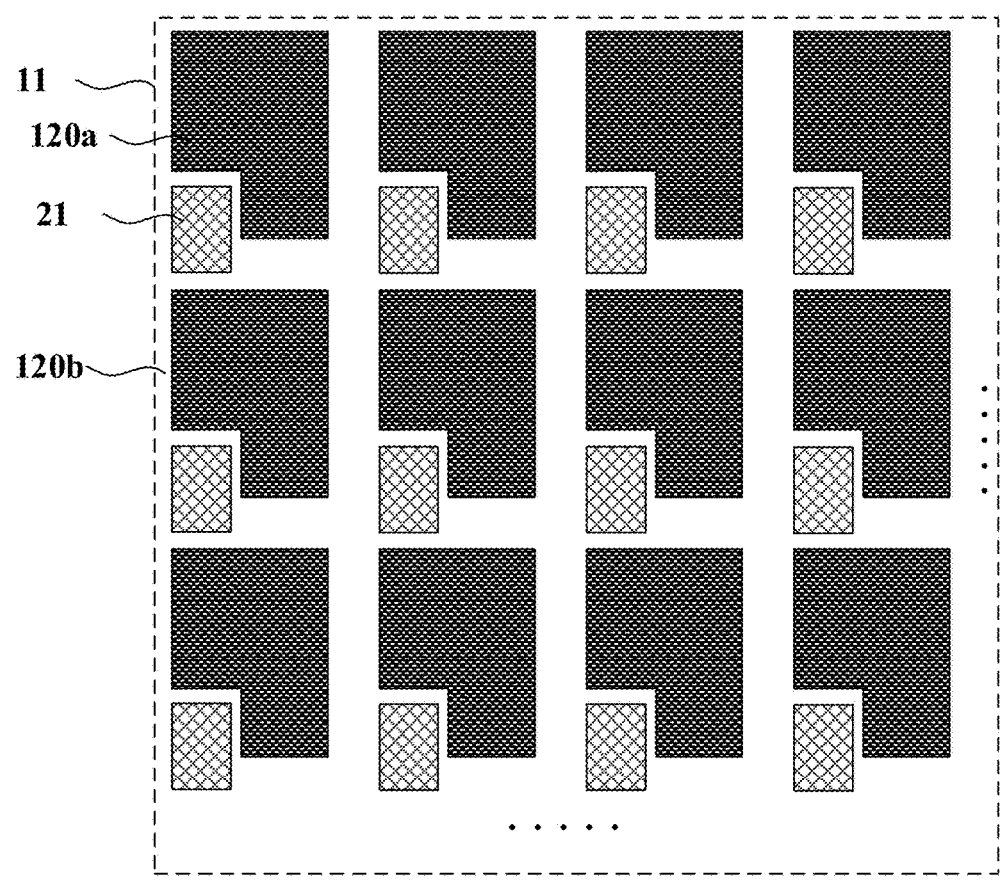
FIG. 32C is a top view of the display panels shown in FIG. 32A and FIG. 32B.

Embodiments of the disclosure further provide two display panels, specifically, the display panels as shown in FIG. 32A and FIG. 32B, the display panel further includes an encapsulation layer 12 located on one side of the array substrate 10 that faces the cover plate 14, for example, it may be a thin-film encapsulation layer, and an organic light-emitting structure 11 is provided on one side of the array substrate 10 that faces the cover plate 14. As shown in FIG. 32A, a fingerprint identification module 2 is provided on one side of the thin-film encapsulation layer 12 that faces the array substrate 10, and as shown in FIG. 32B, a fingerprint identification module 2 is provided on one side of the thin-film encapsulation layer 12 that departs from the array substrate 10, wherein, as shown in FIG. 32C, the organic light-emitting structure 11 includes a display region 120A and a non-display region 120B, and the projection of the fingerprint identification module 2 in the direction vertical to the display panel is located within the non-display region 120B of the organic light-emitting structure 11. The display panel employs a thin-film encapsulation layer 12 for encapsulation, and the fingerprint identification module 2 may be provided on the inner side of the thin-film encapsulation layer 12, or it may be provided on the outer side of the thin-film encapsulation layer 12. The fingerprint identification process of the display panel is similar to that of the display panel shown in FIG. 27A, which will not be described again here. In order to prevent the aperture ratio from being lowered, the projection of the fingerprint identification unit 21 in the fingerprint identification module 2 in the direction vertical to the display panel is located within the non-display region 120B of the organic light-emitting structure 11.

Figure 33A:
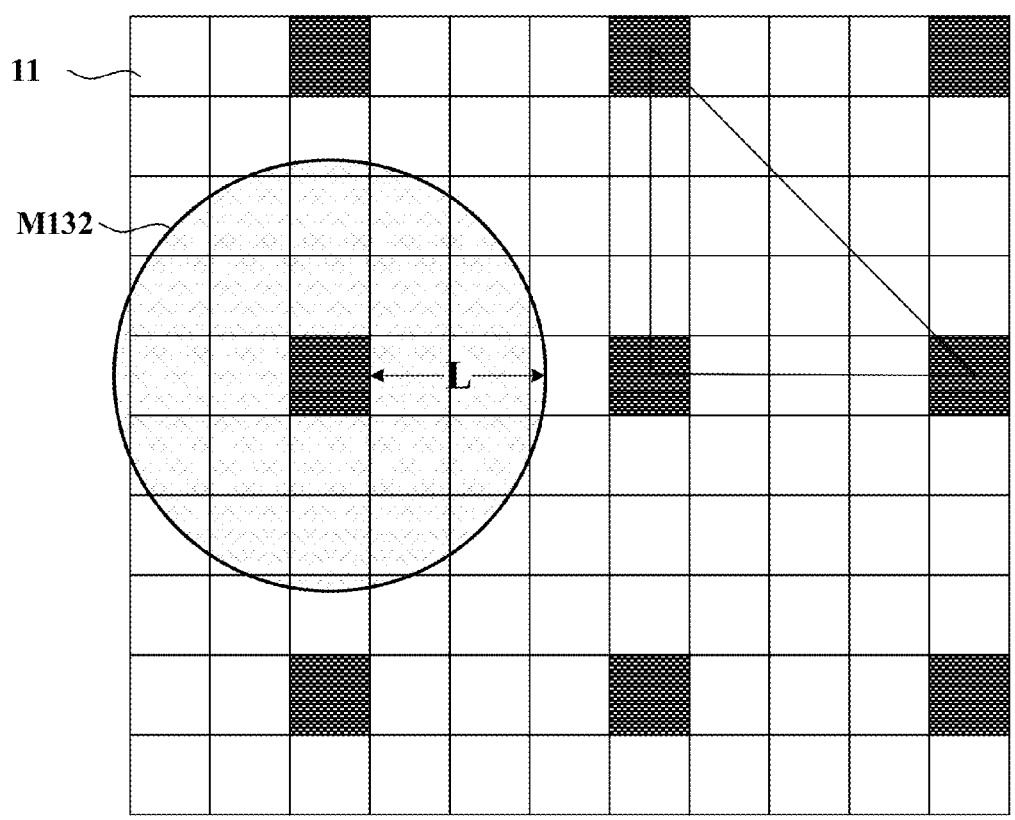
FIG. 33A and FIG. 33B are schematic scanning diagrams of the fingerprint identification stage of two display panels according to embodiments of the disclosure.

It needs to be noted that, the display panel reads the fingerprint information in a picture scanning mode, and in one frame of picture, the organic light-emitting structure 11 is controlled to emit light according to the first luminous dot matrix M122 and acquire a fingerprint signal of the fingerprint identification unit 21 corresponding to the organic light-emitting structure 11 that emits light; in the next frame of picture, the organic light-emitting structure 11 that emits light displaces; the organic light-emitting structures 11 that emit light displace successively until all the organic light-emitting structures 11 are lighted via a plurality of frames of pictures. Apparently, the display panel reads the fingerprint information via a plurality of frames of pictures; however, if the number of the organic light-emitting structures 11 lighted in one frame of picture is small, the number of frames of pictures for reading the fingerprint information will be large, and the time necessary for reading the fingerprint information will be long. For example, if the display panel reads the fingerprint information in the picture scanning mode as shown in FIG. 33A, wherein the number of organic light-emitting structures 11 that emit light simultaneously in one frame of picture (11*10 organic light-emitting structures) is 9, at least 12 frames of pictures need to be scanned for reading the fingerprint information of the fingerprint identification unit 21 of all the organic light-emitting structures 11, wherein the time for reading the fingerprint information of each frame of picture is fixed.

Figure 33B:
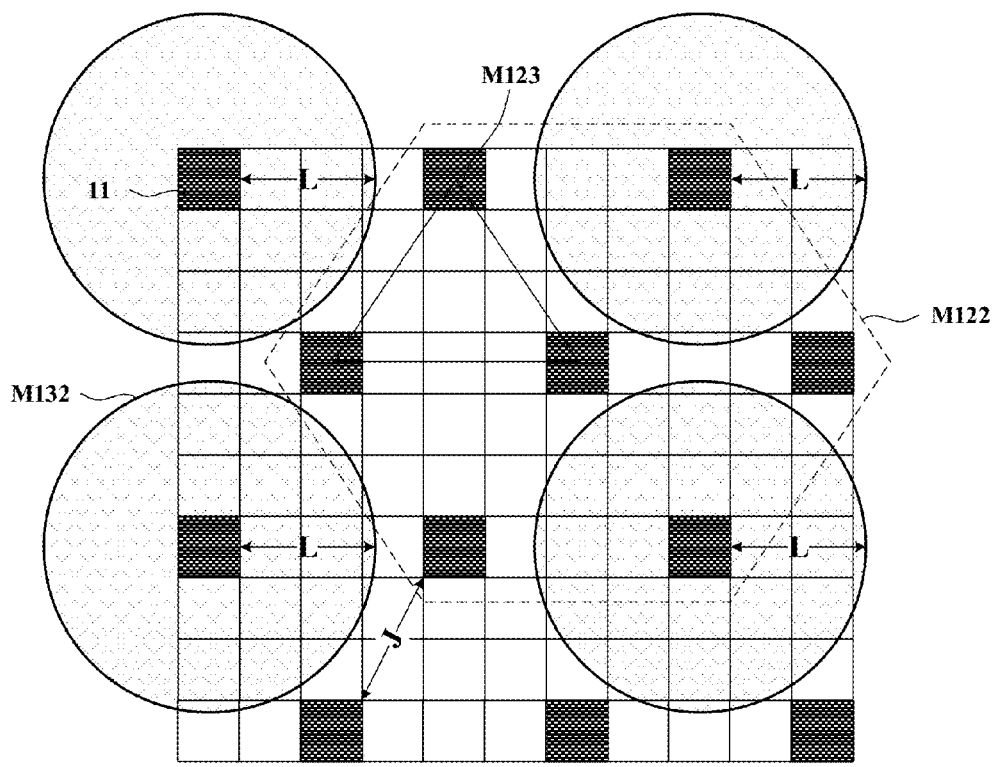

In order to reduce the time needed for reading a fingerprint, as shown in FIG. 33B, a plurality of organic light-emitting structures 11 of the first luminous dot matrix M122 form a plurality of patterns. As shown in FIG. 33B, each angle of the pattern M123 with the minimum area among the plurality of patterns does not equal to 90°. Apparently, in comparison with FIG. 33A, the distance J between adjacent two organic light-emitting structures 11 that emit light in the first luminous dot matrix M122 is somewhat reduced, so that the number of organic light-emitting structures 11 lighted in one frame of picture is large. Specifically, the number of organic light-emitting structures 11 that emit light simultaneously in one frame of picture (11*10 organic light-emitting structures) is 12, so that at most 10 frames of pictures need to be scanned for reading the fingerprint information of the fingerprint identification unit 21 of all the organic light-emitting structures 11. A plurality of organic light-emitting structures 11 of the first luminous dot matrix M122 form a plurality of patterns, and each angle of the pattern M123 with the minimum area among the plurality of patterns does not equal to 90°. In this case, the number of the organic light-emitting structures 11 lighted simultaneously can be improved without signal crosstalk, thereby significantly reducing the time needed for reading a fingerprint.

Figure 34A:
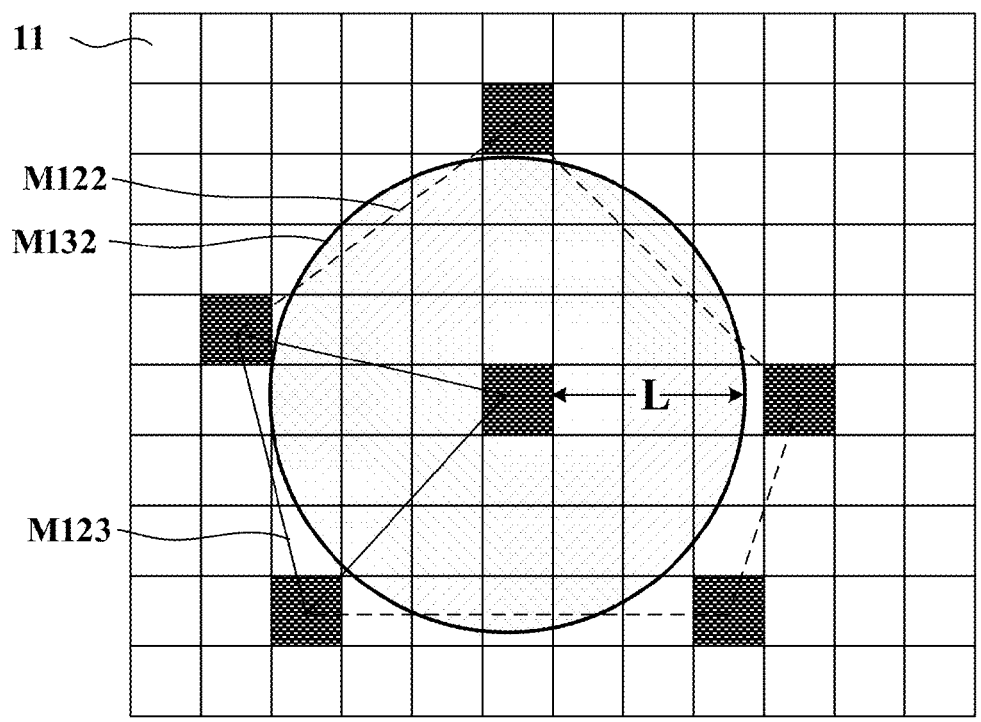
FIG. 34A to FIG. 34C are schematic diagrams of three first luminous dot matrixes according to embodiments of the disclosure.

Exemplarily, based on the display panel according to any of the above embodiments, as shown in FIG. 34A, the first luminous dot matrix M122 is a pentagonal luminous dot matrix, which includes one center organic light-emitting structure 11 and five edge organic light-emitting structures 11. A plurality of organic light-emitting structures 11 of the first luminous dot matrix M122 form a plurality of patterns, and each angle of the pattern M123 with the minimum area among the plurality of patterns does not equal to 90°. By the pentagonal luminous dot matrix, the number of the organic light-emitting structures 11 lighted simultaneously can be improved without signal crosstalk, thereby reducing the time needed for reading a fingerprint.

Figure 34B:
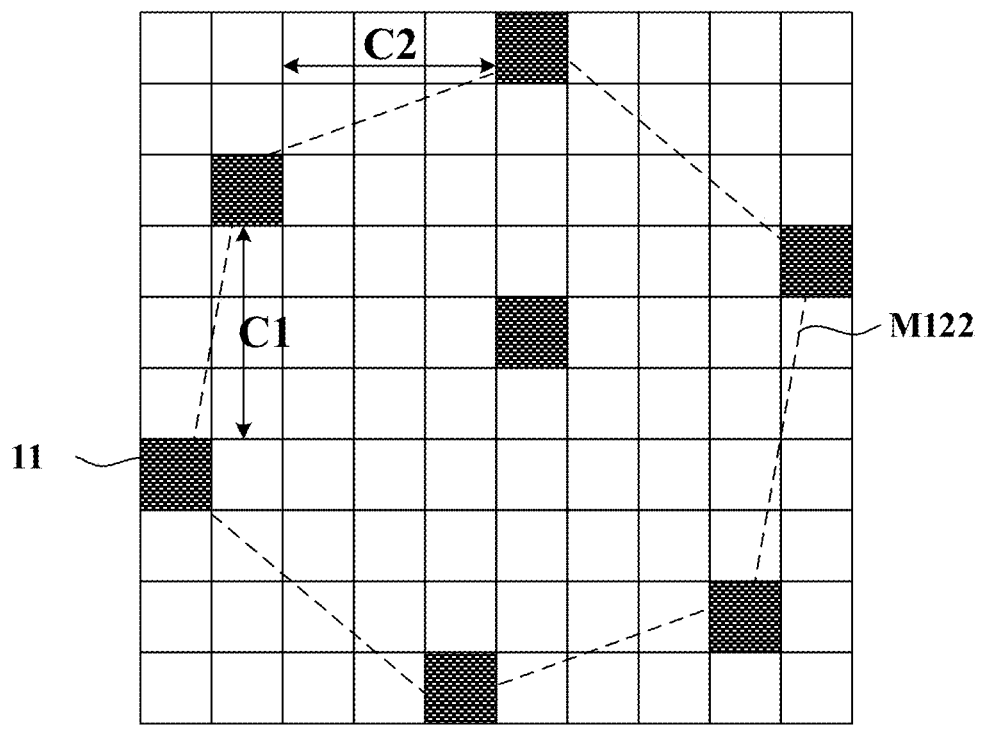

Exemplarily, based on the display panel according to any of the above embodiments, as shown in FIG. 34B, the first luminous dot matrix M122 is a hexagonal luminous dot matrix, which includes one center organic light-emitting structure 11 and six edge organic light-emitting structures 11. By the hexagonal luminous dot matrix, the number of the organic light-emitting structures 11 lighted simultaneously can be improved without signal crosstalk, thereby reducing the time needed for reading a fingerprint.

Figure 34C:
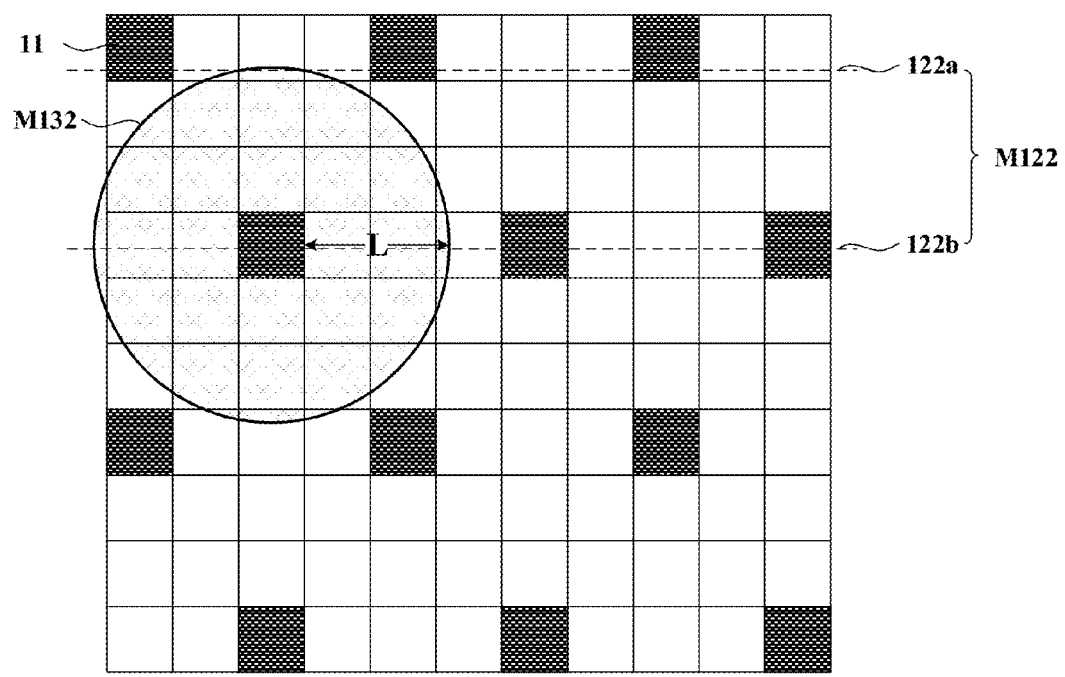

Exemplarily, based on the display panel according to any of the above embodiments, as shown in FIG. 34C, the first luminous dot matrix M122 includes a first luminous row 122A and a second luminous row 122B that are spaced apart from each other, wherein any organic light-emitting structure 11 in the first luminous row 122A and any organic light-emitting structure 11 in the second luminous row 122B are located in different columns. In comparison with the scanning mode shown in FIG. 33A, any organic light-emitting structure 11 in the first luminous row 122A and any organic light-emitting structure 11 in the second luminous row 122B are located in different columns, so that the number of the organic light-emitting structures 11 lighted simultaneously can be improved without signal crosstalk, wherein the number of organic light-emitting structures 11 that emit light simultaneously in one frame of picture (11*10 organic light-emitting structures) is 12, so that at most 10 frames of pictures need to be scanned for reading the fingerprint information of the fingerprint identification unit 21 of all the organic light-emitting structures 11, thereby significantly reducing the time needed for reading a fingerprint.

For any first luminous dot matrix M122 provided in any of the above embodiments, the distance J between any adjacent two organic light-emitting structures 11 in the first luminous dot matrix M122 equals to the minimum crosstalk-free distance L. Apparently, the fingerprint identification unit 21 corresponding to each organic light-emitting structure 11 that emits light in the first luminous dot matrix M122 will not be affected by the crosstalk signals from other organic light-emitting structures 11 that emit light simultaneously, so that the accuracy of the fingerprint signal may be guaranteed; also, the distance J between any adjacent two organic light-emitting structures 11 in the first luminous dot matrix M122 equals to the minimum crosstalk-free distance L, so that the number of organic light-emitting structures 11 lighted simultaneously may be made larger, thereby reducing the time necessary for reading a fingerprint signal, and improving the fingerprint read efficiency.

For any first luminous dot matrix M122 provided in any of the above embodiments, for any adjacent two organic light-emitting structures 11 located on different rows in the first luminous dot matrix M122, the vertical distance C1 from one organic light-emitting structure 11 to the row including another organic light-emitting structure 11 (shown in FIG. 34B) is less than the minimum crosstalk-free distance L; and/or, for any adjacent two organic light-emitting structures 11 located in different columns in the first luminous dot matrix M122, the vertical distance C2 from one organic light-emitting structure 11 to the column including another organic light-emitting structure 11 (shown in FIG. 34B) is less than the minimum crosstalk-free distance L. With such the first luminous dot matrix M122 may guarantee that the fingerprint identification unit 21 corresponding to the organic light-emitting structure 11 that emits light will not be affected by the crosstalk signals from other organic light-emitting structures 11 that emit light simultaneously, so that the accuracy of fingerprint identification can be improved; Also, the number of organic light-emitting structures 11 lighted simultaneously may be made larger, thereby reducing the time necessary for reading a fingerprint signal, and improving the fingerprint read efficiency.

In order to more clearly illustrate the fingerprint read efficiency of the display panel according to the embodiment of the disclosure, the fingerprint read efficiency of the display panel according to the embodiment of the disclosure will be described taking a square array scanning mode and a hexagonal array scanning mode as an example. It is set that crosstalk can only be avoided when the distance between adjacent organic light-emitting structures 11 lighted in a scanned picture at least reaches above 20 organic light-emitting structures 11 (the distance between the centers of two organic light-emitting structures), and specifically, the length of 20 organic light-emitting structures 11 is 20P.

Figure 35A:
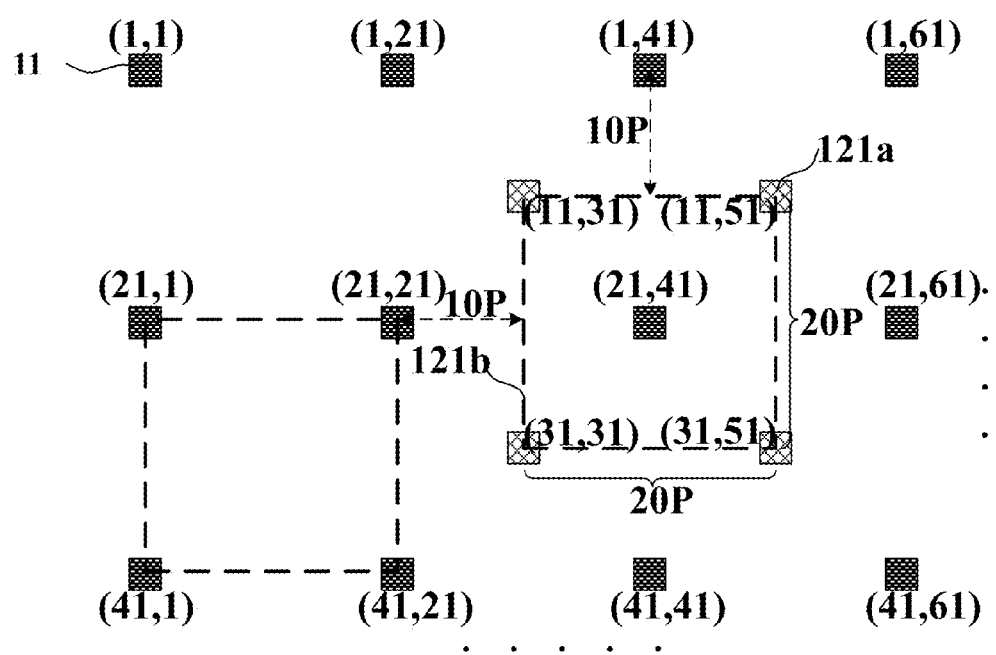
FIG. 35A is a schematic diagram showing a square array scanning mode of a display panel.

For the square array scanning mode as shown in FIG. 35A, the coordinates of a lighted organic light-emitting structure 11 are set by (row, column), and the coordinates of the first organic light-emitting structure 11 at the top left corner are (1,1). Thus, it may be known that, the coordinates of the organic light-emitting structures 11 lighted in the first row are successively first row (1,1), (1,21), (1,41), . . . , the coordinates of the organic light-emitting structures 11 lighted in the second row are successively (21,1), (21,21), (21,41), . . . , and the coordinates of the organic light-emitting structures 11 lighted in the third row are successively (41,1), (41,21), (41,41), . . . , and the like, which will be the coordinates of all the organic light-emitting structures 11 lighted simultaneously in one frame. The organic light-emitting layer consisted of the organic light-emitting structure 11 of the display panel will be divided horizontally and vertically by taking each lighted organic light-emitting structures 11 as the center point. Then the organic light-emitting structure 11 is divided into a plurality of lighted regions 121B that are totally the same, with the size of each lighted region 121B being totally consistent with others, and each lighted region 121B includes one lighted organic light-emitting structure 11 and a plurality of unlighted organic light-emitting structures 121A surrounding the lighted organic light-emitting structure 11. It needs to be noted that, for a lighted organic light-emitting structure 11 located at the edge of the organic light-emitting structure 11, the corresponding region thereof in the organic light-emitting layer is only a part of its lighted region.

For example, for the lighted organic light-emitting structure 11 (21,41), the lighted region 121B corresponding thereto is surrounded by four unlighted organic light-emitting structures 121A, and the coordinates of the four unlighted organic light-emitting structures 121A are respectively (11,31), (11,51), (31,31) and (31,51). Apparently, the length and width of the lighted region 121B are respectively 20P, that is, the number of organic light-emitting structures forming the lighted region 121B is 20*20=400, and only one lighted organic light-emitting structure (21,41) exists in the lighted region 121B, that is, one organic light-emitting structure 11 is lighted in every 400 organic light-emitting structures 11. Therefore, the density of lighted organic light-emitting structures in the lighted region 121B is 1/400. The organic light-emitting structure 11 is divided into a plurality of lighted regions 121B, so that the density of lighted organic light-emitting structures 11 in one frame of picture is 1/400. Thus, it may be known that, 20*20=400 frames of pictures need to be scanned to light all the organic light-emitting structures 11 in the display panel. FIG. 35A only shows a part of the organic light-emitting structures 11 lighted simultaneously and the coordinates thereof and unlighted organic light-emitting structures 121B at the four vertexes of one lighted region 121B and the coordinates thereof.

Figure 35B:
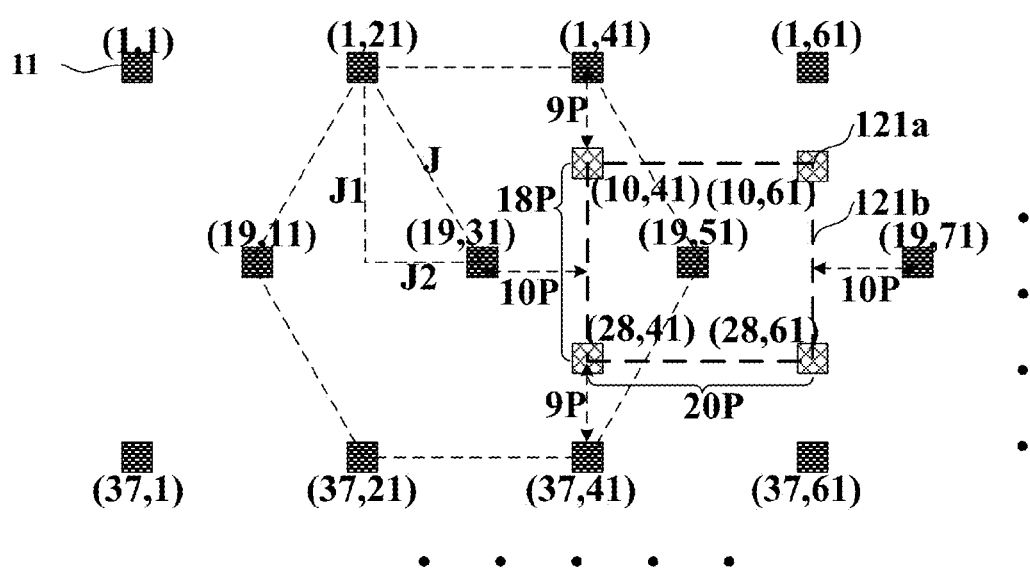
FIG. 35B is a schematic diagram showing a hexagonal array scanning mode of a display panel according to an embodiment of the disclosure.

For the hexagonal array scanning mode shown in FIG. 35B, the coordinates of a lighted organic light-emitting structure 11 are set as (row, column), and the coordinates of the first organic light-emitting structure 11 at the top left corner are (1,1). In the hexagonal array, the distance J between any adjacent two lighted organic light-emitting structures 11 can reach 20 organic light-emitting structures 11 (20P), and the distance J1 from an edge organic light-emitting structure 11 located at a different row from the center organic light-emitting structure 11 to the row including the center organic light-emitting structure 11 should reach $10P\sqrt{3} \approx 18P$, and the distance J2 from an edge organic light-emitting structure 11 located at a different row from the center organic light-emitting structure 11 to the column including the center organic light-emitting structure 11 should reach 10P. Thus, it may be known that, the coordinates of the lighted organic light-emitting structures 11 in the first row are successively (1,1), (1,21), (1,41), ..., the coordinates of the lighted organic light-emitting structures 11 in the second row are successively (19,11), (19,31), (19,51), ..., and the coordinates of the lighted organic light-emitting structures 11 in the third row are successively (37,1), (37,21), (37,41), ..., and the like, which will be the coordinates of all the organic light-emitting structures 11 lighted simultaneously in one frame. Apparently, when an organic light-emitting structure 11 is lighted, in the case that adjacent lighted organic light-emitting structures 11 in each row are still spaced by 20P, the row space between different rows of lighted organic light-emitting structures 11 is reduced from 20P to 18P. Then, the distance between an edge organic light-emitting structure 11 located at a different row from the center organic light-emitting structure 11 and the center organic light-emitting structure 11 is $\sqrt{(10P)^2 + (18P)^2} \approx 20.59P > 20P$, which can meet the requirement of avoiding crosstalk.

The organic light-emitting layer consisted of the organic light-emitting structure 11 of the display panel will be divided horizontally and vertically by taking each lighted organic light-emitting structures 11 as the center point, and the organic light-emitting layer is divided into a plurality of lighted regions 121B that are totally the same, the size of each of the lighted regions 121B is totally consistent with others, and each of the lighted regions 121B includes one lighted organic light-emitting structure 11 and a plurality of unlighted organic light-emitting structures 121A surrounding the lighted organic light-emitting structure 11. It needs to be noted that, for a lighted organic light-emitting structure 11 located at the edge of the organic light-emitting layer, the corresponding region thereof in the organic light-emitting layer is only a part of its lighted region.

For example, for a lighted organic light-emitting structure 11 (19,51), the lighted region 121B corresponding thereto is surrounded by four unlighted organic light-emitting structures 121A, the coordinates of which are (10,41), (10,61), (28,41) and (28,61), respectively. Apparently, the size of the lighted region 121B in the row direction is 20P, and the size thereof in the column direction is 18P, that is, the number of organic light-emitting structures forming the lighted region 121B is 20*18=360. Only one lighted organic light-emitting structure (19,51) is present in the lighted region 121B, that is, there is one lighted organic light-emitting structure 11 for every 360 organic light-emitting structures 11. Therefore, the density of lighted organic light-emitting structures in the lighted region 121B is 1/360. The organic light-emitting layer is divided into a plurality of lighted regions 121B, so that the density of lighted organic light-emitting structures 11 in one frame of picture is 1/360. Thereby, it may be known that, 20*18=360 frames of pictures need to be scanned to light all the organic light-emitting structures 11 in the display panel. FIG. 35B only shows a part of the organic light-emitting structures 11 lighted simultaneously and the coordinates thereof and unlighted organic light-emitting structures 121B at the four vertexes of one lighted region 121B and the coordinates thereof.

Apparently, the hexagonal array scanning mode shown in FIG. 35B outperforms the square array scanning mode shown in FIG. 35A.

Figure 36:
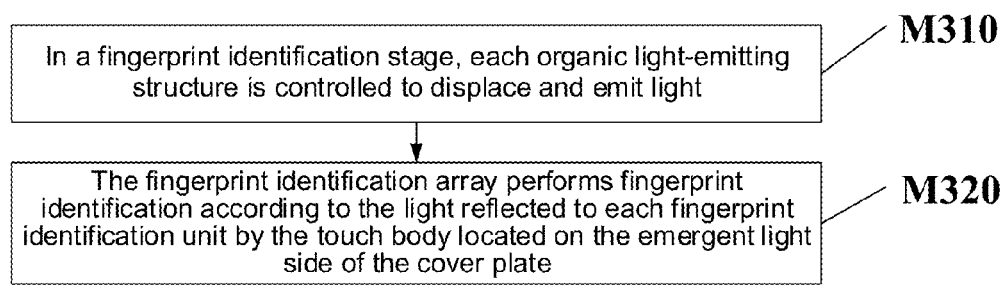
FIG. 36 is a flow chart of a fingerprint identification method for a display panel according to an embodiment of the disclosure.

An embodiment of the disclosure further provides a fingerprint identification method for a display panel. As shown in the above FIG. 27A-FIG. 27D and FIG. 29-FIG. 34C, the display panel includes an array substrate 10, an organic light-emitting structure 11 located on one side of the array substrate 10 that faces a cover plate 14, a fingerprint identification module 2 and cover plate 14. The first surface of the cover plate 14 of the organic light-emitting structure 11 that is facing away from the array substrate 10 is the emergent light side of the display panel. As shown in FIG. 36, the fingerprint identification method according to this embodiment includes:

Step M310: In a fingerprint identification stage, each organic light-emitting structure is controlled to displace and emit light according to the first luminous dot matrix, wherein the distance between any adjacent two organic light-emitting structures in the first luminous dot matrix is larger than or equal to the minimum crosstalk-free distance, which is the maximum radius of the cover region formed on the fingerprint identification array by reflecting the light emitted from any organic light-emitting structure by the emergent light side of the cover plate.

Step M320: The fingerprint identification array performs fingerprint identification according to the light reflected to each fingerprint identification unit by the touch body on the emergent light side of the cover plate. In this embodiment, the touch body may be a finger of a user.

The display panel according to this embodiment employs a picture scanning mode for the fingerprint identification method, and each organic light-emitting structure in a picture displaces and emits light according to the first luminous dot matrix. On the basis that the distance between any adjacent two organic light-emitting structures in the first luminous dot matrix is larger than or equal to the minimum crosstalk-free distance, the fingerprint reflection light formed by reflecting the light emitted from any organic light-emitting structure in the first luminous dot matrix by the fingerprint of the user finger will not irradiate on the fingerprint identification units corresponding to other organic light-emitting structures in the dot matrix, so that the fingerprint identification unit corresponding to each organic light-emitting structure in the first luminous dot matrix can only receive the fingerprint reflection light formed by the emergent light of the organic light-emitting structure corresponding thereto, that is, the fingerprint identification unit will not be affected by the crosstalk signals from other organic light-emitting structures. Based on this, the inductive signal generated by the fingerprint identification unit accurately reflects the reflection of the emergent light of the corresponding organic light-emitting structure on the fingerprint of the user finger. Therefore, in the display panel according to this embodiment, the precision of fingerprint identification can be improved.

Figure 37:
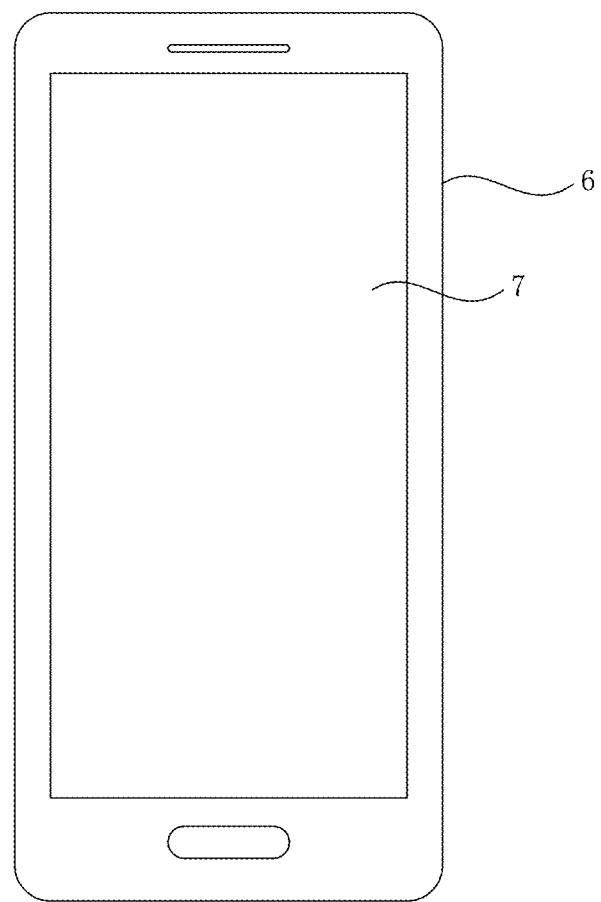
FIG. 37 is a structural representation of a display device according to an embodiment of the disclosure.

One embodiment of the disclosure further provides a display device. FIG. 37 is a structural representation of a display device according to an embodiment of the disclosure. As shown in FIG. 37, the display device 6 includes a display panel 7 according to the above embodiments, and hence the display device 6 according to the embodiment of the disclosure also has the beneficial effects described in the above embodiments, which will not be described again here. It needs to be noted that, the display panel may be a mobile phone as shown in FIG. 37, and it may also be a computer, a TV set and an intelligent wearable device, etc., which is not defined in the embodiments of the disclosure.

It should be noted that the embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. A display panel, comprising:
a display module, a fingerprint identification module and an angle defining film; wherein
the display module comprises an array substrate and a plurality of organic light-emitting structures on the array substrate;
the fingerprint identification module is located in a display region on one side of the array substrate that is facing away from the organic light-emitting structure, and comprises a first substrate and at least one fingerprint identification unit on the first substrate, which is configured to perform fingerprint identification according to light reflected to the fingerprint identification unit via a touch body;
the angle defining film is located between the display module and the fingerprint identification module, wherein
among lights reflected to the fingerprint identification unit via a touch body, a transmissivity of the light by the angle defining film is $A_1$ when the incident angle of said light with respect to the angle defining film is smaller than a transmission angle of the angle defining film,
among lights reflected to the fingerprint identification units via a touch body, a transmissivity of the light by the angle defining film is $A_2$ when the incident angle of said light with respect to the angle defining film is larger than the transmission angle of the angle defining film, wherein $A_1 > A_2 > 0$;
a transmissivity of the light by the angle defining film is A when the incident angle of said light is vertical with respect to the angle defining film; and
the transmission angle of the angle defining film refers to the incident angle of the light with respect to the angle defining film which has a transmissivity of kA, wherein $0 < k < 1$.

2. The display panel as claimed in claim 1, wherein, $k=0.1$.

3. The display panel as claimed in claim 1, wherein, $A_1 > 1.5 A_2$.

4. The display panel as claimed in claim 1, wherein the organic light-emitting structure provides a light source for the fingerprint identification module, and the fingerprint identification unit is configured to perform fingerprint identification according to the light reflected to the fingerprint identification unit via the touch body, which is initially emitted from the organic light-emitting structure.

5. The display panel as claimed in claim 4, wherein the display panel comprises an emergent light side and a non-emergent light side; the emergent light side is one side of the organic light-emitting structure that is facing away from the array substrate, and the non-emergent light side is one side of the array substrate that is facing away from the organic light-emitting structure; and the brightness ratio of the emergent light side to the non-emergent light side in the display panel is larger than 10:1.

6. The display panel as claimed in claim 1, wherein the fingerprint identification module further comprises a fingerprint identification light source, the fingerprint identification light source is located on one side of the first substrate that is facing away from the fingerprint identification unit; and
the fingerprint identification unit is configured to perform fingerprint identification according to the light reflected to the fingerprint identification unit via the touch body, which is initially emitted from the fingerprint identification light source.

7. The display panel as claimed in claim 1, wherein the angle defining film comprises a plurality of light transmitting regions and partially light transmitting regions that are parallel with a plane of the first substrate and arranged alternately along the same direction, the partially light transmitting region is provided with a light-absorbing material, and a light transmissivity of the light transmitting region is larger than a light transmissivity of the partially light transmitting region.

8. The display panel as claimed in claim 7, wherein the transmission angle of the angle defining film meets a formula below:

$$\theta = \arctan\frac{t}{h}$$

wherein, θ is a transmission angle of the angle defining film, t is a width of the light transmitting region along an arrangement direction of the light transmitting region, and h is a thickness of the angle defining film.

9. The display panel as claimed in claim 8, wherein, a diffusion distance of the angle defining film meets a formula below:

$$\Delta X = \frac{t \cdot (H+h)}{h}$$

wherein, ΔX is the diffusion distance of the angle defining film, H is a thickness of the display module; the diffusion distance of the angle defining film refers to a distance between reflection points of actual detection light and interfering detection light on the touch body which both correspond to the same fingerprint identification unit;
the reflected light of which an incident angle with respect to the fingerprint identification unit is minimum is referred as the actual detection light, and the reflected light of which an incident angle with respect to the fingerprint identification unit is larger than the incident angle of the actual detection light with respect to the fingerprint identification unit is referred as the interfering detection light.

10. The display panel as claimed in claim 1, wherein the angle defining film comprises a porous structure, a sidewall of the porous structure is configured to absorb a part of the lights irradiated on the sidewall.

11. The display panel as claimed in claim 10, wherein the transmission angle of the angle defining film meets a formula below:

$$\theta = \arctan\frac{d}{h}$$

wherein, θ is the transmission angle of the angle defining film, d is a diameter of the porous structure, and h is a thickness of the angle defining film.

12. The display panel as claimed in claim 11, wherein, a diffusion distance of the angle defining film meets a formula below:

$$\Delta X = \frac{d \cdot (H+h)}{h}$$

wherein, ΔX is the diffusion distance of the angle defining film, H is a thickness of the display module; the diffusion distance of the angle defining film refers to a distance between reflection points of actual detection light and interfering detection light on the touch body which both correspond to the same fingerprint identification unit;
the reflected light of which an incident angle with respect to the fingerprint identification unit is minimum is referred as the actual detection light, and the reflected light of which an incident angle with respect to the fingerprint identification unit is larger than the incident angle of the actual detection light with respect to the fingerprint identification unit is referred as the interfering detection light.

13. The display panel as claimed in claim 1, wherein the angle defining film comprises a plurality of optical fiber structures arranged along the same direction, the optical fiber structure comprises an inner core and a shell, a light-absorbing material is provided between every adjacent two optical fiber structures, and a light transmissivity of the inner core is larger than a light transmissivity of the light-absorbing material.

14. The display panel as claimed in claim 13, wherein a refractive index of the inner core is different from that of the shell, and the transmission angle of the angle defining film meets a formula below:

$$n \cdot \sin\theta = \sqrt{n_{core}^2 - n_{clad}^2}$$

wherein, θ is the transmission angle of the angle defining film, n is a refractive index of a film contacting the angle defining film in the display module, $n_{core}$ is a refractive index of the inner core of the optical fiber structure, and $n_{clad}$ is a refractive index of the shell of the optical fiber structure.

15. The display panel as claimed in claim 14, wherein a diffusion distance of the angle defining film meets a formula below:

$$\Delta X = H \cdot \tan\theta$$

wherein, ΔX is the diffusion distance of the angle defining film, H is a thickness of the display module, and the diffusion distance of the angle defining film refers to a distance between reflection points of actual detection light and interfering detection light on the touch body which both correspond to the same fingerprint identification unit;
the reflected light of which an incident angle with respect to the fingerprint identification unit is minimum is referred as the actual detection light, and the reflected light of which an incident angle with respect to the fingerprint identification unit is larger than the incident angle of the actual detection light with respect to the fingerprint identification unit is referred as the interfering detection light.

16. The display panel as claimed in claim 1, wherein the angle defining film comprises a plurality of columnar structures arranged along the same direction, the columnar structure comprises an inner core and a shell, a refractive index of the inner core is the same as that of the shell, a material of the shell comprises a light-absorbing material, and a light transmissivity of the inner core is larger than a light transmissivity of the light-absorbing material.

17. The display panel as claimed in claim 16, wherein, the transmission angle of the angle defining film meets a formula below:

$$\theta = \arctan\frac{D}{h}$$

wherein, θ is the transmission angle of the angle defining film, D is a diameter of the inner core, and h is a thickness of the angle defining film.

18. The display panel as claimed in claim 17, wherein a diffusion distance of the angle defining film meets a formula below:

$$\Delta X = \frac{D \cdot (H+h)}{h}$$

wherein, ΔX is the diffusion distance of the angle defining film, H is a thickness of the display module, and the diffusion distance of the angle defining film refers to a distance between reflection points of actual detection light and interfering detection light on the touch body which both correspond to the same fingerprint identification unit;

the reflected light of which an incident angle with respect to the fingerprint identification unit is minimum is referred as the actual detection light, and the reflected light of which an incident angle with respect to the fingerprint identification unit is larger than the incident angle of the actual detection light with respect to the fingerprint identification unit is referred as the interfering detection light.

19. The display panel as claimed in claim 1, wherein the first substrate comprises a glass substrate or a flexible substrate.

20. A display device, comprising a display panel which comprises:
- a display module, a fingerprint identification module and an angle defining film; wherein
- the display module comprises an array substrate and a plurality of organic light-emitting structures on the array substrate;
- the fingerprint identification module is located in a display region on one side of the array substrate that is facing away from the organic light-emitting structure, and comprises a first substrate and at least one fingerprint identification unit on the first substrate, which is configured to perform fingerprint identification according to light reflected to the fingerprint identification unit via a touch body;
- the angle defining film is located between the display module and the fingerprint identification module, wherein
- among lights reflected to the fingerprint identification unit via a touch body, a transmissivity of the light by the angle defining film is $A_1$ when the incident angle of said light with respect to the angle defining film is smaller than a transmission angle of the angle defining film,
- among lights reflected to the fingerprint identification units via a touch body, a transmissivity of the light by the angle defining film is $A_2$ when the incident angle of said light with respect to the angle defining film is larger than the transmission angle of the angle defining film, wherein $A_1 > A_2 > 0$;
- a transmissivity of the light by the angle defining film is A when the incident angle of said light is vertical with respect to the angle defining film; and
- the transmission angle of the angle defining film refers to the incident angle of the light with respect to the angle defining film which has a transmissivity of kA, wherein $0 < k < 1$.

* * * * *